(12) United States Patent  
Hussell et al.

(10) Patent No.: US 8,729,589 B2  
(45) Date of Patent: May 20, 2014

(54) HIGH VOLTAGE ARRAY LIGHT EMITTING DIODE (LED) DEVICES AND FIXTURES

(71) Applicant: CREE, Inc., Durham, NC (US)

(72) Inventors: Christopher P. Hussell, Cary, NC (US); Jesse C. Reiherzer, Wake Forest, NC (US); Jeffrey C. Britt, Cary, NC (US); Praneet Athalye, Morrisville, NC (US); Peter S. Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/671,089

(22) Filed: Nov. 7, 2012

(65) Prior Publication Data

US 2013/0077299 A1 Mar. 28, 2013

Related U.S. Application Data

(63) Continuation-in-part of application No. 13/028,972, filed on Feb. 16, 2011, now Pat. No. 8,564,000, and a continuation-in-part of application No. 13/104,558, filed on May 10, 2011, and a continuation-in-part of application No. 13/152,772, filed on Jun. 3, 2011, and a continuation-in-part of application No. 13/152,640, filed on Jun. 3, 2011, and a continuation-in-part of application No. 13/282,172, filed on Oct. 26, 2011, and a continuation-in-part of application No. 29/404,913, filed on Oct. 26, 2011.

(60) Provisional application No. 61/556,640, filed on Nov. 7, 2011.

(51) Int. Cl.  
*H01L 21/00* (2006.01)

(52) U.S. Cl.  
USPC .............. 257/98; 257/89; 257/99; 257/433; 257/E21.592

(58) Field of Classification Search  
USPC .............. 257/12–13, 81, 84, 88, 98–100, 257/347–344, 431–433  
See application file for complete search history.

(56) References Cited

U.S. PATENT DOCUMENTS 4,855,194 A 8/1989 Wright  
4,946,547 A 8/1990 Palmour (Continued)

FOREIGN PATENT DOCUMENTS

CN ZL 2011-30139847.5 8/2012  
CN ZL 2011-30166527.9 8/2012

(Continued)

OTHER PUBLICATIONS

Bridgelux Product Data Sheet—1 page.

(Continued)

*Primary Examiner* — Dung A. Le  
(74) *Attorney, Agent, or Firm* — Jenkins, Wilson, Taylor & Hunt, P.A.

(57) ABSTRACT

High voltage array light emitting devices, fixtures and methods are disclosed. In one embodiment a light emitting device can include a submount, a light emission area disposed over the submount and a retention material adapted to be dispensed about the light emission area. The light emitting device can be operable at high voltages which are greater than approximately 40 volts (V). In one aspect, the retention material can be least partially disposed within the light emission area such that the retention material physically separates a first section of the light emission area from a second section of the light emission area.

24 Claims, 26 Drawing Sheets

(56) References Cited

U.S. PATENT DOCUMENTS

| | | | |
|---|---|---|---|
| 5,200,022 A | 4/1993 | Kong | |
| RE34,861 E | 2/1995 | Davis et al. | |
| 6,548,832 B1 | 4/2003 | Sakamoto et al. | |
| 7,055,987 B2 | 6/2006 | Staufert | |
| D541,761 S | 5/2007 | Saito et al. | |
| 7,224,000 B2 | 5/2007 | Aanegola et al. | |
| D570,797 S | 6/2008 | Song | |
| D573,553 S | 7/2008 | Uemoto et al. | |
| D576,576 S | 9/2008 | Shida et al. | |
| 7,482,636 B2 | 1/2009 | Murayama et al. | |
| D586,303 S | 2/2009 | Fuwa et al. | |
| D589,470 S | 3/2009 | Chen | |
| D591,248 S | 4/2009 | Imai et al. | |
| D592,615 S | 5/2009 | Imai et al. | |
| D593,043 S | 5/2009 | Song | |
| 7,569,987 B2 * | 8/2009 | Naitou | 313/503 |
| D602,451 S | 10/2009 | Gielen | |
| D603,813 S | 11/2009 | Nishimura et al. | |
| D607,420 S | 1/2010 | Imai et al. | |
| D615,051 S | 5/2010 | Chen et al. | |
| D615,052 S | 5/2010 | Imai et al. | |
| D618,635 S | 6/2010 | Imai et al. | |
| 7,780,313 B2 | 8/2010 | Lam et al. | |
| 7,825,578 B2 | 11/2010 | Takashima et al. | |
| D630,171 S | 1/2011 | Hsieh | |
| 7,872,418 B2 | 1/2011 | Hata et al. | |
| D637,564 S | 5/2011 | Tseng et al. | |
| D640,997 S | 7/2011 | Imai et al. | |
| 7,994,518 B2 | 8/2011 | Wang et al. | |
| D645,417 S | 9/2011 | Imai et al. | |
| 8,044,418 B2 | 10/2011 | Loh et al. | |
| 8,058,088 B2 | 11/2011 | Cannon | |
| D650,760 S | 12/2011 | Hussell et al. | |
| D658,602 S | 5/2012 | Egawa et al. | |
| D658,603 S | 5/2012 | Egawa et al. | |
| D667,803 S | 9/2012 | Hussell et al. | |
| D669,041 S | 10/2012 | Imai et al. | |
| D676,000 S | 2/2013 | Hussell et al. | |
| D676,395 S | 2/2013 | Hussell et al. | |
| 8,455,908 B2 | 6/2013 | Welch et al. | |
| 2003/0038295 A1 * | 2/2003 | Koda | 257/98 |
| 2005/0264172 A1 | 12/2005 | Wojnarowski et al. | |
| 2006/0147746 A1 | 7/2006 | Wakako et al. | |
| 2006/0186418 A1 | 8/2006 | Edmond | |
| 2007/0018295 A1 | 1/2007 | Kim et al. | |
| 2007/0029569 A1 | 2/2007 | Andrews | |
| 2007/0158668 A1 | 7/2007 | Tarsa | |
| 2007/0194336 A1 | 8/2007 | Shin et al. | |
| 2008/0054279 A1 | 3/2008 | Hussell et al. | |
| 2008/0054284 A1 | 3/2008 | Hussell et al. | |
| 2008/0054286 A1 | 3/2008 | Loh et al. | |
| 2008/0089072 A1 | 4/2008 | Kim et al. | |
| 2008/0164484 A1 * | 7/2008 | Lee | 257/89 |
| 2008/0173884 A1 | 7/2008 | Chitnis | |
| 2008/0179611 A1 | 7/2008 | Chitnis | |
| 2008/0224166 A1 | 9/2008 | Glovatsky et al. | |
| 2008/0258130 A1 | 10/2008 | Bergmann | |
| 2009/0207111 A1 * | 8/2009 | Wang et al. | 345/83 |
| 2009/0261374 A1 | 10/2009 | Hayashi | |
| 2009/0289169 A1 | 11/2009 | Yang et al. | |
| 2009/0315061 A1 | 12/2009 | Andrews | |
| 2010/0078664 A1 | 4/2010 | Helbing | |
| 2010/0141182 A1 | 6/2010 | Shi | |
| 2010/0155763 A1 | 6/2010 | Donofrio | |
| 2010/0193822 A1 | 8/2010 | Inobe et al. | |
| 2010/0253248 A1 | 10/2010 | Shi | |
| 2010/0270567 A1 | 10/2010 | Emerson et al. | |
| 2010/0320483 A1 | 12/2010 | Kadotani et al. | |
| 2011/0068674 A1 | 3/2011 | Takenaka et al. | |
| 2011/0128730 A1 | 6/2011 | Chiu | |
| 2011/0291114 A1 * | 12/2011 | Cheng | 257/88 |
| 2011/0291151 A1 | 12/2011 | Matsuda et al. | |
| 2012/0126255 A1 | 5/2012 | Hussell et al. | |
| 2012/0126257 A1 | 5/2012 | Reiherzer et al. | |
| 2012/0193651 A1 | 8/2012 | Edmond | |
| 2012/0205689 A1 | 8/2012 | Welch | |
| 2012/0299022 A1 | 11/2012 | Hussell | |

FOREIGN PATENT DOCUMENTS

| | | |
|---|---|---|
| CN | ZL201230099913.5 | 11/2012 |
| CN | ZL201230099954.4 | 12/2012 |
| CN | ZL201230099981.1 | 12/2012 |
| CN | ZL 201230472866.4 | 5/2013 |
| EP | 2327930 | 6/2011 |
| JP | 07-038940 | 9/1995 |
| JP | 10-311937 | 11/1998 |
| JP | 2001-294083 | 10/2001 |
| JP | 2005-266117 | 9/2005 |
| JP | 2006-294898 | 10/2006 |
| JP | 2007-227680 | 9/2007 |
| JP | 2007-266357 | 10/2007 |
| JP | 2007-323857 | 12/2007 |
| JP | 2007-335371 | 12/2007 |
| JP | 2009-044055 | 2/2009 |
| JP | 2009-289918 | 12/2009 |
| JP | 2010-009972 | 1/2010 |
| JP | 1476166 | 7/2013 |
| JP | 1476175 | 7/2013 |
| KR | 3004423910000 | 3/2007 |
| KR | 10-0793338 | 1/2008 |
| KR | 10-2008-0092239 | 10/2008 |
| KR | 10-2009-0011121 | 3/2009 |
| KR | 10-2011-0004632 | 1/2011 |
| TW | 113260 | 10/2006 |
| TW | 124444 | 8/2008 |
| TW | D125589 | 10/2008 |
| TW | 128526 | 5/2009 |
| TW | D141645 | 7/2011 |
| TW | D144159 | 12/2011 |
| TW | D145644 | 3/2012 |
| WO | WO 2012/071136 | 5/2012 |
| WO | WO 2012/071138 | 5/2012 |
| WO | WO 2012/071139 | 5/2012 |
| WO | WO 2013/032737 | 3/2013 |
| WO | WO 2013/070696 | 5/2013 |
| WO | WO 2013/096431 | 6/2013 |
| WO | WO 2013/122831 | 8/2013 |

OTHER PUBLICATIONS

Citizen Co. Product Data Sheet—4 pages http://ce.citizen.co.jp/lighting_led/en/products/index.html.

U.S. Appl. No. 29/379,636 for "Light Emitting Device Package" filed Nov. 22, 2010.

Design U.S. Appl. No. 29/380,387 for "Light Emitting Device Package" filed Dec. 3, 2010.

U.S. Appl. No. 13/028,972 for "Light Emitting Devices and Methods" filed Feb. 16, 2011.

U.S. Appl. No. 13/104,558 for "Light Emitting Devices and Methods" filed May 10, 2011.

Notice of Allowance for U.S. Appl. No. 29/379,636 dated Aug. 4, 2011.

Design U.S. Appl. No. 29/404,913 for "Light Emitting Device Component" filed Oct. 26, 2011.

U.S. Appl. No. 13/224,850 for "Light Emitting Device Component" filed Sep. 2, 2011.

Design U.S. Appl. No. 29/379,636 for "Light Emitting Device Package" filed Nov. 22, 2011.

Design U.S. Appl. No. 29/408,955 for "Light Emitting Device Package" filed Dec. 19, 2011.

Patent Application for U.S. Appl. No. 13/336,540 dated Dec. 23, 2011.

Notification of Granting Patent Right for Design for Application Serial No. CN 2011/30166527.9 dated Apr. 6, 2012.

Non-Final Office Action for U.S. Appl. No. 29/380,387 dated Apr. 25, 2012.

Notification of Granting Patent Right for Design for Application Serial No. CN 2011/30139847.5 dated Apr. 26, 2012.

(56) References Cited

OTHER PUBLICATIONS

Notice of Allowance for U.S. Appl. No. 29/408,955 dated May 7, 2012.
Notice of Allowance for U.S. Appl. No. 29/407,084 dated May 18, 2012.
International Search Report and Written Opinion for Application Serial No. PCT/US2011/058603 dated May 23, 2012.
International Search Report and Written Opinion for Application Serial No. PCT/US2011/058601 dated May 24, 2012.
International Search Report and Written Opinion for Application Serial No. PCT/US2011/058596 dated Jun. 18, 2012.
Chinese Office Action for Application Serial No. CN 2012/30130915.6 dated Jul. 12, 2012.
Office Action/Restriction Requirement for U.S. Appl. No. 13/028,972 dated Jul. 25, 2012.
Notification of Grant for Chinese Patent Application No. 2012/30099913.5 dated Aug. 7, 2012.
Notification of Grant for Chinese Patent Application No. 2012/30099981.1 dated Aug. 17, 2012.
Notification of Grant for Chinese Patent Application No. 2012/30099954.4 dated Aug. 17, 2012.
Notice of Allowance for U.S. Appl. No. 29/407,084 dated Aug. 21, 2012.
Notice of Allowance for U.S. Appl. No. 29/380,387 dated Sep. 18, 2012.
Notice of Allowance for U.S. Appl. No. 29/408,955 dated Oct. 4, 2012.
Non-Final Office Action for U.S. Appl. No. 13/028,972 dated Oct. 10, 2012.
Chinese Office Action for Application No. CN 2012/30130915.6 dated Oct. 24, 2012.
Chinese Office Action for Application No. 201230472866.4 dated Nov. 14, 2012.
Non-Final Office Action for U.S. Appl. No. 13/104,558 dated Jan. 3, 2013.
Taiwanese Search Report for Application No. 101302309 dated Jan. 14, 2013.
Taiwanese Office Action for Application No. 101302309 dated Jan. 23, 2013.
Chinese Decision to Grant for Application No. 201230472866.4 dated Jan. 24, 2013.
Japanese Office Action for Application No. 2012-023963 dated Feb. 26, 2013.
Japanese Office Action for Application No. 2012-026117 dated Feb. 26, 2013.
Chinese Office Action for Application No. CN 2012/30130915.6 dated Feb. 27, 2013.
Notice of Allowance for U.S. Appl. No. 13/028,972 dated Feb. 28, 2013.
International Search Report and Written Opinion for Application No. PCT/US2012/051344 dated Feb. 28, 2013.
International Search Report and Written Opinion for Application No. PCT/US2012/063861 dated Mar. 18, 2013.
Notice of Allowance for U.S. Appl. No. 13/336,540 dated Jan. 31, 2013.
Restriction Requirement for U.S. Appl. No. 29/404,913 dated Feb. 15, 2013.
International Search Report and Written Opinion for Application No. PCT/US2012/070589 dated Apr. 22, 2013.
International Search Report and Written Opinion for Application No. PCT/US2013/025307 dated May 15, 2013.
Notice of Allowance for U.S. Appl. No. 13/028,972 dated May 23, 2013.
Japanese Office Action for Application No. 2012-031549 dated Jun. 4, 2013.
Japanese Decision of Registration for Application No. 2012-023963 dated Jun. 4, 2013.
Japanese Decision of Registration for Application No. 2012-026117 dated Jun. 4, 2013.
Taiwanese Notice of Allowance for Application No. 101302309 dated Jun. 5, 2013.
Notice of Allowance for U.S. Appl. No. 13/435,912 dated Jun. 19, 2013.
Notice of Allowance for U.S. Appl. No. 29/404,913 dated Jun. 25, 2013.
Chinese Notice of Grant for Application No. 201230652790.3 dated Jun. 26, 2013.
Notice of Allowance for U.S. Appl. No. 13/104,558 dated Jul. 1, 2013.
Chinese Notice of Grant for Application No. 201230130915.6 dated Jul. 3, 2013.
Chinese Decision to Grant for Application No. 201230652789 dated Jul. 17, 2013.
Taiwanese Search Report for Application No. 102301394 dated Jul. 9, 2013.
Taiwanese Search Report for Application No. 102301395 dated Jul. 9, 2013.
Taiwanese Office Action for Application No. 102301394 dated Jul. 15, 2013.
Taiwanese Office Action for Application No. 102301395 dated Jul. 15, 2013.
Chinese Notice of Grant for Application No. 201230652840.3 dated Jul. 26, 2013.
Korean Office Action for Application No. 30-2012-0020196 dated Aug. 13, 2013.
Korean Office Action for Application No. 30-2012-0020197 dated Aug. 13, 2013.
Korean Office Action for Application No. 30-2012-0020198 dated Aug. 13, 2013.
Taiwanese Search Report for Application No. 102300059 dated Apr. 17, 2013.
Taiwanese Search Report for Application No. 102300058 dated Apr. 29, 2013.
Taiwanese Office Action for Application No. 102300058 dated Aug. 27, 2013.
Taiwanese Office Action for Application No. 102300059 dated Oct. 1, 2013.
Taiwanese Office Action for Application No. 102301581 dated Sep. 6, 2013.
Taiwanese Office Action for Application No. 102301582 dated. Sep. 6, 2013.
Taiwanese Office Action for Application No. 102301583 dated Sep. 6, 2013.
Taiwanese Office Action for Application No. 102301584 dated Sep. 6, 2013.
Taiwanese Office Action for Application No. 102301585 Sep. 6, 2013.
Chinese Notice to Grant for Application No. 201330361367.5 dated Oct. 8, 2013.

* cited by examiner

SINGLE STRING

MULTIPLE STRINGS IN PARALLEL

SERIES AND PARALLEL ARRAY

US 8,729,589 B2

HIGH VOLTAGE ARRAY LIGHT EMITTING DIODE (LED) DEVICES AND FIXTURES

CROSS REFERENCE TO RELATED APPLICATIONS

This application relates and claims priority to U.S. Provisional Patent Application Ser. No. 61/556,640, filed Nov. 7, 2011 and is a continuation-in-part of and claims priority to each of: U.S. patent application Ser. No. 13/028,972, filed Feb. 16, 2011; U.S. patent application Ser. No. 13/104,558 filed May 10, 2011; U.S. patent application Ser. No. 13/152,772 filed Jun. 3, 2011; U.S. patent application Ser. No. 13/152,640 filed Jun. 3, 2011; U.S. patent application Ser. No. 13/282,172 filed Oct. 26, 2011; and U.S. patent application Ser. No. 29/404,913 filed Oct. 26, 2011. The disclosures of each of these prior applications are hereby incorporated by reference in their entireties.

TECHNICAL FIELD

The subject matter disclosed herein relates generally to light emitting diode (LED) devices and methods. More particularly, the subject matter disclosed herein relates to high voltage LED devices, fixtures and methods of providing the same.

BACKGROUND

Light emitting devices, such as light emitting diodes (LEDs), may be utilized in packages for providing white light (e.g., perceived as being white or near-white), and are developing as replacements for incandescent, fluorescent, and metal halide high-intensity discharge (HID) light products. A representative example of an LED device comprises a device having at least one LED chip, a portion of which can be coated with a phosphor such as, for example, yttrium aluminum garnet (YAG). The phosphor coating can convert light emitted from one or more LED chips into white light. For example, LED chips can emit light having desired wavelengths, and phosphor can in turn emit yellow fluorescence with a peak wavelength of about 550 nm. A viewer perceives the mixture of light emissions as white light. As an alternative to 1 phosphor converted white light, light emitting devices of red, green, and blue (RGB) wavelengths can be combined in one device or package to produce light that is perceived as white.

Despite availability of various LED devices and methods in the marketplace, a need remains for high voltage devices and fixtures that can be used in a variety of general lighting applications. High voltage devices can turn-on at voltages of greater than approximately 40 volts (V). Advantages associated with high voltage devices include more efficient devices, less costly devices, increased operability for a greater number of general lighting applications, as well as operability at lower forward currents which can contribute to improvements in current spreading. High voltage devices can reduce the cost of LED lighting fixtures by simplifying (e.g., reducing) driver components, increasing LED efficiency, and increasing uniformity within the device. A need also remains for high voltage devices in which the electrical current to one or more LEDs can advantageously be controlled for maintaining aggregate output emissions of multiple, differently colored LEDs at a substantially constant color point or color temperature within the LED device. This can be achieved in part by the addition of a control circuit preferably arranged within and/or external the device.

SUMMARY

In accordance with this disclosure, novel light emitting devices, fixtures and methods are provided that are well suited for a variety of applications, including industrial and commercial lighting products. It is, therefore, an object of the present disclosure herein to provide light emitting devices that are operable at a variety of high voltage applications. Another object of the present disclosure is to provide devices having improved color point control by implementing a control circuit configured to adjust electrical current supplied to LEDs within the device (e.g., via bypassing and/or shunting current), thereby maintaining an aggregate output emission from multiple, differently colored LEDs.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
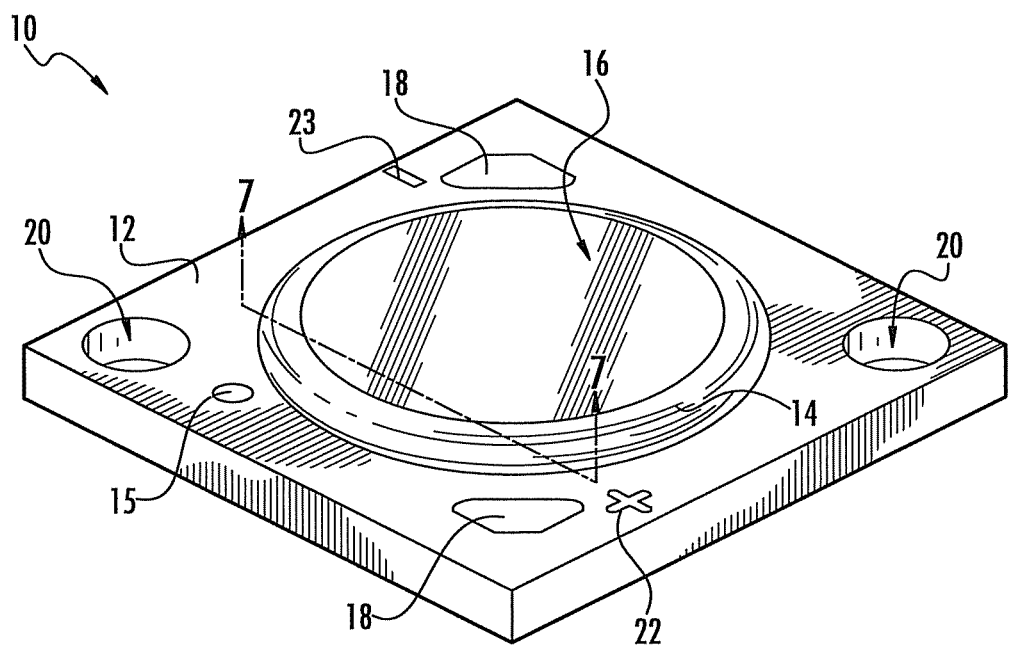
FIG. 1 is a top perspective view of an embodiment of a light emitting device according to the disclosure herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Unless the absence of one or more elements is specifically recited, the terms "comprising," including," and "having" as used herein should be interpreted as open-ended terms that do not preclude the presence of one or more elements.

Light emitting devices according to embodiments described herein may comprise group III-V nitride (e.g., gallium nitride) based light emitting diodes (LEDs) or lasers fabricated on a growth substrate, for example, a silicon carbide substrate, such as those devices manufactured and sold by Cree, Inc. of Durham, N.C. Devices may also comprise group III phosphide (e.g., (Al, In, Ga) P) based LEDs or lasers. Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. Nos. 4,946,547; and 5,200,022, the disclosures of which are incorporated by reference herein in their entireties. Any other suitable growth substrates are contemplated herein. For example, sapphire and gallium arsenide can be utilized as growth substrates for fabricating LEDs or lasers as described herein.

LEDs according to some embodiments of the present subject matter, for example, may be fabricated on growth substrates (such as a silicon carbide or sapphire substrates) to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board (PCB), or wire bonded. A vertical device (with or without the growth substrate) may have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

Various devices as described herein may embody emitters and/or lumiphors of various colors or wavelength ranges, such as the following: (1) blue (preferably approximately 430 nm to 480 nm; optionally 430-475 nm, 440-475 nm, 450-475 nm, or any suitable sub-range of 430-480 nm); (2) cyan (preferably approximately 481 nm to 499 nm); (3) green (preferably approximately 500 nm to 570 nm, optionally 505-515 nm, 515-527 nm, or 527-535 nm, or 535-570 nm, or any suitable sub-range of 500-570 nm and any suitable sub-range as articulated herein); (4) yellow (preferably approximately 571 to 590 nm); and (5) red (preferably approximately 591 to 750 nm, including an optional orange sub-range (preferably approximately 591 to 620 nm), or 621-750 nm, or 621-700 nm, or 600-700 nm, or 610-700 nm, or 610-680 nm, or 620-680 nm, or 620-670 nm, and/or any suitable sub-range as articulated herein).

Other suitable intermediate colors and wavelength ranges or sub-ranges may be used. Since even narrow-band emitters such as LEDs have a measurable peak width (e.g., as may be quantified by a full-width, half-max (FWHM) value), it is recognized that LEDs having a peak wavelength within one of the foregoing color spectral ranges may also generate lesser but still measurable emissions in a different color spectral range. For this reason, various colors as described herein may be optionally descried as "principally <color>" (e.g., principally blue, principally red, etc.) to refer to peak emissions within the articulated color spectral range.

As described further below and as known in the art, one or more LEDs can be coated, at least partially, with one or more phosphors with the phosphors absorbing at least a portion of the LED light and emitting a different wavelength of light such that the LED emits a combination of light from the LED and the phosphor. In one embodiment, the LED emits a white light which is a combination of light emission from the LED chip and phosphor. One or more LEDs can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LEDs are described in U.S. patent application Ser. No. 12/014,404 entitled "Phosphor Coating Systems and Methods for Light Emitting Structures and Packaged Light Emitting Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LEDs can also be coated using other methods such electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that LED devices, systems, and methods according to the present subject matter can also have multiple LEDs of different colors, one or more of which may be white emitting.

As used herein, LEDs may have different color points if they are different colors, have different peak wavelengths and/or dominant wavelengths, or are selected from different wavelength bins. The chromaticity of a particular light source may be referred to as the "color point" of the source. For a white light source, the chromaticity may be referred to as the "white point" of the source. The white point of a white light source may fall along a locus of chromaticity points corresponding to the color of light emitted by a black-body radiator heated to a given temperature. Accordingly, a white point may be identified by a correlated color temperature (CCT) of the light source, which is the temperature at which the heated black-body radiator matches the hue of the light source. White light typically has a CCT of between approximately 2000 kelvin (K) and 10000 K. White light with a CCT of approximately 2500 K can have a reddish color, white light with a CCT of approximately 4000 K can have a yellowish color, and white light with a CCT of approximately 8000 K can have a bluish color. As known in the art, color coordinates that lie on or near a Planckian locus (not shown) at a color temperature between approximately 2500 K and 8000 K may yield pleasing white light to a human observer.

"White" light may also include light that is near, but not directly on the Planckian locus. A Macadam ellipse can be used on a generally available and known 1931 CIE Chromaticity Diagram (not shown) to identify color points that are so closely related that they appear the same, or substantially similar, to a human observer. A Macadam ellipse is a closed region around a center point in a two-dimensional chromaticity space, such as the 1931 CIE Chromaticity Diagram, that encompasses all points that are visually indistinguishable from the center point. A seven step Macadam ellipse captures points that are indistinguishable to an ordinary observer within seven standard deviations; a ten step Macadam ellipse captures points that are indistinguishable to an ordinary observer within ten standard deviations, and so on. Accordingly, light having a color point that is within about a seven to ten step Macadam ellipse of a point on the Planckian locus may be considered to have a substantially similar color as the point on the Planckian locus.

In one aspect, white or near-white light may be established via phosphor conversion where light emitted from one or more LED chips is converted into what is perceived as white or near-white light. For example, blue-emitting LED chips can be coated with a wavelength conversion phosphor that converts some of the blue light emitted by the LED into yellow light. The resulting light may appear white or near-white to an observer, however, objects illuminated by such light may not appear to have a natural coloring because of the limited spectrum of the light. For example, because the light may have little energy in the red portion of the visible spectrum, red colors within an object may not be illuminated well by such light. As a result, the object may appear to have an unnatural coloring when viewed under such a light source. Accordingly, phosphor converted light may be combined with light having wavelength components in the red region of the spectrum for producing warm white light to such that objects illuminated by the light have a more natural coloring.

"Warm white" generally refers to white light that has a CCT between approximately 2600 and 3700 K. As noted above, warm white light may have wavelength components in the red region of the spectrum, and may appear yellowish to an observer. Incandescent lamps and general indoor/outdoor lighting components (e.g., downlights) are typically warm white light components. Thus, LED lighting components that provide warm white light can cause illuminated objects to have a more natural color. For illumination and general lighting applications, it is therefore desirable to provide a warm white light. As used herein, white light refers to light having a color point that is within approximately a seven or ten step Macadam ellipse of the black body locus, or otherwise falls within the ANSI C78-377 standard.

Warm white light can be generated by combining non-white light with red light as described in U.S. Pat. No. 7,213,940, entitled "LIGHTING DEVICE AND LIGHTING METHOD", which is assigned to the assignee of the present inventive subject matter, and the disclosure of which is incorporated herein by reference. As described therein, a lighting device may comprise first and second groups of LED chips, which emit light having dominant wavelength in first and second ranges from approximately 430 nm to 480 nm and from approximately 600 nm to 630 nm, respectively, and a first group of phosphors which emit light having dominant wavelength in the range of from approximately 555 nm to 585 nm. A combination of light exiting the lighting device which was emitted by the first group of chips, and light exiting the lighting device which was emitted by the first group of phosphors produces a sub-mixture of light having x, y color coordinates within a defined area on a 1931 CIE Chromaticity Diagram that is referred to herein as "blue-shifted yellow" or "BSY." Such non-white light may, when combined with light having a dominant wavelength component in the red region, from approximately 600 nm to 630 nm, produce warm white light.

When red LEDs are used in combination with high-power primary blue LEDs (e.g., as embodied in BSY components) it can be challenging to maintain aggregated emissions of such combination at a constant color point. Red LEDs comprise active regions typically formed on Group III phosphide material (e.g., (AL, In, Ga) P) and blue LEDs comprise active regions typically formed on Group III nitride materials (e.g., (Al, In, Ga) N). Heat emanating from the blue LEDs may increase the temperature of the red LEDs which can cause red LEDs to lose a significant portion (e.g., 40-50%) of their efficacy. Thus, electrical current to the red LEDs may need to be altered as temperature increases. To simplify driver design and improve efficiency, it is useful to implement a single current source for driving series-connected LEDs. A single current source for powering red and blue LEDs together may present a color control problem as every emitter in the string typically receives the same amount of current. If either the current or the temperature of the LEDs changes, the color may change as well. As such, and as described further below, a control circuit can be preferably arranged to control the electrical current and maintain the aggregate output emissions of multiple LEDs at a substantially constant color or color temperature over a range of temperatures or in response to various control inputs. In other aspects, it may be desirable to shift aggregate output emissions of multiple LEDs within a specific color regime, for example, for providing dimming compensation in response to various control inputs.

Figure 8:
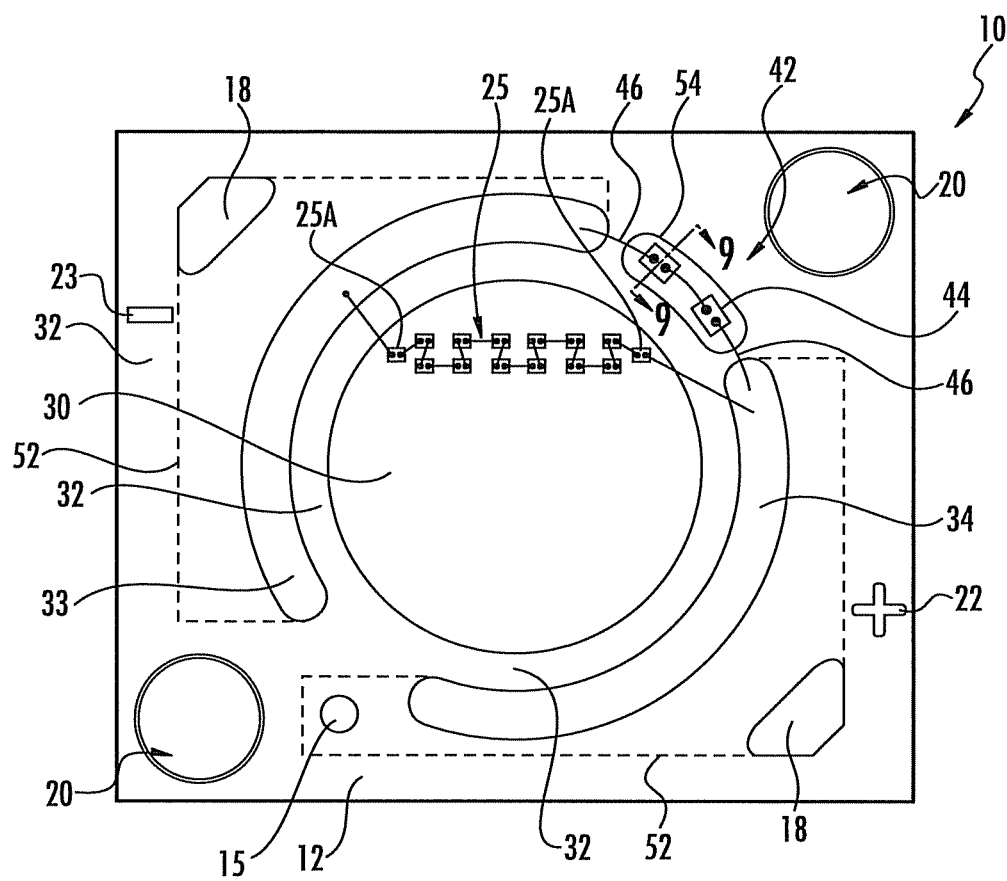
FIG. 8 is a top view of a light emitting device according to the disclosure herein.
Figure 9:
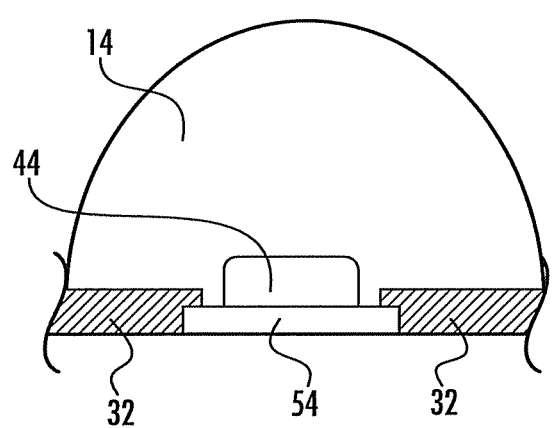
FIG. 9 is a cross-sectional view of a gap area of a light emitting device according to the disclosure herein.

Referring now to FIGS. 1 to 30, FIG. 1 illustrates a top view of a light emitting or LED device, generally designated 10. LED device 10 can comprise a submount 12 over which an emission area, generally designated 16, can be disposed. In one aspect, emission area 16 can be disposed substantially centrally with respect to LED device 10. In the alternative, emission area 16 can be disposed in any location over LED device 10, for example, in a corner or adjacent an edge. In one aspect, emission area 16 can comprise a substantially circular shape. In other aspects, emission area 16 can comprise any other suitable shape, for example, a substantially square, oval, or rectangle shape. LED device 10 can comprise a single emission area 16 or more than one emission area 16. Notably, LED device 10 can comprise a uniform optical source in the form of emission area which can simplify the manufacturing process for manufacturers of light products requiring a single component. LED device 10 can further comprise a retention material 14 disposed at least partially about emission area 16 where retention material 14 can be referred to as a dam. Retention material 14 can also be disposed over at least one electrostatic discharge (ESD) protection device, such as a Zener diode 44 (FIG. 9). In some aspects, retention material can be disposed over two Zener diodes 44 connected in series between two electrical elements (FIG. 8).

Submount 12 can comprise any suitable mounting submount or substrate, for example, a printed circuit board (PCB), a metal core printed circuit board (MCPCB), an external circuit, or any other suitable submount or substrate over which lighting devices such as LEDs may mount and/or attach. Emission area 16 can be in electrical and/or thermal communication with submount 12. In one aspect and for example only without limitation, submount 12 can comprise a compact dimension of 22 millimeter (mm)×22-mm square footprint. In other aspects, submount 12 can comprise any suitable dimension and/or shape, for example, a circular or rectangular shape.

Figure 7:
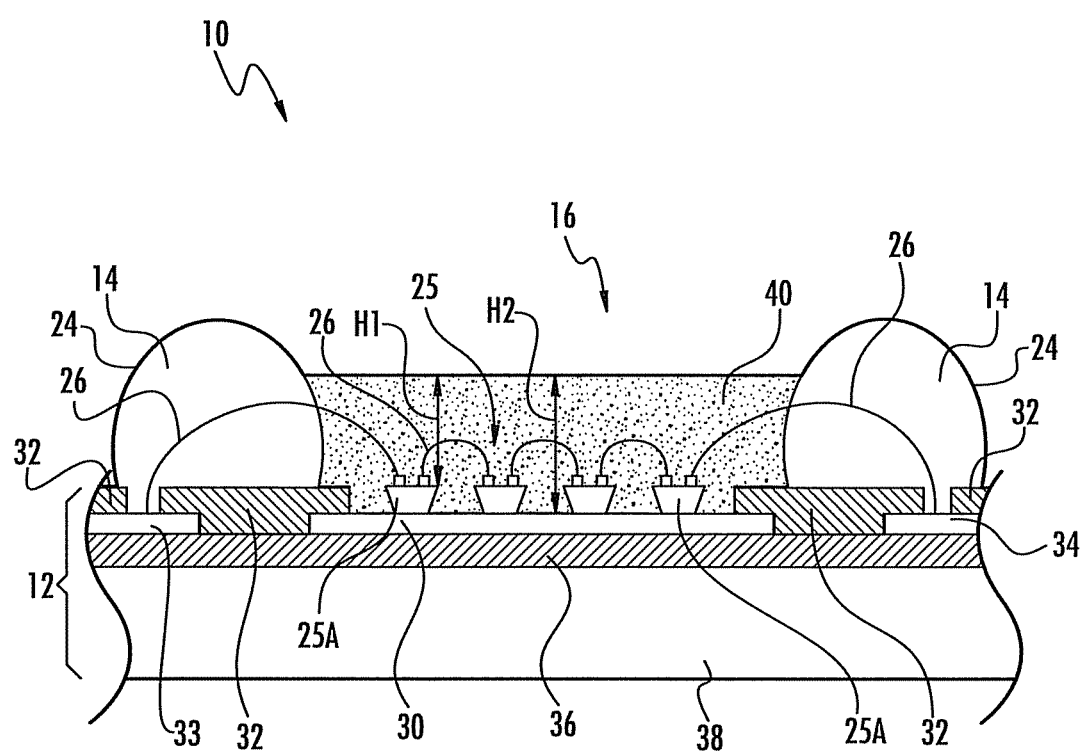
FIG. 7 is a second cross-sectional view of a light emission area of a light emitting device according to the disclosure herein.

Emission area 16 can comprise a plurality of LED chips, or LEDs 25 disposed within and/or below a filling material 40 such as illustrated in FIG. 7. LEDs 25 can comprise any suitable size and/or shape. For example, LEDs 25 can have a rectangle, square, or any other suitable shape. In one aspect, filling material 40 can comprise an encapsulant having a predetermined, or selective, amount of phosphors and/or lumiphors in an amount suitable for any desired light emission, for example, suitable for white light conversion. Filling material 40 can interact with light emitted from the plurality of LEDs 25 such that a perceived white light, or any suitable and/or desirable wavelength of light, can be observed. Any suitable combination of encapsulant and/or phosphors can be used, and combinations of different phosphors for resulting in desired light emission can be used. In other aspects, filling material 40 can comprise a molded lens material. Filling material 40 can be substantially opaque such that emission area 16 can be substantially opaque (as illustrated in FIG. 1), transparent, or semi-transparent depending upon, for example, the amount and type of phosphor used. Retention material 14 can be adapted for dispensing, or placing, about at least a portion of emission area 16. After placement of retention material 14, filling material 40 can be selectively filled to any suitable level within the space disposed between one or more inner walls of retention material 14. For example, filling material 40 can be filled to a level equal to the height of retention material 14 or to any level above or below retention material. The level of filling material 40 can be planar or curved in any suitable manner, such as concave or convex.

Still referring to FIG. 1, LED device 10 can also comprise at least one opening or hole, generally designated 20, that can be disposed through or at least partially through submount 12 for facilitating attachment of LED device 10 to an external substrate or surface. For example, one or more screws can be inserted through the at least one hole 20 for securing device 10 to another member, structure, or substrate. LED device 10 can also comprise one or more electrical attachment surfaces 18. In one aspect, attachment surfaces 18 comprise electrical contacts such as solder contacts. Attachment surfaces 18 can be any suitable configuration, size, shape and/or location and can comprise positive and negative electrode terminals through which an electrical current or signal can pass when connected to an external power source. One or more electrically conductive wires (not shown) can be attached and electrically connected to attachment surfaces 18 when welded, soldered, or any other suitable attachment method known. Electrical current or signal can pass into LED device 10 from the external wires electrically connected to the attachment surfaces 18 and into the emission area 16 to facilitate light output. Attachment surfaces 18 can electrically communicate with emission area 16 which comprises one or more LEDs 25. Attachment surfaces 18 can electrically communicate with first and second conductive traces 33 and 34 (see FIG. 8) and therefore LEDs 25 which may be electrically connected using electrical connectors. Electrical connectors can comprise wirebonds or other suitable members for electrically connecting LEDs 25 to first and second conductive traces 34 and 33.

LED device 10 can further comprise an indicator sign or symbol for denoting the electrical polarity for a given a side of LED device 10. For example, a first symbol 22 can comprise a "+" sign denoting the side of LED device 10 comprising the positive electrode terminal. A second symbol 23 can comprise a "−" sign denoting the side of LED device 10 comprising the negative electrode terminal. One or more test points 15 can be located adjacent either a positive or negative side of the device for testing the electrical and/or thermal properties of the LED device 10. In one aspect, test point 15 can be disposed adjacent the negative side, or terminal of LED device 10.

Figure 2:
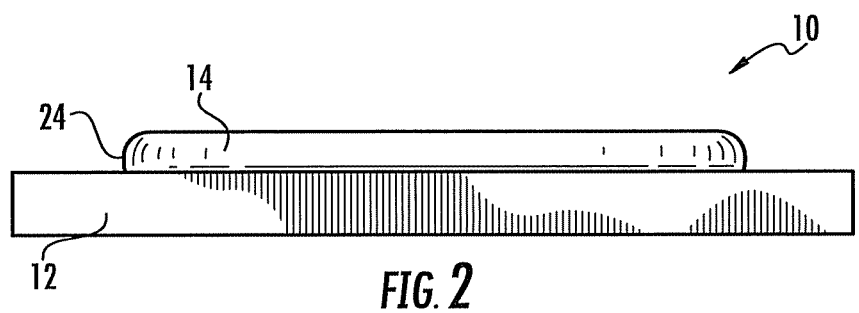
FIG. 2 is a side view of an embodiment of a light emitting device according to the disclosure herein.

FIG. 2 illustrates a side view of LED device 10. As illustrated by FIGS. 1 and 2, retention material 14 can comprise a substantially circular dam disposed about at least a portion of emission area 16 and disposed over submount 12. Retention material 14 can be dispensed, positioned or otherwise placed over submount 12 and can comprise any suitable size and/or shape. Retention material 14 can comprise any suitable reflective material and can comprise a clear or opaque white material such as, for example, a silicone or epoxy material. Filler particles such as titanium dioxide ($TiO_2$), for example, can be used and added to retention material 14 for providing an opaque material. Retention material 14 can adapted for dispensing or depositing in place using an automated dispensing machine where any suitable size and/or shape of dam can be formed. In one aspect, a circular shape as shown can be dispensed, although any other configuration could also be provided such as, for example, a rectangular configuration, a curved configuration and/or any combination of desired configurations and cross-sectional shapes. As FIG. 2 illustrates in a side view of LED device 10, retention material 14 can comprise a rounded outer wall 24 such that the upper surface of retention material 14 opposite submount 12 is rounded. Rounding or curving outer wall 24 of retention material 14 may further improve the amount of light reflected by LED device 10.

Figure 3A:
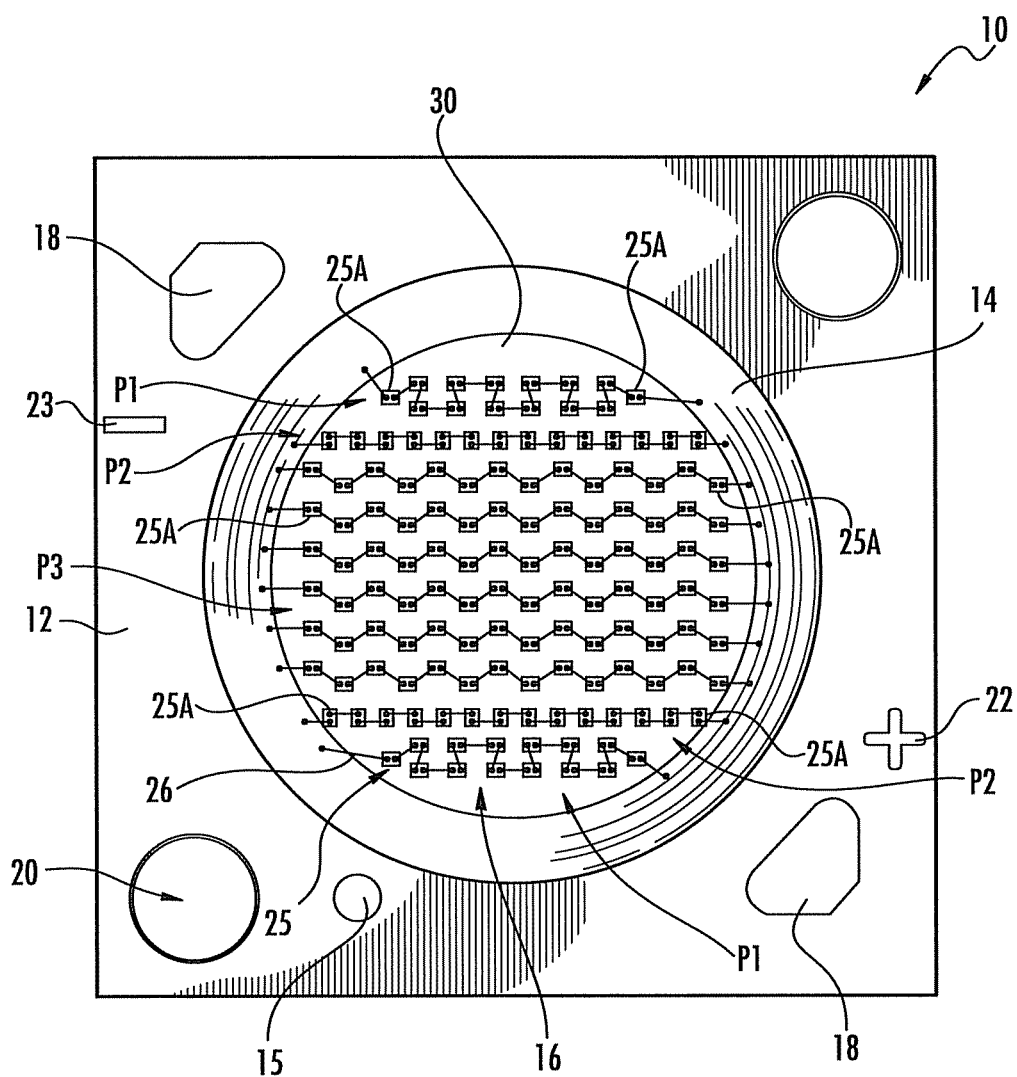
FIGS. 3A and 3B are top views of an embodiment of a light emitting device having one or more patterns of light emitting diodes (LEDs) according to the disclosure herein.
Figure 3B:
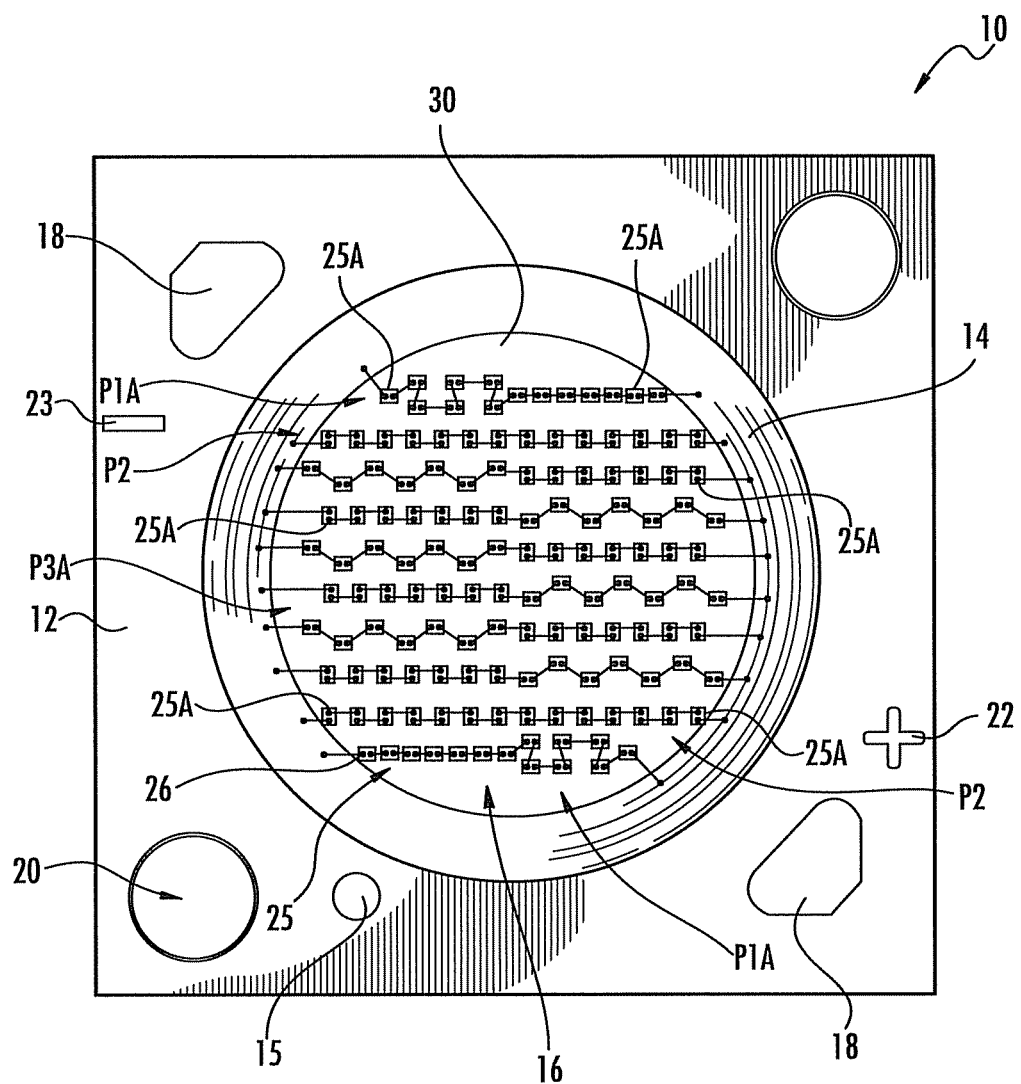

Retention material 14 can comprise any material known in the art, for example, a silicone material comprising 7% fumed silica+3% $TiO_2$+methyl silicone. In one aspect, retention material 14 is adapted to reflect light, and may comprise and/or be coated with a reflective material. As illustrated in FIGS. 3A and 3B, retention material 14 can be dispensed after wirebonding of the one or more LEDs 25 such that retention material 14 is disposed over and at least partially covers wirebonds 26 to contain at least a portion, such as one end of each of wirebonds 26 within retention material 14. In FIGS. 3A and 3B, wirebonds 26 for the first and last, or outermost edge LEDs 25A for a given set of LEDs such as LEDs 25 are disposed within retention material 14. In one aspect, retention material 14 can be "planed" during dispersion at room temperature for accurate volume and/or height control. The addition of $TiO_2$ can increase reflection about the emission area 16 to further to optimize light emission of LED device 10. Fumed silica can be added as a thixotropic agent. Dispersing retention material 14 can allow increased board space and the ability to withstand higher voltages. In some aspects, LED device 10 can be operable at 42 volts (V) or higher.

Figure 4:
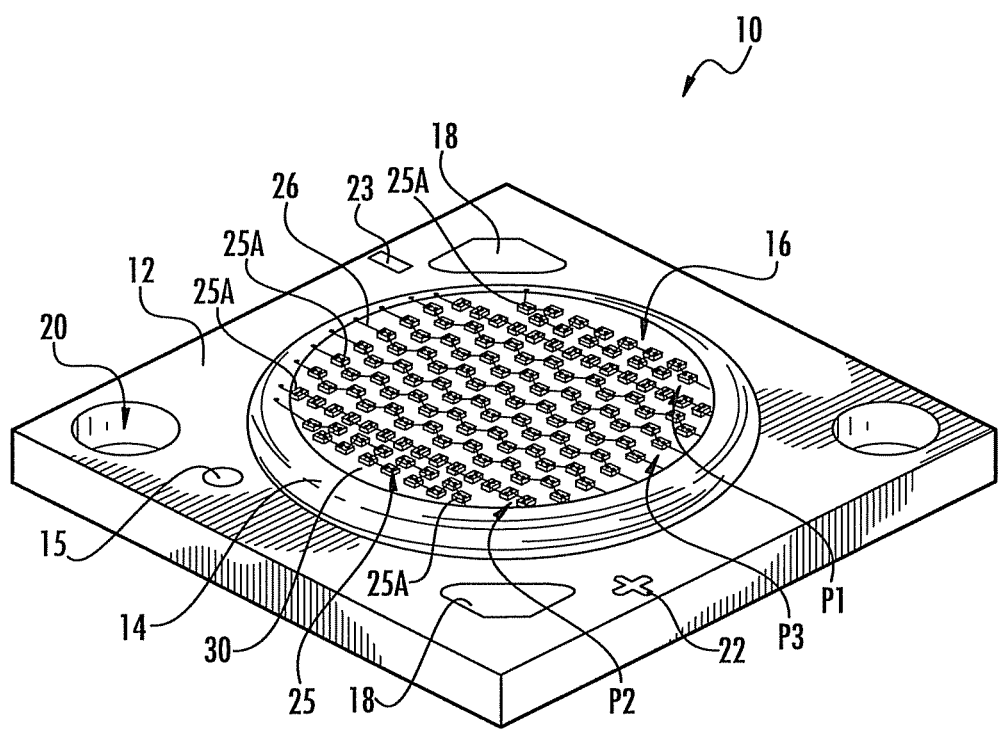
FIG. 4 is a top perspective view of an embodiment of a light emitting device having one or more patterns of LEDs according to the disclosure herein.

FIGS. 3A, 3B and 4 illustrate emission area 16 without a layer of filling material 40. FIGS. 3A and 3B illustrate LED device 10 and emission area 16 comprising at least one pattern, or arrangement, of LEDs. LEDs 25 can be arranged, disposed, or mounted over a conductive pad 30. LEDs 25 can be arranged or disposed in sets of LEDs, that can comprise one or more strings or LEDs, and a given set of LEDs can for example be one or more strings of LEDs electrically connected in series or any other suitable configuration. More than one set of LEDs can be provided, and each set of LEDs can be arranged in parallel to one or more other sets of LEDs. As described further herein, the LEDs in any given set or string of LEDs can be arranged in any suitable pattern or configuration, and even LEDs within a given set or string of LEDs can be arranged or disposed in one or more different patterns or configurations. For example, FIG. 3A illustrates at least three sets of LEDs arranged in three patterns, for example, a first pattern P1, a second pattern P2, and a third pattern P3. Each of patterns P1, P2, and P3 can comprise a consistent pattern design across emission area 16. More than one of patterns P1, P2, and/or P3 can be used. Each of patterns P1, P2, and/or P3 can alternate or be arranged in any suitable configuration. For illustration purposes, only three patterns are illustrated. Any number of patterns or arrangements is contemplated, and patterns can comprise any suitable design, for example, a checkerboard design or a grid design or arrangement wherein the LEDs can be at least substantially aligned in at least two directions. FIG. 3B illustrates at least three sets of LEDs arranged in patterns, for example, a first pattern P1A, second pattern P2, and a third pattern P3A which combine one or more of patterns P1, P2, and P3 illustrated in FIG. 3A. For example, patterns P1A and P3A can comprise a combination of more than one pattern. In one aspect, pattern P1A can comprise a grid arrangement or pattern and a straight line arrangement or pattern. In one aspect, pattern P3A can comprise the checkerboard and straight line pattern designs. Each of patterns P1A and P3A can comprise 14 LEDs 25, seven LEDs of each pattern design. For illustration purposes, only two combinations are illustrated. However, please note that each set of LEDs can comprise a combination having more than two patterns.

Still referring to FIGS. 3A and 3B, conductive pad 30 can be electrically and/or thermally conductive and can comprise any suitable electrically and/or thermally conductive material. In one aspect, conductive pad 30 can comprise a conductive metal. In one aspect shown in FIG. 3A, emission area 16 can comprise one or more LEDs 25 arranged in a single pattern over conductive surface, or pad 30. In an alternative, LEDs can be provided that are a combination of more than one pattern of LEDs, such as LEDs 25, arranged over conductive pad 30 as FIG. 3B illustrates. As noted above, emission area 16 can comprise a combination of different arrangements or patterns, for example, a combination of first pattern P1, second pattern P2 and/or third pattern P3 for optimizing light emission and device brightness. Each set, or string of LEDs 25 disposed over conductive pad 30 can comprise outermost LEDs 25A with one or more LEDs 25 disposed therebetween. Each string of LEDs 25 can comprise the same or a different pattern, for example, patterns P1, P2, and/or P3. Strings of LEDs 25 can comprise diodes of the same and/or different colors, or wavelength bins, and different colors of phosphors can be used in the filling material 40 (FIG. 7) disposed over LEDs 25 that are the same or different colors in order to achieve emitted light of a desired wavelength. The one or more patterns of LEDs 25 can comprise an array of LEDs within emission area 16.

FIGS. 3A, 3B, and 4 illustrate emission area 16 comprising, for example, 10 lines, or strings, of LEDs 25. Each string of LEDs 25 can comprise any suitable number of LEDs electrically connected between outermost LEDs 25A which can connect to respective electrical elements. In one aspect, each string of LEDs 25 can comprise at least 14 LEDs. In one aspect, LED device can comprise at least 140 LEDs arranged in an array. The arrangements, patterns, and/or combination of multiple patterns herein can comprise an array for optimizing color uniformity and brightness of light emitted from LED device 10. The LEDs can be electrically connected in series using one or more wirebonds 26 for attaching bond pads of adjacent LEDs 25. In one aspect as shown in FIG. 3A, first pattern P1 can comprise the first and tenth strings of 14 LEDs 25. First pattern P1 can comprise two opposing lines of LEDs 25 disposed between the first and last, or outermost LEDs 25A of the series. In one aspect, first pattern P1 comprises what is referred to herein as a grid arrangement, pattern or design, where at least two LEDs are at least substantially aligned in at least two directions and can include single, unaligned LEDs at opposing ends of a set or string of LEDs. Each of the LEDs 25 comprising first pattern P1 can be electrically connected in series.

In one aspect, second arrangement or second pattern P2 can be disposed adjacent first pattern P1, for example, located at the second and ninth strings of LEDs 25. In one aspect, second pattern P2 can comprise 14 total LEDs 25 wherein each of the 14 LEDs 25 can be arranged adjacent each other along a horizontal line in a straight line design, or arrangement, and each of the 14 LEDs 25 can be electrically connected in series. Any suitable number of LEDs 25 can be connected in any suitable configuration or arrangement such as in series to form a string having a suitable pattern. Care must be taken when connecting LEDs 25 in series such that the positive or negative electrode of a preceding LED electrically connects to an electrode of opposite electrical polarity for a subsequent LED for allowing electrical current to flow properly through the string of LEDs 25.

Third pattern P3 shown in FIG. 3A can comprise a checkerboard pattern having a checkerboard design, or arrangement of LEDs 25 electrically connected in series. In one aspect, at least 14 LEDs 25 can comprise the checkerboard pattern, and third pattern P3 can be disposed between and/or alternate with strings of LEDs having second pattern P2. The checkerboard pattern or third pattern P3 can comprise a set of LEDs 25 alternating both above and below a horizontal line. Patterns P1, P2, and P3 are not limited in the shape of pattern or to at least 14 LEDs, but rather, patterns can comprise any suitable arrangement and any suitable number of LEDs 25. For illustration purposes, only three patterns are shown although any suitable number of patterns could be utilized. The alternating LEDs 25 of third pattern P3 can optimize light output by ensuring uniform coverage and spatial alignment over conductive pad 30 such that light emission is uniform and improved. Third pattern P3 can repeat from the third through the eighth string of LEDs 25. First and last LEDs 25A in a given string of LEDs 25 for each of patterns P1, P2, and/or P3 can electrically connect to first and second conductive traces 33 and 34 (see FIGS. 7, 8) for receiving and transmitting electrical current or signal through and illuminating a given string of LEDs 25.

The LEDs even in a single set or string in emission area 16 can comprise LEDs in more than one pattern or configuration. For example, FIG. 3B illustrates one aspect of a possible arrangement of LEDs in emission area 16 where there are at least two sets, shown here as strings without limitation, of LEDs 25 and where LEDs 25 for some sets or strings are arranged in different patterns or configurations with respect to another set or string of LEDs and even within one single set or string of LEDs. Any two given separate sets or strings of LEDs 25 can be electrically connected in a pattern such that some or all of the LEDs within each of the two sets or strings of LEDs can be arranged in different patterns, in identical patterns, or in any combination of patterns. In other words, the LEDs in any given set or string can be disposed in different or identical patterns with respect not only to the LEDs in that set or string but can also be disposed in any pattern with respect to another set or string of LEDs and the two sets or strings can in one aspect be parallel to one another. For example, LEDs 25 in FIG. 3B can be disposed in one aspect such that emission area 16 comprises a combination of different arrangements or patterns, for example, a first pattern P1A, a second pattern P2A and/or a third pattern P3A for optimizing light emission and device brightness.

As noted earlier, patterns P1A and P3A illustrate a combination of two different patterns, for example at least two of the checkerboard, straight line and/or grid arrangement, however, combinations of more than two patterns are hereby contemplated. Only three pattern arrangements have been disclosed (i.e., checkerboard, grid, straight line), but any suitable arrangement or pattern design can be used. Each string of LEDs 25 disposed over conductive pad 30 can comprise outermost LEDs 25A with one or more LEDs 25 disposed therebetween. Each set or string of LEDs 25 can comprise the same or a different pattern, for example, patterns P1A, P2A, and/or P3A. Sets or strings of LEDs 25 can comprise diodes of the same and/or different colors, or wavelength bins, and different colors of phosphors can be used in the filling material 40 (FIG. 7) disposed over LEDs 25 that are the same or different colors in order to achieve emitted light of a desired wavelength. The one or more patterns of LEDs 25 can comprise an array of LEDs within emission area 16. As FIG. 3B illustrates, for example, in pattern P3A, sets of LEDs 25 can comprise rectangular LEDs arranged where the major (i.e., long) axis of a first LED is disposed in a different orientation than the major axis of at least a second LED. That is, a given set of LEDs 25 can comprise LEDs 25 in different orientations. In other aspects, as illustrated in FIG. 3A for example, pattern P2 and pattern P3 can comprise sets of rectangular LEDs 25 where the major axis is the same is the same for the given set but different from the orientation of other sets.

The various LED arrangements and device designs as described herein are advantageous for providing a light emitting device with excellent performance and output while still being a small light emitting device where pressure exists to provide small devices while maintaining quality performance and light output.

Figure 5:
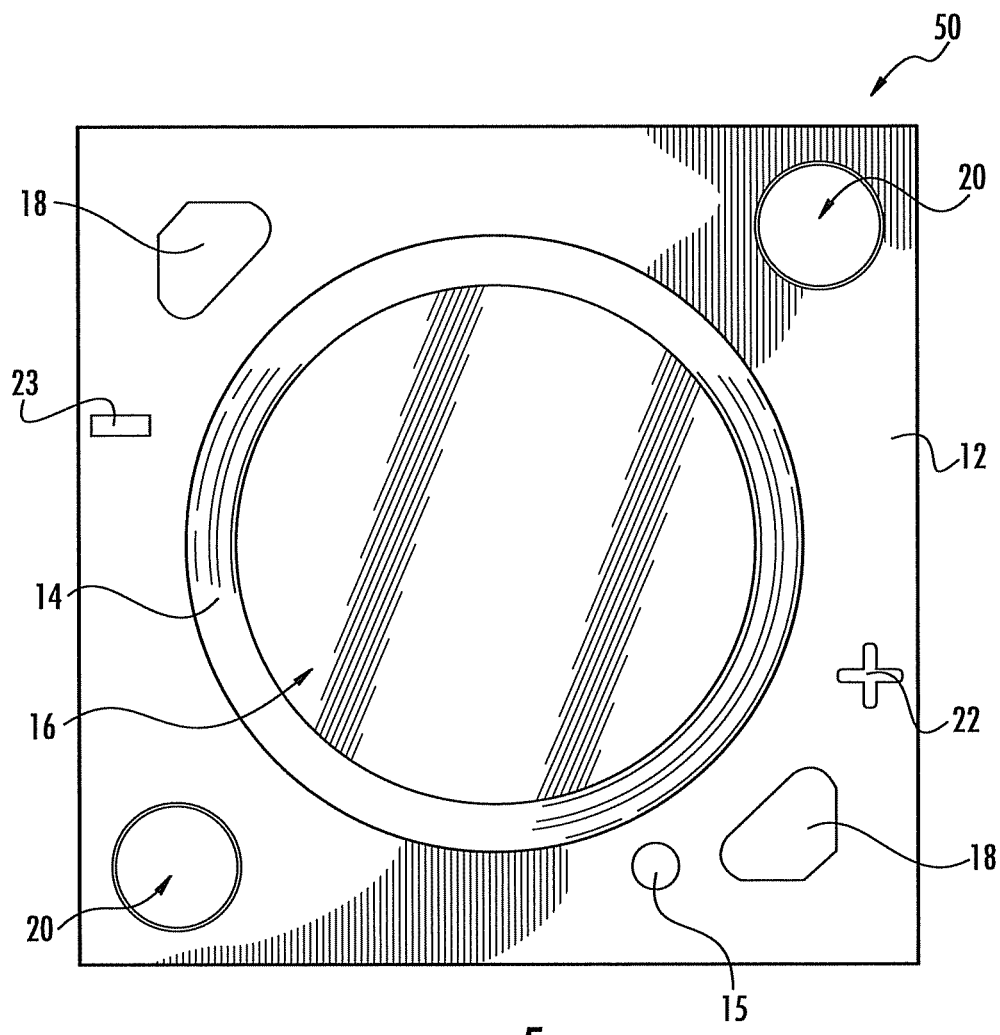
FIG. 5 is a top view of an embodiment of a light emitting device according to the disclosure herein.

FIG. 5 illustrates a second embodiment of an LED device, generally designated 50 which is similar in form and function to LED device 10. LED device 50 can comprise submount 12 and emission area 16 disposed over submount 12. Emission area 16 can comprise any suitable size, shape, number and/or be disposed at any suitable location over submount 12. Retention material 14 can be disposed over submount 12 and at least partially about emission area 16. LED device 50 can comprise one or more openings or holes 20, disposed through submount 12 for facilitating attachment of LED device 10 to an external substrate or surface. LED device 50 can comprise first and second symbols 22 and 23 for denoting the electrical polarity of LED device 50. LED device 50 illustrates test point 15 disposed adjacent the positive or side of the device for testing the electrical and/or thermal properties of the LED device 50. LED device 50 further can comprise at least one electrical attachment surface 18 that can electrically connect to one or more external wires (not shown) for facilitating the flow of electric current into emission area 16 of LED device 50. In one aspect, attachment surface 18 can comprise a shape having curved corners. Rounding the corners, or edges of attachment surfaces 18 may better contain the flow of solder over the device than sharp corners when attaching one or more external conductive wires (not shown) to LED device 50.

Figure 6:
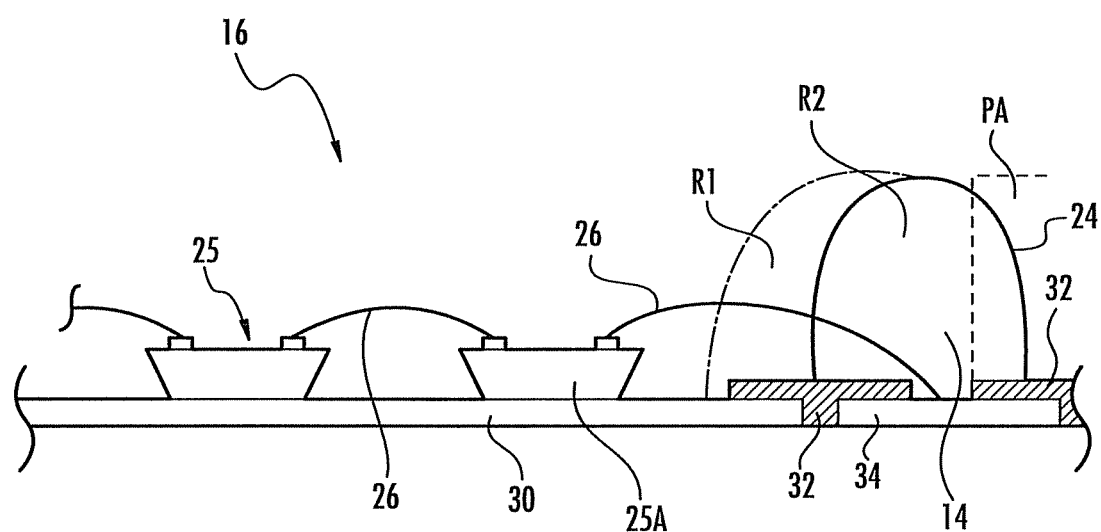
FIG. 6 is a first cross-sectional view of a light emission area of a light emitting device according to the disclosure herein.

FIG. 6 illustrates a portion of a cross-section along an edge of conductive pad 30 of FIGS. 3A and 3B wherein the emission area 16 has not been filled with filling material 40 such as encapsulant and/or phosphors. FIG. 6 illustrates LEDs 25 comprising an outermost LED 25A and adjacent LED for a given string of LEDs within emission area 16. FIG. 7 illustrates a portion of a cross-section of FIG. 1 wherein filling material 40 is disposed over emission area 16. For illustration purposes, four LEDs 25 are illustrated and electrically connected in series in FIG. 7. However, as noted earlier, each string, or pattern of LEDs 25 can comprise any suitable number of LEDs 25. In one aspect, each string of LEDs can comprise 14 LEDs 25. FIGS. 6 and 7 illustrate one or more LEDs 25 connected in series by one or more wirebonds 26. LEDs 25 can be arranged over conductive pad 30 and can thermally communicate directly with conductive pad 30 or indirectly through one or more intervening layers. LEDs 25 can attach to conductive pad 30 or intervening layers using any attachment means known in art. In one aspect, LEDs 25 can attach using solder pastes, epoxies, or flux. Conductive pad 30 can be formed integral as one piece of submount 12 or can comprise a separate layer disposed over submount 12. Conductive pad 30 can dissipate heat generated by the one or more LEDs 25.

As FIGS. 6 and 7 further illustrate, the outermost LEDs 25A for a series, string, or pattern of LEDs 25 can electrically communicate or connect to one or more electrical elements. Electrical elements can comprise first and second conductive traces 33 and 34 configured to flow, or supply electrical signal or current to the respective strings of LEDs 25. One of first and second conductive traces 33 and 34 can comprise an anode and the other a cathode. The electrical polarity can be denoted by first and second symbols 22 and 23 (FIG. 1) as discussed earlier. Conductive pad 30 and conductive traces 33 and 34 can comprise any suitable electrical and thermally conductive materials and can comprise either the same or different materials. In one aspect, conductive pad 30 and conductive traces can comprise a layer of copper (Cu) deposited over a portion of submount (e.g., dielectric layer 36 of FIG. 7) using any suitable technique. An electrically insulating solder mask 32 can be disposed at least partially between conductive pad 30 and respective conductive traces 33 and 34 such that when solder is used to attach one or more LEDs 25 over conductive pad 30, the solder cannot electrically connect with the conductive traces 33 and 34 thereby causing one or more strings of LEDs 25 to become electrically shorted.

FIG. 6 illustrates various placement areas, positions, or locations of retention material 14 about emission area 16. In one aspect, retention material 14 can be dispensed about at least a portion, or entirely about emission area 16. Conventional devices can comprise a molded as opposed to dispensed dam placed at a location such as prior art location PA shown in broken lines in FIG. 6 and disposed along an edge of where solder mask 32 contacts first conductive trace 34. The present subject matter envisions retention material 14 disposed in areas, positions, or locations R1, R2, and/or any location therebetween. When retention material 14 is disposed in locations R1 or R2, it can be disposed over and cover at least a portion of one or more wirebonds 26 connecting outermost LEDs 25A to electrical elements, such as conductive trace 34. When in location R1, retention material 14 can be disposed at least partially over each of solder mask 32 and wirebond 26 connected to outermost LED 25A for a respective string of LEDs 25. In one aspect, retention material 14 can be disposed entirely over the portion of solder mask 32 disposed between conductive pad 30 and conductive trace 34 and/or entirely over wirebond 26 when in location R1. In another aspect, retention material 14 can be disposed over and at least partially or entirely cover each of the wirebonds 26 of each of the outermost LEDs 25A for each string of LEDs 25 disposed in emission area 16. The retention material can be dispensed in a predetermined location on the submount 12 for providing a suitable distance between the retention material 14 and the one or more LEDs 25. Notably, when in location R1, retention material 14 can eliminate the need for solder mask 32 as retention material would be disposed between conductive pad 30 and first and/or second conductive traces 33, 34. Location R2 illustrates retention material 14 disposed at least partially over solder mask 32 and at least partially over wirebond 26 of outermost LED 25A. As illustrated, retention material 14 according to the subject matter herein can comprise a substantially rounded or hemispheric shaped cross-section. Rounding retention material 14 can increase the surface area from which light may be emitted and/or reflected.

FIG. 7 illustrates a string of one or more LEDs 25, for illustration purposes four LEDs 25 are shown but strings of LEDs 25 can comprise any suitable number of LEDs, for example, 14 LEDs 25 arranged in series. FIG. 7 illustrates a cross-section of submount 12 over which LEDs 25 can be mounted or otherwise arranged. Submount 12 can comprise, for example, conductive pad 30, first and second conductive traces 33 and 34, and solder mask 32 at least partially disposed between conductive pad 30 and each of conductive traces 33 and/or 34. As noted earlier, if retention material is positioned adjacent outermost LEDs 25A, for example in location R1, solder mask 32 between conductive pad 30 and first and second conductive traces 33 and 34 can be eliminated as it would no longer be necessary. Solder mask 32 can be disposed between conductive traces 33 and 34 and attachment surfaces 18 (FIG. 8), the proximal edges of which can be seen in FIG. 7 adjacent retention material 14, adjacent the outer wall 24 of retention material 14. Submount 12 can further comprise a dielectric layer 36, and a core layer 38. For illustration purposes, submount 12 can comprise a MCPCB, for example, those available and manufactured by The Bergquist Company of Chanhassan, Minn. Any suitable submount 12 can be used, however. Core layer 38 can comprise a conductive metal layer, for example Cu or aluminum (Al). Dielectric layer 36 can comprise an electrically insulating but thermally conductive material to assist with heat dissipation through submount 12. FIG. 7 illustrates retention material 14 arranged, for example, in position R2 at least partially over each of solder mask 32 and the wirebond 26 connecting to conductive traces 33 and 34. FIG. 7 illustrates filling material 40 disposed over the one or more LEDs 25. Filling material 40 can be selectively filled to any suitable level higher, lower, or equal to the height of retention material 14. Wirebonds 26 of the outermost LEDs 25A as shown can be at least partially disposed within retention material 14.

FIG. 7 further illustrates examples of first and second heights H1 and H2 of filling material 40 which can be selectively filled within LED device 10. First height H1 can comprise a height at which filling material 40 is disposed over the LEDs 25. The height may vary due to process variability, so an average height above the string of LEDs 25 can be used and controlled for optimal brightness. Second height H2 can comprise a height at which filling material 40 is selectively disposed over a top surface of conductive pad 30. Second height H2 can be controlled, for example, by controlling the location of retention material 14 and whether it assumes location R1, R2 or any position therebetween. Second height H2 can also be controlled by controlling the amount of filling material 40 dispensed into the cavity defined by retention material 14.

Controlling the volume of filling material 40 within the cavity, or dam defined by retention material 14 can affect first and second heights H1 and/or H2 and can notably allow for fine-tuning, or micro-tuning the color, or wavelength, of light emitted from LED device 10. Micro-tuning the color of LED devices 10 can therefore ideally increase product yields to 100%. For example, the amount of color affecting components, including but not limited to phosphors, contained in filling material 40 can be selectively added and the first and/or second heights H1, H2 can be selectively controlled by under or over filling the filling material 40 within emission area 16 depending on the wavelength of LEDs 25 used within device 10. Location of retention material 14, for example, locating retention material at R1, R2, or any position or distance therebetween can also affect first and/or second heights H1 and H2. Micro-tuning color can be achieved over multiple devices or on a per device, or package, basis by changing, for example the ratio of volume of phosphor to overall dispense capability volume of filling material 40. The ratio of volume of phosphor to overall dispense capability volume of filling material 40 can be adjusted based on the wavelength bin of LEDs 25 selected for use in a given device to attain the desired overall wavelength output of LED device 10. By manipulating, for example, the diameter of the dam provided by retention material 14 and/or the height of retention material 14, each of which can affect heights H1 and/or H2 and therefore the volume of fill material, the color of individual devices 10 can be micro-tuned thereby attaining higher process yields. Notably, selectively controlling a volume of the fill material such that color-affecting components of the fill material can be fine-tuned allows for light produced by the one or more LEDs to fall within a predetermined and precise color range.

FIG. 8 illustrates LED device 10 comprising submount 12 prior to arranging, dispensing, or otherwise placing retention material 14 about at least a portion of emission area 16. For illustration purposes, only a first string of LEDs 25 is illustrated, however, as noted earlier, emission area can comprise more than one strings of LEDs 25 electrically connected in series. In one aspect, LED device 10 comprises 10 strings of LEDs 25 connected in series. As illustrated, prior to placing retention material 14, submount 12 can comprise first and second conductive traces 33 and 34 arranged in a substantially circular arrangement about conductive pad 30 such that LEDs arranged over conductive pad 30 can electrically communicate to each trace by wirebonding and wirebonds 26 or by any other suitable attachment method. As illustrated, outermost LEDs 25A for a respective string of LEDs 25 can electrically connect to conductive traces.

At least one gap 42 can exist between conductive traces 33 and 34. LED device 10 and devices disclosed herein can further comprise elements to protect against damage from ESD positioned, or disposed in the gap 42. In one aspect, different elements can be used such as various vertical silicon (Si) Zener diodes, different LEDs arranged reverse biased to LEDs 25, surface mount varistors and lateral Si diodes. Such elements can be positioned over a conductive surface 54, such as a surface of Cu material. In one aspect, at least one Zener diode 44 can be disposed between ends of first and second conductive traces 33 and 34 and reversed biased with respect to the strings of LEDs 25. In one aspect, two Zener diodes 44 can be electrically connected in series using one or more wirebonds 46 between first and second conductive traces 33 and 34 for higher voltage applications. As Zener diodes 44 are typically black and absorb light, placing the at least one Zener diode 44 in gap 42 between conductive traces 33 and 34 and also beneath retention material 14 can further improve light output intensity.

FIG. 8 also illustrates one possible location for conductive pad 30. That is, conductive pad 30 can comprise a substantially centrally located circular pad disposed between conductive traces 33 and 34. Conductive pad 30 however, can be located at any suitable location over submount and any location other than substantially center the device. Solder mask 32 can be disposed at least partially between respective conductive traces and conductive pad 30, such that the solder mask 32 comprises a substantially circular arrangement about conductive pad 30. Solder mask 32 can also be disposed in areas outside of the conductive traces and conductive pad 30 for example, between the respective conductive traces and one or more attachment surfaces 18. Broken lines 52 illustrate one possible aspect of the size and/or shape of the electrically and/or thermally conductive material comprising the conductive traces 33 and 34. The lines are broken to illustrate how the conductive material can be disposed under solder mask 32. That is, attachment surfaces 18 can electrically and/or thermally communicate with respective conductive traces 33 and 34, and can comprise the same layer of material. Attachment surfaces 18, conductive traces 33 and 34, conductive pad 30 and test point 15 can comprise areas of exposed material, such as areas of exposed Cu. Solder mask 32 can be disposed between the areas of exposed Cu.

External, conductive wires (not shown) can electrically connect to attachment surfaces 18, and electrical current or signal can flow from the attachment surfaces 18 to the respective conductive traces 33 and/or 34. The electrical current can flow along the conductive material designated by dotted lines 52 disposed below the layer of solder mask 32. The electrical current can flow into and/or out of the conductive traces and therefore into and out of respective strings of LEDs 25 mounted over conductive pad 30.

As noted earlier, Zener diodes 44 are typically black and absorb light. FIG. 9 illustrates Zener diode 44 upon placement of the retention material. In one aspect, retention material 14 can be disposed at least partially over the at least one Zener diode 44. In another aspect, retention material 14 can be disposed entirely over the at least one Zener diode 44 such that the diode is completely covered for further improving light output intensity. Zener diode 44 can be disposed over an electrically and/or thermally conductive surface or area 54 such that current can flow through the diode 44, into the wirebonds 46, and to respective conductive traces 33 and 34.

LED devices disclosed herein can advantageously consume less energy while delivering equal or greater illumination. In one aspect, when used in traditional downlight applications, luminaires based on LED devices 10 and/or 50 can deliver 38% more illumination than a 26-watt CFL or a 100-watt incandescent bulb, while consuming only 14 watts. In one aspect, LED device 10 can enable a 60-watt A-lamp equivalent while consuming only 11 watts. LED device 10 can comprise a light output of 1050 lumens at 11 watts, or 2000 lumens at 27 watts, with a 3000-K warm-white color temperature.

Figure 10:
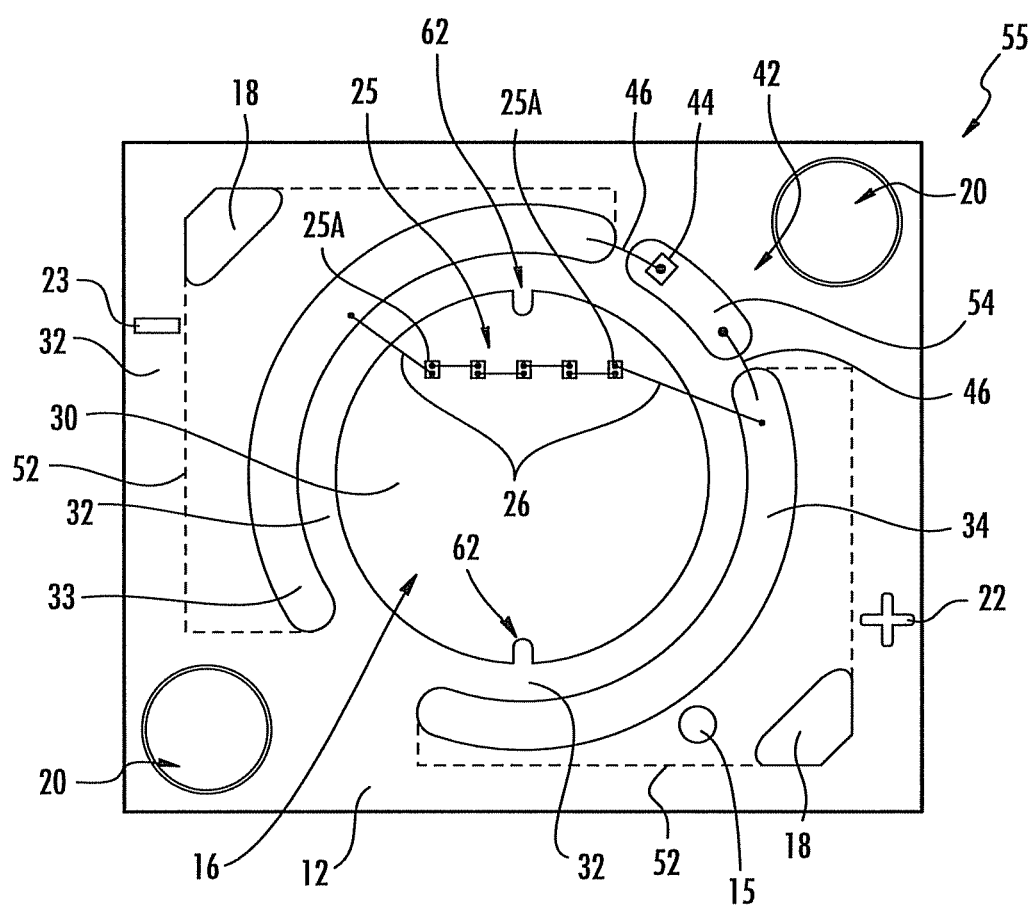
FIG. 10 is a top view of a light emitting device according to the disclosure herein.

FIG. 10 illustrates another embodiment of an LED device, generally designated 55. LED device 55 illustrates submount 12 prior to arranging, dispensing, or otherwise placing retention material 14 (FIG. 11) about at least a portion of emission area 16. For illustration purposes, only a first string of LEDs 25 is illustrated, however, emission area can comprise more than one string of LEDs 25 electrically connected in series. Each string of LEDs 25 can comprise the same or a different pattern. LED device 60 is similar in form and function to LED device 10 previously described with respect to FIG. 8. For example, prior to placing retention material 14, submount 12 can comprise first and second conductive traces 33 and 34 arranged in a substantially circular arrangement about conductive pad 30 such that LEDs arranged over conductive pad 30 can electrically communicate to each trace by wirebonding via wirebonds 26 or any other suitable attachment method. As illustrated, outermost LEDs 25A for a respective string of LEDs 25 can electrically connect to the conductive traces. In fact, for LED devices described herein, emission area 16 can comprise a single, undivided mounting area at least partially defined by outermost LEDs 25A, with the outermost LEDs 25A being wirebonded via wirebonds 26 to contact areas, such as conductive traces 33 and 34. LEDs 25 that are not the outermost LEDs 25A are wirebonded via wirebonds 26 in strings having one or more patterns or arrays.

At least one gap 42 can exist between conductive traces 33 and 34. In this embodiment, one or more ESD protection device or Zener diode 44 can be disposed in gap 42 and can be electrically connected, or mounted to conductive area 54. In this embodiment, conductive area 54 can comprise an area larger than a footprint of Zener diode 44. Zener diode 44 can be positioned over conductive area 54 between ends of first and second conductive traces 33 and 34. Zener diode 44 can be reversed biased with respect to the one or more strings of LEDs 25. For example, when one Zener diode 44 is used, one or more wirebonds 46 can connect conductive area 54 to one of first and second conductive traces 33 and 34 such that Zener diode 44 can be reverse biased with respect to the strings of LEDs 25. As Zener diodes 44 are typically black and absorb light, placing the at least one Zener diode 44 in gap 42 between conductive traces 33 and 34 and also beneath retention material 14 (FIG. 9) can further improve light output intensity.

FIG. 10 also illustrates one possible location for test point 15. Test point 15 can be disposed within the area marked by broken lines 52 which correspond to conductive material disposed under solder mask. Broken lines 52 illustrate one possible aspect of the size and/or shape of the conductive material which can be deposited on or in submount 12 for electrically coupling conductive traces 33 and 34 and attachment surfaces 18. The electrical coupling allows electrical current to be communicated from attachment surfaces 18 to the one or more strings of LEDs 25 electrically connected to traces 33 and 34. The lines are broken to illustrate how the material can be disposed under solder mask 32. Thus, test point 15 and attachment surfaces 18 electrically and/or thermally communicate with respective conductive traces, and can comprise the same layer of material. Solder mask 32 can be deposited or disposed at least partially between respective conductive traces and conductive pad 30, such that the solder mask 32 comprises a substantially circular arrangement about conductive pad 30. Conductive pad 30 can comprise one or more marks or notches 62 for orientation purposes and for proper alignment of retention material 14.

Solder mask 32 can also be deposited in areas outside of the conductive traces, for example, between the respective conductive traces and one or more attachment surfaces 18 and/or test point 15. External, conductive wires (not shown) can electrically connect to attachment surfaces 18, and electrical current or signal can flow from the attachment surfaces 18 to the respective conductive traces. The electrical current can flow along the conductive material designated by dotted lines 52 disposed below the layer of solder mask 32. The electrical current can flow into and/or out of the conductive traces and therefore into and out of respective strings of LEDs 25 mounted over conductive pad 30. In one aspect, test point 15 can allow electrical properties of the device to be tested when probed with an electrically conductive test wire or device (not shown). The arrangement illustrated by FIG. 10, i.e., the location of conductive traces 33 and 34, conductive area 54, Zener diode 44, and test point 15 prior to placing retention material 14 can correspond to any one of the previously described LED devices e.g., 10 and 50 or any of the devices described in FIGS. 11-14. For example, LED devices described in FIG. 11-14 can comprise at least one opening or hole, generally designated 20, that can be disposed through or at least partially through submount 12 for facilitating attachment of the LED devices to an external substrate or surface. In addition first symbol 22 and second symbols can be used to denote the portions of the LED devices comprising positive and negative electrode terminals. One or more test points 15 can be located adjacent either a positive or negative side of the device for testing the electrical and/or thermal properties of the LED devices.

Figure 11:
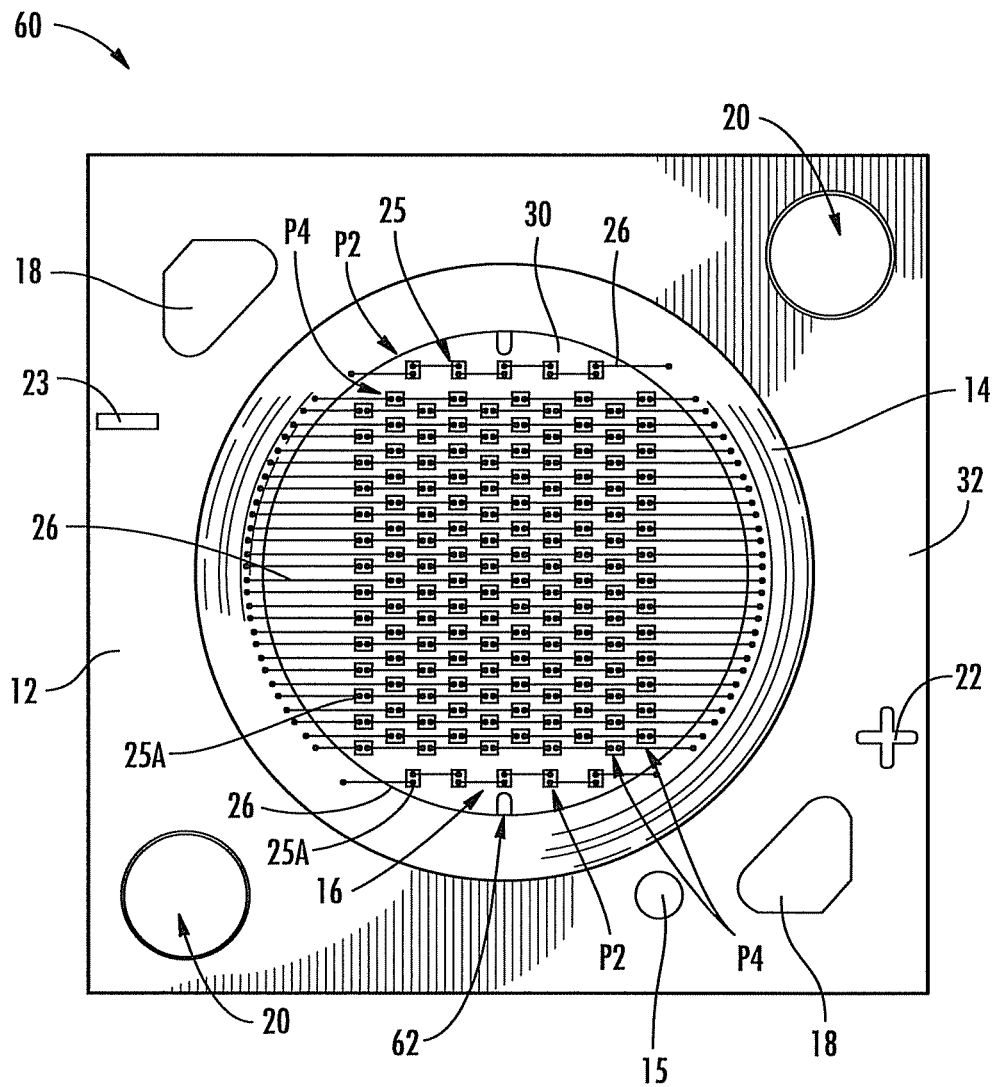
FIGS. 11 to 14B are top views of embodiments of a light emitting device having one or more patterns of LEDs according to the disclosure herein.

FIGS. 11 to 14 illustrate top views of different embodiments of LED devices. Such devices may be similar in many aspects to previously described LED devices 10 and 50, but can also be useful for a range of low and/or high voltage applications in addition to attaining different light output by pattern variation. For example, FIG. 11 illustrates one embodiment of an LED device, generally designated 60 which can be used in lower voltage applications. In one aspect and for example only without limitation, LED device 60 can be operable at approximately 16 V. In one aspect, LED device 60 can be operable at less than approximately 16 V, for example, 14 to 16 V. In one aspect, LED device 60 can be operable at more than approximately 16V, for example, 16 to 18 V. In one aspect, using more than 140 LEDs 25, e.g., more than LED device 10 and changing the pattern of LEDs 25 can allow LED device 60 to be operable at lower voltage applications. In one aspect, the pattern can be changed by electrically connecting less than 14 LEDs 25 together in a series or string.

FIG. 11 illustrates at least two sets of LEDs arranged in two patterns forming a reticulated array of LEDs 25 within emission area 16. For example, a first set of LEDs can comprise second pattern P2, previously described. A second set of LEDs can comprise a fourth pattern P4. Each pattern can comprise, for example, 30 strings of five LEDs 25 electrically connected in series. That is, fewer than 14 (FIGS. 3A, 3B) LEDs 25 can be electrically connected in series in a given string. The first and last strings of LEDs 25 can comprise five LEDs 25 electrically connected in series according to previously described second pattern P2. The second to twenty-ninth strings can comprise another pattern different from the first and thirtieth strings. For example, FIG. 11 illustrates five LEDs 25 electrically connected in series according to pattern P2, the strings can be disposed on conductive pad 30 proximate one or more rounded outer edges of emission area 16. LEDs 25 arranged in the first and thirtieth strings can, for example and without limitation, be spaced equidistant from each other and uniformly across emission area 16 according to pattern P2. LEDs 25 arranged in pattern P2 can comprise a straight line arrangement in which longer axes of LEDs 25 are substantially parallel. The shorter axes of LEDs 25 in pattern P2 can also be at least substantially parallel. Longer axes of LEDs 25 arranged in pattern P2 can be aligned perpendicular to wirebonds 26. In addition, longer axes of LEDs 25 arranged in pattern P2 can be perpendicular to longer axes of LEDs 25 arranged in adjacent patterns, e.g., pattern P4.

In one aspect, pattern P4 can comprise five LEDs 25 electrically connected in series across conductive pad 30. Pattern P4 can comprise a straight line of LEDs, and each of the five LEDs 25 can be positioned such that longer axes of LEDs 25 are substantially aligned along a straight line. In one aspect, longer axes of each LED 25 can be aligned in a same direction as the direction of wirebonds 26 connecting the LEDs 25 to conductive traces 33 and 34 disposed below retention material 14. Adjacent strings, e.g., adjacent strings in the second through twenty-ninth strings of LEDs 25 connected in pattern P4 can alternate above and below a straight line such that the LEDs 25 form a substantially checkerboard type arrangement. That is, a first string of LEDs 25 arranged in pattern P4 (i.e., the second overall string of LEDs 25 disposed below the first string comprising pattern P2) can comprise five LEDs 25 spaced equidistant apart, leaving a space in between adjacent LEDs 25. Alternatively, LEDs 25 in pattern P4 could be wirebonded in a checkerboard arrangement, but that could increase the voltage at which device 60 is operable. Below the first string of LEDs 25 arranged in pattern P4, a subsequent string of LEDs 25 arranged in pattern P4 can be positioned or placed such that the LEDs 25 are substantially within and/or slightly below the space between adjacent LEDs 25 of the preceding string. That is, LEDs 25 arranged in pattern P4 can comprise a first string aligned such that a bottom edge of each LED 25 in the string is aligned along a same first straight line. LEDs 25 in a neighboring subsequent string of pattern P4 can be aligned such that a top edge of each LED 25 is also aligned along the same first straight line as the bottom edge of LEDs 25 in the preceding string. Thus, LEDs 25 of preceding and subsequent strings alternate above and/or below spaces between adjacent LEDs 25 in a given string, and the top and bottom edges of LEDs 25 in adjacent strings can be aligned along a same line. This arrangement comprises a substantially checkerboard shaped orientation which can advantageously allow LEDs 25 to uniformly emit light from LED device 60 without one or more adjacent LEDs blocking light.

Additional strings of LEDs 25 arranged in pattern P4 can alternate according to the first two strings just described. Strings of LEDs 25 comprising pattern P4 can comprise a same or similar width over emission area 16. That is, each adjacent LED 25 of a given string can be spaced apart at equidistant lengths, but the overall string length may not be uniform across emission area 16. Rather, LEDs 25 can be spaced such that the second to twenty-ninth rows form a substantially reticulated array over emission area 16. In one aspect, LEDs 25 form a rectangular array over emission area 16 which utilizes a substantially uniform portion of horizontal segments, or chords of conductive pad 30. In one aspect, LED device 60 can comprise at least one group of LEDs 25 arranged in more than one string of LEDs, where the overall configuration can be in a predetermined geometrical shape, such as for example and without limitation, a rectangle. Any suitable number of LEDs 25 may be connected in series. Fewer number of LEDs 25, for example five LEDs 25 connected in series as illustrated in FIG. 11 can allow LED device 60 to be suitable for lower voltage applications, for example 16V applications. For illustration purposes, 30 strings of five LEDs 25 arranged in one or more patterns are illustrated for operation at lower voltages, however, any suitable number of strings and/or LEDs 25 electrically connected in series is contemplated.

LED device 60 can comprise outermost LEDs 25A electrically connected via electrical connectors such as wirebonds 26 to conductive traces 33, 34 (FIG. 10). Retention material 14 can then be dispensed at least partially about conductive pad 30 and at least partially over wirebonds 26. Retention material 14 can be dispensed about emission area 16 which can comprise a plurality of LED chips, or LEDs 25 disposed within and/or below filling material 40 such as illustrated in FIG. 7. Filling material 40 can be at least partially contained by retention material 14, and retention material can be used to control or adjust various heights of filling material as may be desirable. Notably, LED device 60 can comprise a uniform optical source in the form of single, cohesive, and undivided emission area which can simplify the manufacturing process for manufacturers of light products requiring a single component. LEDs 25 can be spaced a suitable distance apart such that device 60 can advantageously emit uniform light without having any light blocked by one or more adjacent LEDs 25. The patterns and pattern spacing (i.e., spacing between adjacent LEDs 25 and spacing between adjacent strings of LEDs 25) disclosed for example in LED devices 10 and 60 allow for optimization of light extraction by reducing the amount of light blocked by adjacent LEDs 25 and adjacent strings of LEDs 25. The pattern spacing disclosed for example in LED devices 10 and 60 can further be configured and expanded, for example, by increasing the spacing between adjacent LEDs 25 (e.g., to pattern spacing illustrated in FIGS. 12-14B) to maximum spacing within a given string and between one or more strings to further maximize and attain a higher efficiency and light extraction within a given LED device.

Figure 12:
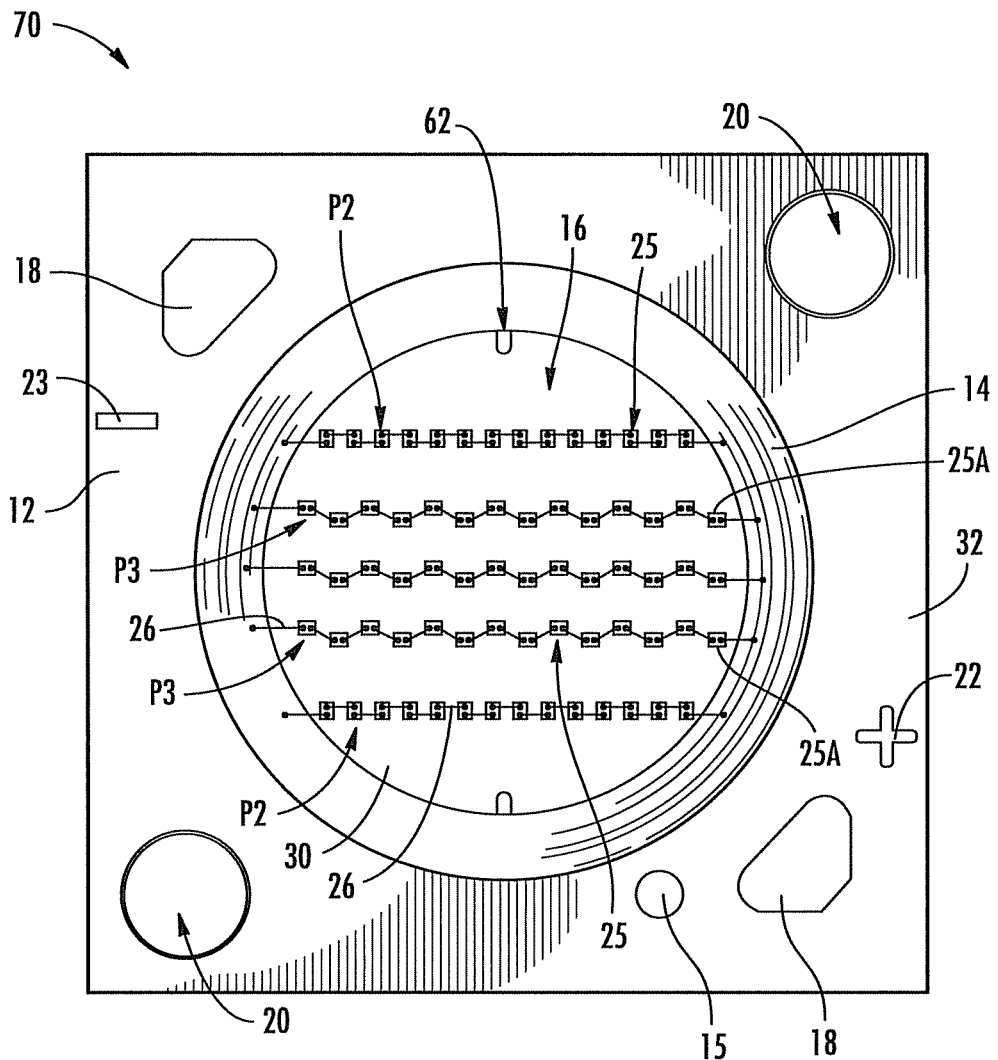

FIGS. 12 to 14B illustrate top views of LED devices which can be operable at higher voltages such as, for example only and not limited to approximately 42 V. In one aspect, LED devices illustrated by FIGS. 12 to 14B can comprise more than five LEDs 25 per string such that the device is configured to operate at greater than approximately 16 V. FIG. 12 illustrates an LED device generally designated 70 having, for example, five strings of 14 LEDs 25. LED device 70 can comprise strings of LEDs 25 arranged in one or more different patterns. For example, the first and last strings are disposed proximate rounded edges of conductive pad 30 and can comprise 14 LEDs 25 arranged in previously described pattern P2. The longitudinal axes of adjacent LEDs 25 in pattern P2 can be aligned such that they are at least substantially parallel. The longitudinal axes of adjacent LEDs 25 in pattern P2 can be at least substantially perpendicular to the direction of wirebonds 26 connecting adjacent LEDs 25. For each LED device described, any shape, orientation, or structure of LEDs is contemplated. In one aspect, LED device 70 can comprise 70 total LEDs 25.

Still referring to FIG. 12, strings of LEDs 25 disposed between outermost strings of second pattern P2 can comprise a different pattern, for example, third pattern P3 previously described in FIGS. 3A and 3B. Third pattern P3 can comprise a substantially checkerboard pattern or arrangement of LEDs 25 electrically connected in series. In one aspect, pattern P3 can be disposed between and/or alternate with strings of LEDs having second pattern P2. The checkerboard pattern or third pattern P3 can comprise a set of LEDs 25 alternating both above and below a horizontal line. LED device 70 can be disposed uniformly across emission area 16 and/or conductive pad 30, for example. In general, adjacent LEDs 25 in each of the strings of LED device 70 can be spaced at equidistant intervals to utilize a substantial portion of horizontal segments of conductive pad 30. That is, LEDs 25 in device 70 can occupy a greater amount of surface area and length of horizontal segments of conductive pad 30 than previously described LED device 60. For illustration purposes, five strings of 14 LEDs 25 arranged in two different patterns are illustrated, however, any suitable number of strings and/or LEDs 25 electrically connected in series is contemplated.

Figure 13A:
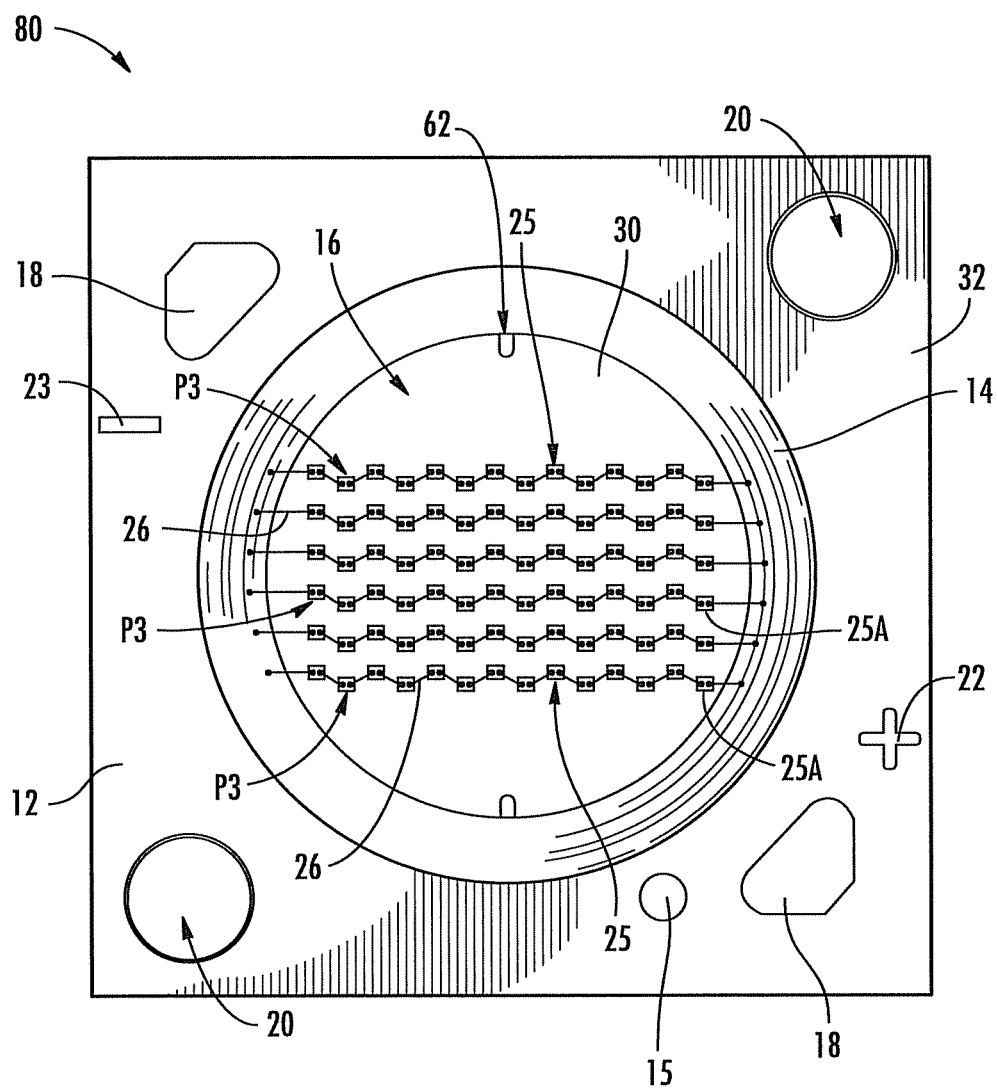
Figure 13B:
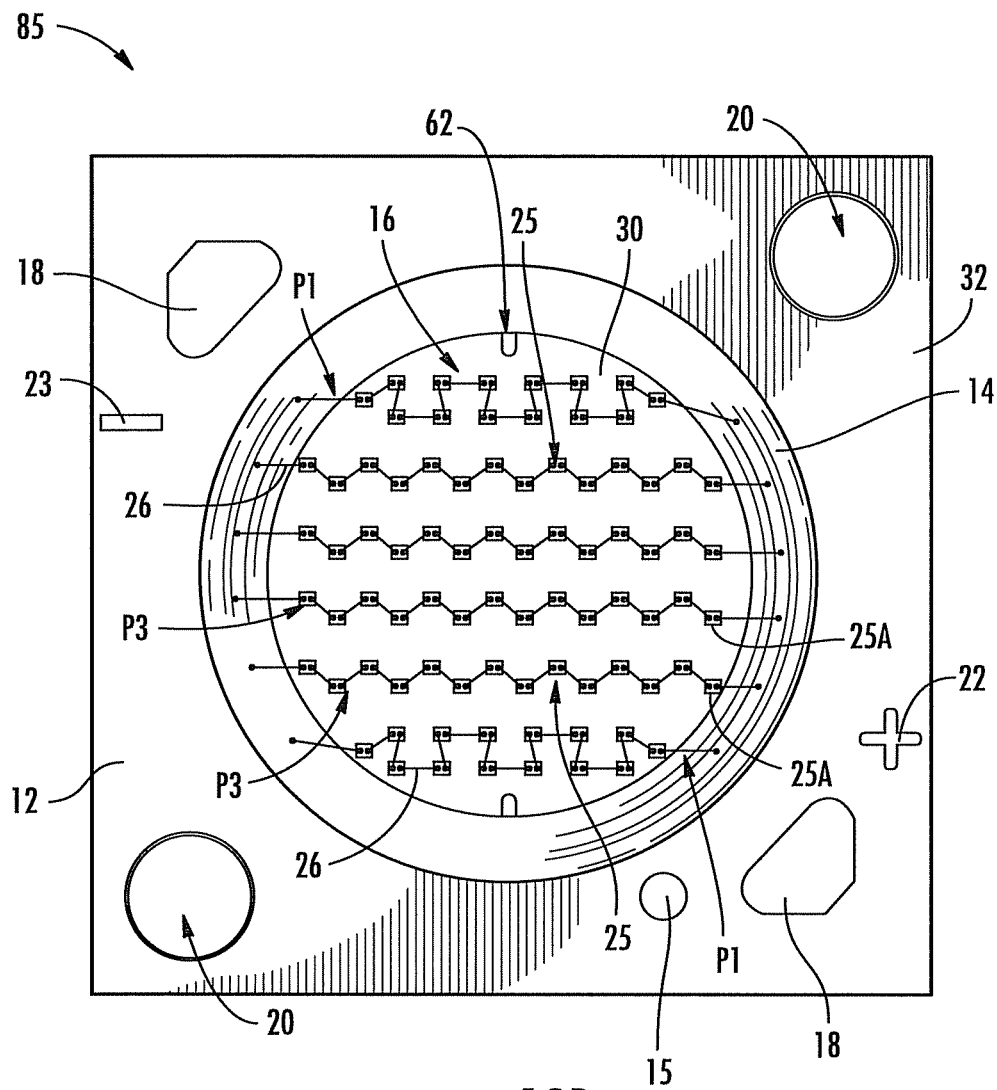

FIGS. 13A and 13B illustrate further embodiments of LED devices. In one aspect, LED devices in FIGS. 13A and 13B comprise six strings of 14 LEDs 25, for a total of 84 LEDs 25. Referring to FIG. 13A, LED device, generally designated 80 can comprise one or more strings of LEDs 25 arranged for example in a single pattern across conductive pad 30. The one or more strings of device 80 can have the same and/or different patterns. For illustration purposes, previously described pattern P3 is illustrated. LEDs 25 can be arranged in a checkerboard pattern alternating above and below a horizontal line. Adjacent LEDs 25 can be spaced a substantially uniform distance from each other across a large portion of the surface area of conductive pad 30. Checkerboard arrangements, e.g., pattern P3 can advantageously allow the LEDs 25 to uniformly emit light from LED device 80 without one or more adjacent LEDs 25 blocking light.

FIG. 13B illustrates another embodiment of a six string LED device, generally designated 85. Like LED device 80, LED device 85 can comprise six strings of 14 LEDs 25. Spacing between adjacent LEDs 25 within the same string and adjacent LEDs 25 within different strings has been maximized to minimize the amount of light absorbed by adjacent LEDs. In one aspect, LED device 85 comprises previously illustrated first pattern P1 (FIG. 3A) as the first and last strings. Notably, LEDs 25 of patterns P1 and P3 extend at least substantially the full length and width of conductive pad 30. The second through fifth strings of LEDs 25 within LED device 85 comprise pattern P3. When comparing the six string arrangement of FIG. 13A to the six string arrangement of FIG. 13B, it is apparent that the strings of FIG. 13B are more spread out, e.g., vertically and horizontally spaced further apart on conductive pad 30 to utilize more of the mounting area. Maximizing the space between strings of LEDs 25 can minimize the amount of light absorbed or blocked by neighboring LEDs 25.

In one aspect, inter-string spacing, that is, spacing between adjacent LEDs 25 of the same string has been increased by at least approximately 31%, or by 125 µm, or greater in the vertical direction for pattern P3 from LED device 80 to LED device 85. Similarly, inter-string spacing of LEDs 25 in pattern P1 has been increased and/or optimized in both the horizontal and vertical directions. For example, spacing has been increased approximately 41%, or by 225 µm, or greater, in the horizontal direction and by at least approximately 27%, or by 210 µm, or greater in the vertical direction from P1 in LED device 10 to P1 in LED device 85. Intra-string spacing i.e., spacing between LEDs 25 of adjacent strings can be increased by at least approximately 68%, or by 750 µm, or greater in LED device 85. Notably, although LED device 85 can comprise the same number of LEDs 25 as LED device 80, e.g., 84 LEDs, LED device 85 can comprise at least approximately a 1% to 3%, or greater, increase in efficiency and brightness when compared to LED device 80. In one aspect, increasing the spacing between adjacent LEDs 25 as described can increase the efficiency by at least approximately 2.5% or greater from one six string arrangement to another, e.g., LED device 85 can comprise a 2.5% or greater increase in efficiency over LED device 80. For example, LED device 85 can have a light output of at least approximately 2.5% or higher than the light output of LED device 80 described above, which can comprise approximately 1050 lumens or more at 11 watts, or approximately 2000 lumens or more at 27 watts.

Figure 14A:
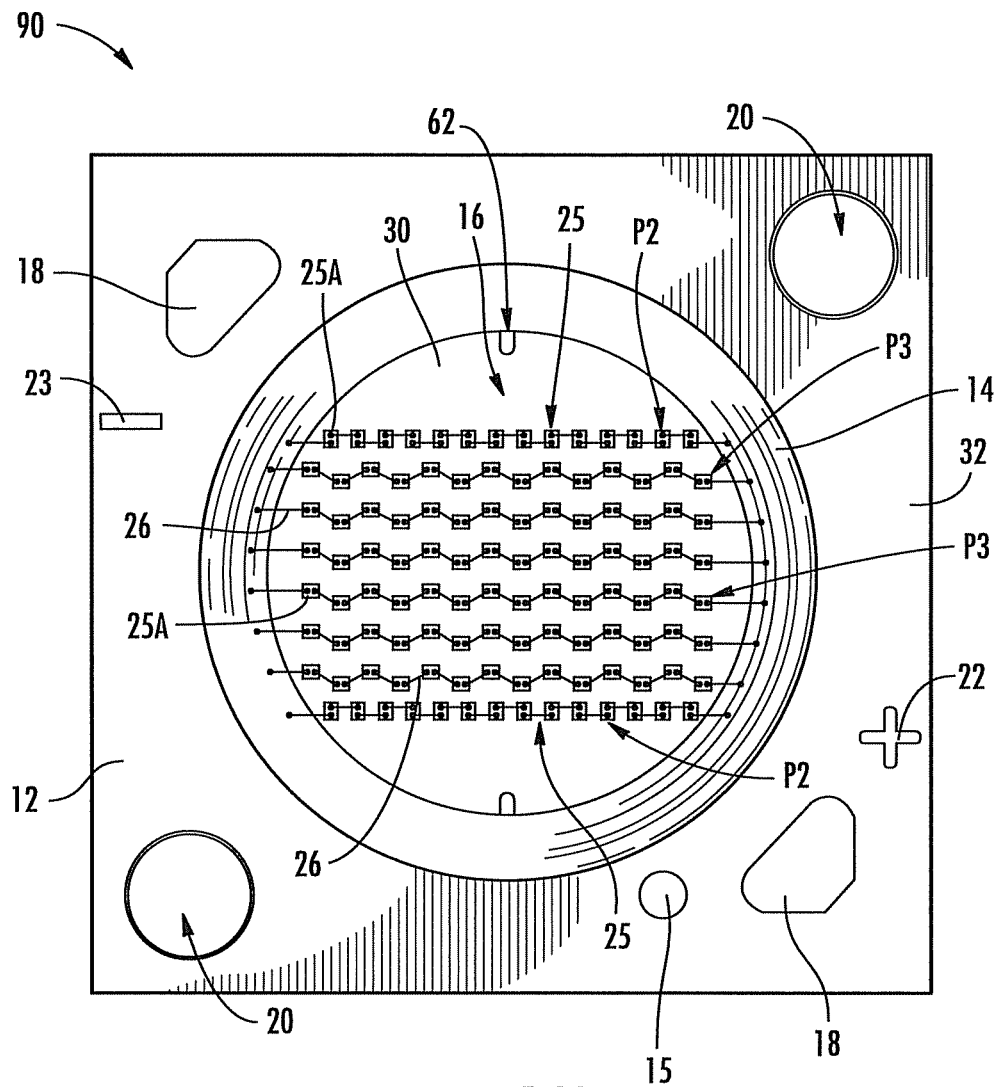
Figure 14B:
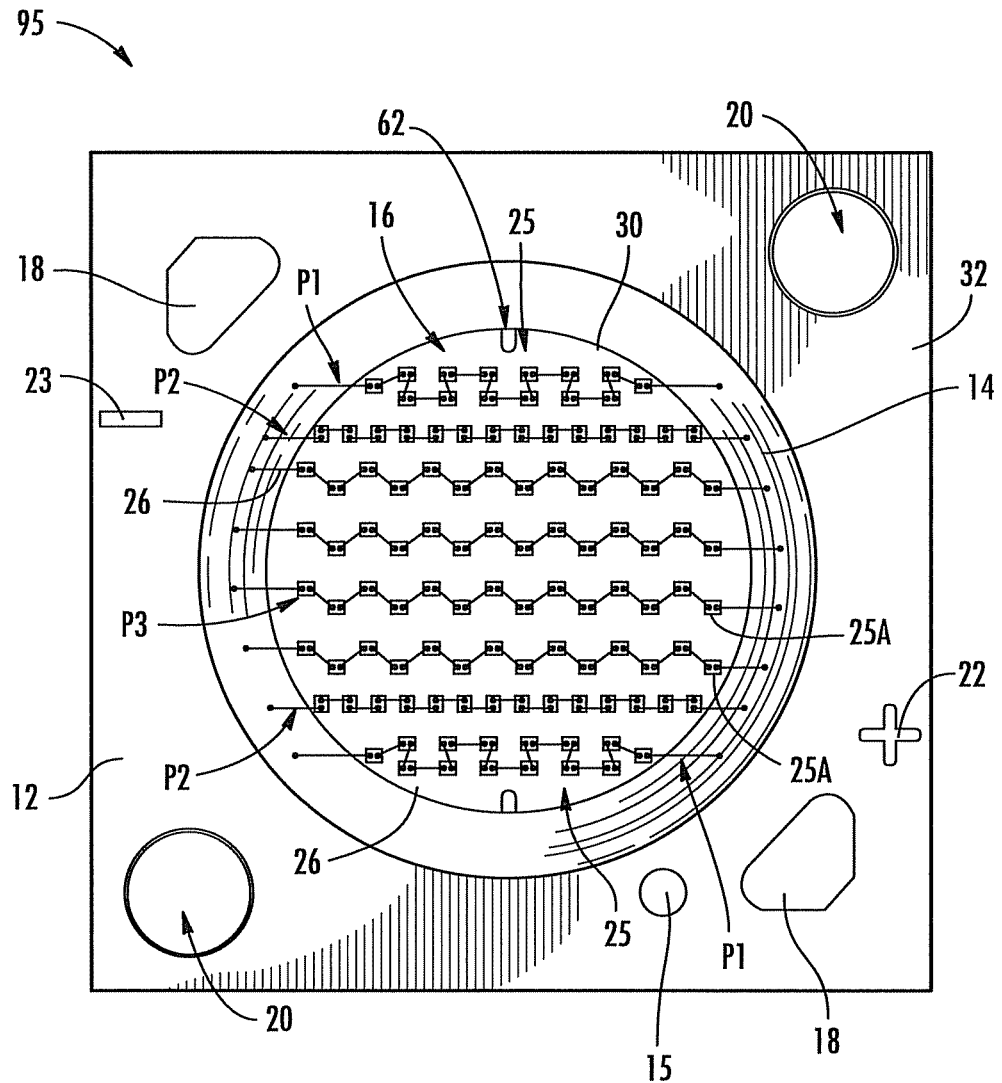

FIGS. 14A and 14B illustrate further embodiments of LED devices. In one aspect, the LED devices in FIGS. 14A and 14B comprise eight strings of 14 LEDs 25. Referring to FIG. 14A, an LED device generally designated 90 is illustrated, and can be operable at higher voltages, not limited to greater than or equal to approximately 42 V. LED device 90 can comprise one or more strings of LEDs 25 arranged in one or more patterns across emission area 16 and/or conductive pad 30. In one aspect, LED device 90 can comprise eight strings of LEDs 25 arranged in more than one pattern. Each string of LEDs 25 can comprise 14 LEDs 25, or 112 total LEDs. In one aspect, the first and last strings can comprise previously described pattern P2. The second through seventh strings of LEDs 25 can comprise previously described pattern P3. Notably, LED devices illustrated by FIGS. 11 to 14B can comprise a uniform optical source in the form of single, cohesive, and undivided emission area which can simplify the manufacturing process for manufacturers of light products requiring a single component.

FIG. 14B illustrates another embodiment of an eight string LED device, generally designated 95. Like LED device 90, LED device 95 can comprise eight strings of 14 LEDs 25. Spacing between adjacent LEDs 25 within the same string and adjacent LEDs 25 within different strings has been maximized to minimize the amount of light absorbed by adjacent LEDs. In one aspect, LED device 95 can comprise previously illustrated first pattern P1 (FIG. 3A) as the first and last strings. The second and seventh strings can comprise pattern P2, and the third through sixth strings can comprise pattern P3. Notably, LEDs 25 of patterns P1, P2, and P3 extend at least substantially the full length and width of conductive pad 30. LEDs 25 of P1, P2, and P3 can be spaced further apart horizontally and/or vertically such that an amount of light blocked by adjacent LEDs 25 can be decreased. In one aspect, pattern P1 spacing has been increased at least approximately 41%, or by 225 µm, or greater in the horizontal direction and by at least approximately 27%, or by 210 µm, or greater in the vertical direction from P1 in LED device 10 to P1 in LED device 95. Similarly, horizontal and/or vertical spacing between LEDs 25 in pattern P2 can be increased at least approximately 4% or greater over P2 in LED device 90. Intra-string spacing i.e., spacing between LEDs 25 of adjacent strings can be increased by at least approximately 68%, or by 750 µm, or greater in LED device 95. Notably, although LED device 95 can comprise the same number of LEDs 25 as LED device 90, e.g., 112 LEDs, LED device 95 can have at least an approximate 1% to 2%, or greater, increase in efficiency and brightness when compared to LED device 90.

In one aspect, LED devices 10, 50, 60, 70, 80, 85, 90 and 95 disclosed by FIGS. 3A, 3B, and 11 to 14B can comprise a large quantity of LEDs 25 arranged in one or more patterns over conductive pad 30. In one aspect, LED devices disclosed herein comprise a quantity of more than 64 LEDs 25. For example, in one aspect and without limitation, LED device 10 can comprise 140 total LEDs, or 10 strings of LEDs 25 electrically connected in series. LED device 60 can comprise 150 total LEDs, or 30 strings of five LEDs 25 electrically connected in series. LED device 70 can comprise 70 total LEDs, or five strings of 14 LEDs 25. LED device 80 can comprise 84 total LEDs, or six strings of 14 LEDs 25. LED device 90 can comprise 112 total LEDs, or eight strings of 14 LEDs 25. LEDs 25 used in LED devices described herein can comprise a small footprint, or surface area when compared to conductive pad 30. For example and without limitation, LEDs 25 can comprise chips of the following dimensions in Table 1 below:

TABLE 1

|  | Length (µm) | Width (µm) |
| --- | --- | --- |
| LED chip size | 350 | 470 |
|  | 230 | 660 |
|  | 500 | 500 |
|  | 520 | 700 |

In one aspect and without limitation, conductive pad 30 can comprise a radius of approximately 6.568 mm and an area of approximately 135.7 mm$^2$. Thus, the ratio of the area of a single LED chip 25 and the area of conductive pad 30 can comprise approximately 0.0027 or less. In one aspect, the ratio of the area of a single LED chip 25 and the area of conductive pad 30 can comprise approximately 0.0018 or less. In other aspects, the ratio can comprise approximately 0.0012 or less. Table 2 below lists various LED 25 chip sizes and the area of conductive pad 30. LEDs 25 can comprise chips that are small compared to the area of conductive pad, that is, approximately 0.0027 of the area of the conductive pad or less. Any chip size may be used however.

TABLE 2

| Chip Size (μm) | Conductive Pad Area (mm) | Ratio of Chip Area to Conductive Pad Area |
| --- | --- | --- |
| 350 × 470 | 135.7098 | 0.0012 |
| 230 × 660 | 135.7098 | 0.0011 |
| 500 × 500 | 135.7098 | 0.0018 |
| 520 × 700 | 135.7098 | 0.0027 |

Using a large quantity of LEDs 25 comprising a smaller footprint over a single emission area can advantageously allow for more uniform light output in addition to desirable optical properties such as high brightness as the LEDs 25 can be arranged into one or more uniform patterns over a portion of emission area 16. The concentrated patterns of LEDs 25 can allow for concentrated light emission. In one aspect, the density or spacing of LEDs 25 in the one or more patterns described herein can be adjusted such that light will not be absorbed or blocked by adjacent LEDs 25. That is, patterns and arrangements of LEDs 25 disclosed herein may improve light extraction by minimizing the amount of light absorbed by adjacent or neighboring LEDs 25. The number of LEDs 25 per string can allow LED devices to be operable at low to high voltages. For illustration purposes, four patterns have been illustrated. However, any suitable pattern of LEDs 25 is contemplated. Each string of LEDs 25 can comprise a single pattern or a combination of more than one pattern.

Figure 15A:
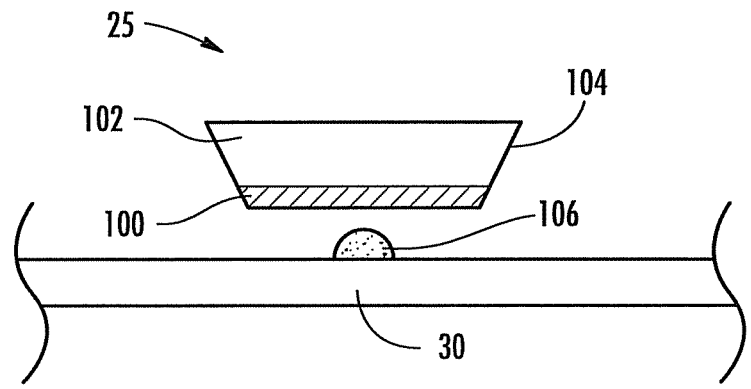
FIGS. 15A and 15B are views of die attach techniques used for LED devices according to the disclosure herein.
Figure 15B:
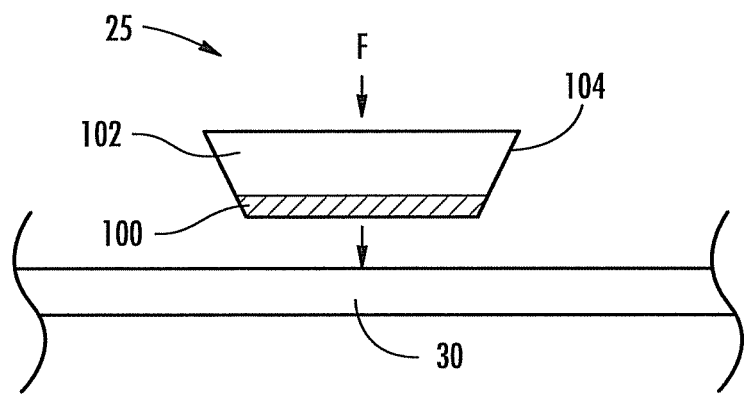

FIGS. 15A and 15B illustrate methods of die attach that can, for example and without limitation, be used for LED devices according to the disclosure herein. LED 25 can comprise a backside metal pad or bonding layer 100 for mounting over conductive pad 30. Bonding layer 100 can comprise a length of the entire bottom surface LED 25 or a portion thereof. For illustration purposes, bonding layer 100 is illustrated as having a same length as the entire bottom surface of LED 25, however, any configuration is contemplated. LED 25 can comprise lateral sides 104 which can extend between an upper surface and the bottom surface of LED 25. FIGS. 15A and 15B illustrate inclined lateral sides 104, however, lateral sides 104 can be substantially vertical or straight where a straight-cut LED is selected. FIGS. 15A and 15B illustrate LEDs 25 having an upper surface of a greater surface area than an area of bottom surface comprising bonding layer 100. However, upper surface can be of a smaller surface area than the surface area of bonding surface. LEDs 25 can comprise a square, rectangle, or any suitable shape in addition to having any suitable lateral side configuration.

Any suitable die attach method can be used to mount LED 25 over conductive pad 30 in any of the LED devices previously described. In one aspect, any suitable optimized die attach method and/or materials can be used. For example, optimized die attach methods can comprise metal-to-metal die attach methods for facilitating attachment of one or more metals on and/or between LED 25 and conductive pad 30. FIG. 15A illustrates an example of a metal-to-metal die attach method which can be eutectic or non-eutectic. This metal-to-metal die attach method can comprise using an assist material 106 to facilitate the metal-to-metal die attach. In one aspect, a flux-assisted eutectic metal-to-metal die attach method can be used and in other aspects a metal-assisted non-eutectic metal-to-metal die attach method can be used. In a flux-assisted eutectic, or flux eutectic, die attach method, bonding layer 100 can comprise a metal alloy having a eutectic temperature, for example, but not limited to, an alloy of gold (Au) and tin (Sn). For example, bonding layer 100 can comprise an 80/20 Au/Sn alloy having a eutectic temperature of approximately 280° C. In the flux eutectic technique, assist material 106 can comprise a flux material. In the non-eutectic technique, assist material 106 can comprise a metallic material. The assist material 106 can comprise a conduit for facilitating the metal-to-metal die attach between the bonding layer 100 and conductive pad 30 when the bonding layer 100 is heated above the eutectic temperature. The metal of bonding layer 100 can flow into and attach to the metal of conductive pad 30. The metal of bonding layer 100 or can atomically diffuse and bond with atoms of the underlying mounting conductive pad 30. In one aspect, flux used in a flux-assisted eutectic method can comprise a composition, for example, 55-65% rosin and 25-35% polyglycol ether in addition to small amounts of other components. Any suitable flux material can be used however.

Flux-assisted eutectic die attach methods can be tedious, and it is unexpected to use such methods when attaching a large quantity of LEDs 25 in predetermined arrangements and/or an array. Flux eutectic die attach according to the present subject matter can comprise dispensing flux assist material 106, that can be liquid at room temperature, in an amount to be precisely the right volume to avoid either swimming of the LEDs 25 or poor die attach if too much or too little flux is used. Flux-assisted eutectic die attach according to the present subject matter can also require the right composition for each of the flux assist material 106 and bonding metal 100 of the emitter chips. Flux-assisted eutectic die attach according to the present subject matter can optimally utilize a very clean and flat surface and substrates or submounts that do not move or bend during heating and cooling such to stress the solder joint. Flux-assisted eutectic according to the present subject matter can utilize a fine surface roughness that is small enough not to encumber the Au/Sn bonding surface of the emitter chips while being rough enough to allow flux to escape during heating. The heating profile can be matched perfectly to the bonding metal 100, such as Au or AuSn, to ensure a good weld between the bonding metal 100 and underlying conductive pad 30. Using flux-assisted eutectic for die attach according to the present subject matter also can utilize an inert atmosphere, such as a nitrogen atmosphere, to reduce oxygen gas ($O_2$) levels and also allow gravity to apply a downward force on LEDs 25. This can reduce the amount of oxidation at the metal-to-metal bond between bonding layer 100 and underlying conductive pad 30.

Still referring to FIG. 15A, a non-eutectic metal-to-metal die attach method can be used which can also comprise an assist material 106, wherein the assist material 106 can comprise a metallic material. In this aspect, bonding layer 100 can comprise a single metal or a metal alloy. For example, bonding layer 100 can comprise Au, Sn, or AuSn. In non-eutectic methods, the bonding layer does not need to reach or exceed a temperature, for example, a eutectic temperature. In this aspect, assist material 106 can comprise a metallic material to facilitate the metal-to-metal bonding. For example, assist material 106 can comprise AuSn paste or Ag epoxy. Any suitable metallic assist material 106 can be used. The metal of bonding layer 100 can attach to the metal of the assist material 106. The metal of the assist material 106 can also attach to the metal of conductive pad 30. In one aspect, a metal "sandwich" forms between bonding layer 100, assist material 106, and conductive pad 30 in non-eutectic metal-to-metal attach techniques where a metallic assist material 106 is used. Metal-assisted, non-eutectic die attach can be tedious, just as flux-assisted methods, and it is also unexpected to use such methods when attaching LEDs 25 within one or more patterns for LED devices described herein. Metal-to-metal attachment using an assist material 106 can be hard to control and tedious when attaching multiple small footprint LEDs within a device.

FIG. 15B illustrates a metal-to-metal die attach technique which does not require an assist material 106. One such method can comprise a thermal compression die attach method wherein the metal of bonding layer 100 will directly attach to the metal of conductive pad 30. The thermal compression method can be eutectic or non-eutectic. In one aspect, thermal compression can be used when bonding layer 100 comprises an alloy having a eutectic temperature. In other aspects, bonding layer 100 can comprise a metal not having a eutectic temperature. Conductive pad 30 can comprise any suitable metal, not limited to a Cu, Al, Ag, or Pt layer within a metal core printed circuit board (MCPCB). Bonding layer 100 comprises any suitable metal. In one aspect, bonding layer 100 can comprise a layer of Sn having any suitable thickness. In one aspect, bonding layer 100 can comprise a thickness greater than approximately 0 µm. In one aspect, bonding layer 100 can comprise a bonding layer equal to or greater than at least approximately 0.5 µm. In one aspect, bonding layer 100 can comprise a layer of Sn having a thickness of at least equal to or greater than approximately 2.0 µm. Unlike the flux-assisted eutectic or metal-assisted non-eutectic methods just described, thermal compression metal-to-metal die attach techniques can utilize an external downward force F as illustrated in FIG. 15B.

Force F can comprise a compression delivered in a heated environment, thus deemed a thermal compression, as opposed to dispensing a flux or metallic assist material 106. The thermal compression technique is an alternative die attach method developed to reduce metal squeeze out along the conductive pad 30 which can form Shottky or shunt defects and allow subsequent leakage of current and other various and related problems. In one aspect, the bonding temperature in thermal compression techniques can be approximately 255-265° C. after optionally subjecting conductive pad 30 to a pre-heat treatment or process. Conductive pad 30 can be heated to a mounting temperature of at least 20° C. above the melting temperature of the bonding layer 100. The bonding time can be approximately 300 msec and the bonding force can be approximately 50+/−10 grams (g). Predetermined settings can be important for this method, such as adequate preheat, bonding temperature, bonding time, and bonding force. The equipment and predetermined settings for use with thermal compression methods can be difficult to use and/or maintain, and it is unexpected to use such methods when attaching a large quantity of LEDs 25 in an array and/or one or more patterns. Metal-to-metal methods for attaching an array of LEDs in LED devices is not known and is unexpected to use flux-assisted eutectic, metal-assisted non-eutectic, or thermal compression die attach techniques for attaching one or more strings of LEDs 25 in an array or pattern arrangement.

Figure 16:
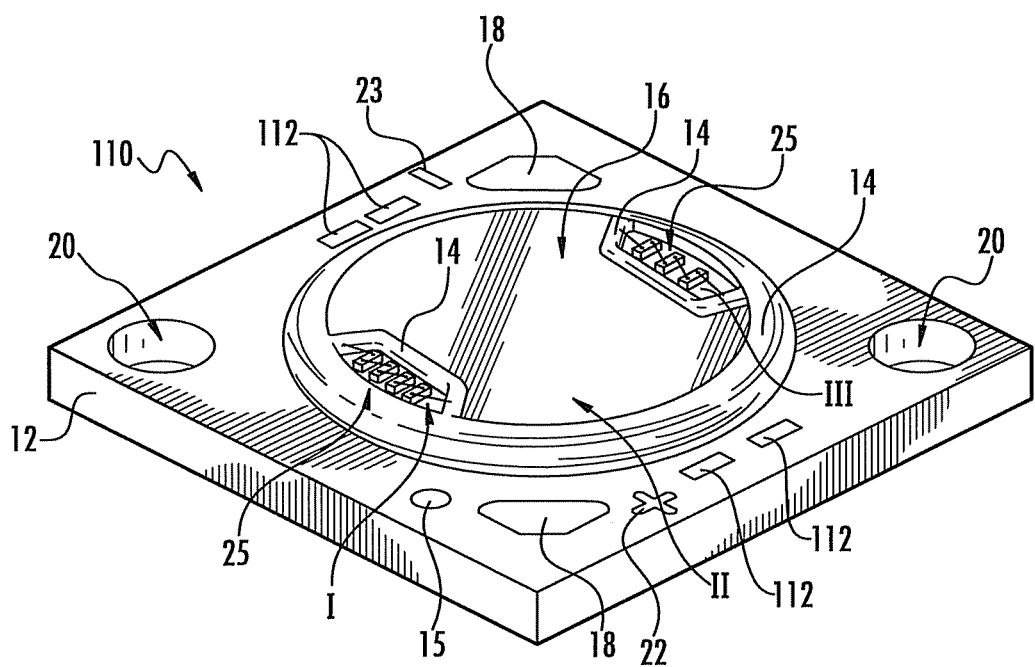
FIGS. 16 to 17B are top perspective views of embodiments of light emitting devices where one or more sections of LEDs are configured according to the disclosure herein.

FIG. 16 is a top perspective view of a light emitting or LED device, generally designated 110. LED device 110 can be similar in form and function to any of the previously described devices herein (e.g., devices 10, 50, 60, 70, 80, 85, 90, and 95) but may also advantageously comprise a high voltage device operable at voltages greater than approximately 40 V, for example, ranging from approximately 40 V to greater than approximately 200 V and/or greater than approximately peak-AC voltage. As used herein, the term 'high voltage device' refers to devices operable at greater than approximately 40 V. Notably, device 110 can comprise a high voltage device for use in a large number of lighting applications. Such a device can advantageously consume less power and experience better current spreading within the device than other, lower voltage devices. In one aspect, device 110 can comprise a high voltage device operable at any sub-range between approximately 40 and 300 V, for example, voltages of approximately equal to or greater than 50 V, approximately equal to or greater than 100 V, approximately equal to or greater than 200 V, and approximately equal to or greater than a peak-AC voltage. Other preferable sub-ranges at which device 110 may be operable include, for example, approximately 40 to 60 V; 60 to 80 V; 80 to 100 V; 100 to 120 V; 120 to 150 V; and 150 to 200 V.

Figure 18:
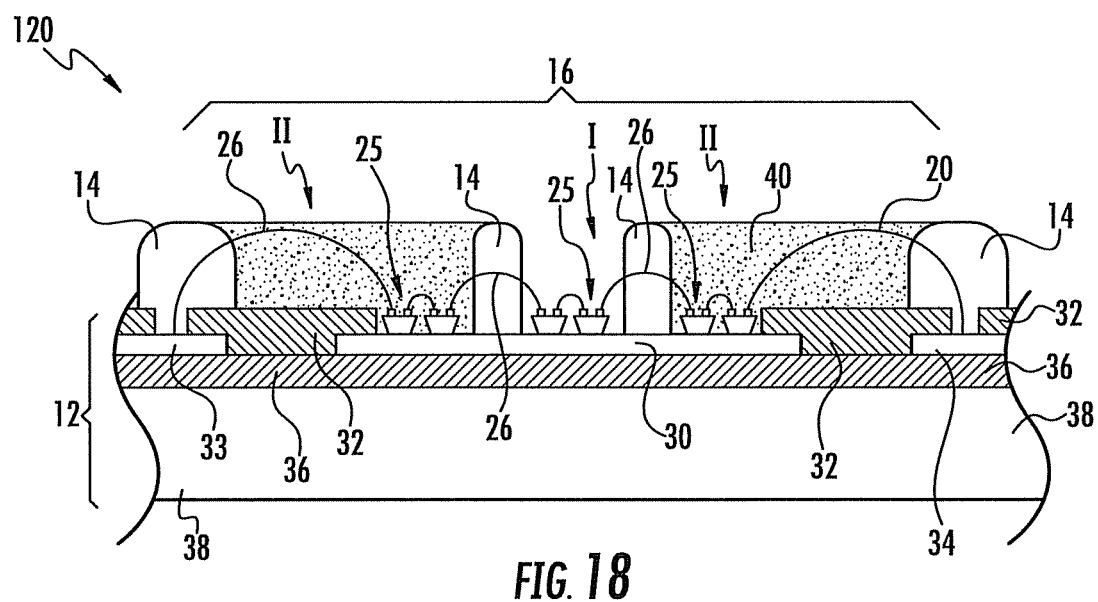
FIG. 18 is a cross-sectional view of a light emission area of an LED device according to the embodiment disclosed in FIG. 17A.

LED device 110 can comprise similar features (i.e., same element number) of previously described devices, for example, a submount 12 over which an emission area, generally designated 16, can be disposed. Emission area 16 can comprise one or more LEDs 25 optionally disposed under filling material 40. In one aspect, emission area 16 can comprise a substantially circular shaped area supported and enclosed by retention material 14, and can comprise one or more physically divided sections having LED chips 25 positioned therein. Emission area 16 can also comprise any desirable shape that is non-circular, for example, a substantially square, rectangle, and oval shape, or any regular, irregular, and/or asymmetrical shape. The overall shape of emission area 16 can be sub-divided into one or more areas or sections of LEDs. LEDs 25 within each section can comprise the same and/or different colors or color points. For example, in one embodiment device 110 comprises three sections generally designated I, II, and III. LEDs within each section may be physically separated from each of the other sections by portions of white and/or transparent retention dam or retention material 14 placed therebetween. Emission area 16 can comprise a single, undivided conductive pad 30 (FIG. 7) over which one or more LEDs 25 can be mounted. LEDs 25 can be electrically conducted in series and/or parallel and in any number or pattern as previously described. The one or more LEDs 25 can become grouped and/or divided into one or more sections by dispensing, or otherwise placing, retention material 14 over conductive pad 30 and optionally filling the one or more sections with filling material 40 (FIG. 18). In one aspect, more than two sections, such as sections I, II, and III may be electrically and/or thermally separated or isolated in addition to being physically separated, for example, by establishing or sub-dividing conductive pad 30 into one or more electrically and/or thermally separated sections. However, to promote ease of manufacture, a single undivided conductive pad 30 may be preferable, as one or more sections of emission area 16 (e.g., sections I, II, and III) can easily become physically separated by dispensing retention material 14 over one or more sections of emission area 16. The one or more sections can optionally be filled with filling material 40.

In one aspect, first section I can comprise a first group of LEDs 25 that are physically separated from sections II and III via retention material 14 positioned therebetween. The LEDs 25 in each of sections I, II, and III can comprise any suitable size or dimension (e.g., as previously mentioned and described above), shape (e.g., square, rectangular, etc.), build (e.g., horizontal or vertical "flip chip" device), and color. Sections I, II, and III may contain LEDs 25 of the same and/or different colors. For example and in one aspect, each of sections I, II, and III can contain LEDs 25 that are all the same color (e.g., principally blue, red, green, cyan, yellow, amber, etc.). In another aspect, each of sections I, II, and III can comprise different colored LEDs 25 (e.g., section I can comprise LEDs of a first color, section II can comprise LEDs of a second color, and section III can comprise LEDs of a third color). In another aspect, device 110 can comprise one or more sections of a first color and one or more sections of a second color (e.g., sections I and III can comprise LEDs of a first color and section II can comprise LEDs of a second color).

For example, in one aspect section II can comprise BSY devices, for example, a combination of a blue excitation LEDs 25 and phosphor (e.g., disposed in filling 40). In one aspect, BSY devices can comprise LEDs 25 which emit light having dominant wavelengths ranging from approximately 430 to 480 nm (i.e., principally blue light), and can be disposed within, below and/or be at least partially covered by phosphors configured to emit light having dominant wavelength in the range of approximately 555 to 585 nm. The combination of light emitted by the principally blue LEDs 25 and phosphors collectively produces a mixture of light having x, y color coordinates within a BSY area on a 1931 CRI Chromaticity Diagram (not shown) and can be referred to as BSY LEDs 25. Such non-white light may, when combined with light having a dominant wavelength of approximately 600 to 630 nm (i.e., principally red LEDs) can be used to produce warm white light, for example, as described in U.S. Pat. No. 7,821,194, the disclosure of which is incorporated herein by reference. That is, in one aspect the BSY LEDs 25 can be disposed in one of sections I, II, and/or III and can be combined with red LEDs 25 disposed in other sections I, II, and/or III. In one aspect, sections I and/or III can comprise principally red LEDs 25 and section II can comprise primarily BSY LEDs 25 (i.e., principally blue LEDs disposed below filling material 40). However, any color combination of LEDs 25 within one or more sections I, II, and III is hereby contemplated. For example, principally blue LEDs 25 may be disposed below a red phosphor, or any other combinations of LED colors and/or phosphors can be used. Thus, LED devices described herein an advantageously achieve any desirable color point (e.g., warm white, cool white, etc.) useful for a variety of lighting applications.

LED device 110 can comprise a single emission area 16 (e.g., a single, substantially circular shaped emission area as shown) or more than one emission area 16. Notably, LED device 110 can comprise a uniform optical source (e.g., emission area 16) which can be easily manufactured via dispensing retention material 14 about an LED mounting surface (e.g., conductive pad 30, FIG. 18). Further, one or more sections of emission area 16 (e.g., sections I, II, and III) can easily be formed via dispensing retention material 14 therebetween. Thus, devices herein can notably allow for a simplified manufacturing process for manufacturers of light products requiring a single component, while accommodating a variety of lighting applications by providing devices with different color points which can be created in part by one or more sections.

In one embodiment, device 110 can comprise several LEDs 25 electrically connected in series for providing high voltage devices suitable for any number of general lighting applications and operable at any of the previously mentioned ranges or sub-ranges of voltages. For example, device 110 may comprise a high voltage device operable at any sub-range between approximately 40 and 300 V, for example, operable at voltages of approximately equal to or greater than 50 V, approximately equal to or greater than 100 V, approximately equal to or greater than 200 V, and approximately equal to or greater than a peak-AC voltage. In one aspect, sections I and III comprise seven principally red LEDs 25 electrically connected to each other in series thereby forming red strings of LEDs 25. In one aspect, the LED strings of sections I and III strings can be electrically connected in series with the principally BSY LEDs in section II. In other aspects, the LED strings of sections I and III may be electrically connected in parallel with the blue LEDs 25 of section II. For example, section II may comprise approximately 74 LEDs 25 electrically connected in series thereby providing for a BSY string. The BSY string may be either electrically connected in parallel or electrically connected in series with the principally red strings of sections I and III. Where LEDs 25 of sections I, II, and III are electrically connected in series, wirebonds 26 between LEDs 25 in each section can extend through the retention material 14 which divides each section to electrically connect LEDs of more than one section. In one aspect, the LEDs 25 of sections I, II, and III may be connected to a single external constant current power source, where current is supplied to LEDs 25 within each section I, II, and III via previously described attachment surfaces 18. In other aspects, LEDs 25 of sections I and III may receive electrical current from an external source via attachment surfaces 18, while LEDs 25 of section II receive electrical current from an external source via attachment surfaces 112, disposed adjacent section II. In one aspect, a control circuit (e.g., FIG. 22) can bypass, shunt, or short electrical current to one or more of the blue or red LEDs within each string to provide color tuning and/or color point control for the entire series.

Attachment surfaces 18 and 112 can comprise any suitable configuration, size, shape and/or location. Attachment surfaces 18 and 112 can comprise one or more pair of surfaces, where each pair comprises a first surface corresponding to positive electrode terminal and a second surface corresponding to a negative electrode terminal through which an electrical current or signal can pass when connected to an external power source. One or more electrically conductive wires (not shown) can be attached and electrically connected to attachment surfaces 18 when welded, soldered, crimped, or attached using a solder free gas-tight connector (e.g., an insulation displacement connector IDC, clamp, crimp, or any solder free connector) or any other suitable attachment method known in the art. Electrical current or signal can pass into LED device 110 from the external wires (not shown) configured for electrical connection to the attachment surfaces 18 and/or 112 and then into the emission area 16 to facilitate light output. Attachment surfaces 18 and 112 can electrically communicate with first and second conductive traces 33 and 34 (see FIG. 18) and therefore LEDs 25 which may be electrically connected to traces 33 and 34 via electrical connectors. Electrical connectors can comprise wirebonds 26 (FIG. 18) or other suitable members for electrically connecting LEDs 25 to conductive traces 33 and 34.

As previously discussed, submount 12 of device 110 can comprise any suitable mounting submount or substrate, for example, a printed circuit board (PCB), a metal core printed circuit board (MCPCB), an external circuit, or any other suitable submount or substrate over which lighting devices such as LEDs may mount and/or attach. Emission area 16 can be in electrical and/or thermal communication with submount 12.

As noted earlier, emission area 16 can further comprise filling material 40 (FIGS. 7, 18). As previously described, filling material 40 can comprise an encapsulant having a predetermined, or selective, amount of phosphors and/or lumiphors in an amount suitable for any desired light emission, for example, suitable for white light conversion or emission of any other color point as desired. In one aspect, filling material 40 can interact with light emitted from the plurality of LEDs 25 such that a perceived white light, or any suitable and/or desirable wavelength of light, can be observed. Any suitable combination of encapsulant and/or phosphors can be used, and combinations of different phosphors for resulting in desired light emission can be used. In one aspect, filling material 40 can comprise an encapsulant with phosphor which interacts with primarily blue LEDs 25 (e.g., BSY LEDs) to produce light of a desired chromaticity, color temperature, color rending index, or other optical characteristic. After placement of retention material 14, filling material 40 can be selectively filled to any suitable level within the space disposed between one or more inner walls of retention material 14. For example, filling material 40 can be filled to a level equal to the height of retention material 14 or to any level above or below retention material 14. The level of filling material 40 can be planar or curved in any suitable manner, such as concave or convex.

Still referring to FIG. 16, LED device 110 can also comprise at least one opening or hole, generally designated 20, that can be disposed through or at least partially through submount 12 for facilitating attachment of LED device 110 to an external substrate or surface. For example, one or more screws can be inserted through the at least one hole 20 for securing device 110 to another member, structure, or substrate. LED device 110 can further comprise an indicator sign or symbol for denoting the electrical polarity for a given side of LED device 10. For example, a first symbol 22 can comprise a "+" sign denoting the side of LED device 110 comprising the positive electrode terminal. A second symbol 23 can comprise a "−" sign denoting the side of LED device 110 comprising the negative electrode terminal. One or more test point 15 can be located adjacent either a positive or negative side of the device for testing the electrical and/or thermal properties of the LED device 110. In one aspect, test point 15 can be disposed adjacent the negative side, or terminal of LED device 110.

Figure 17A:
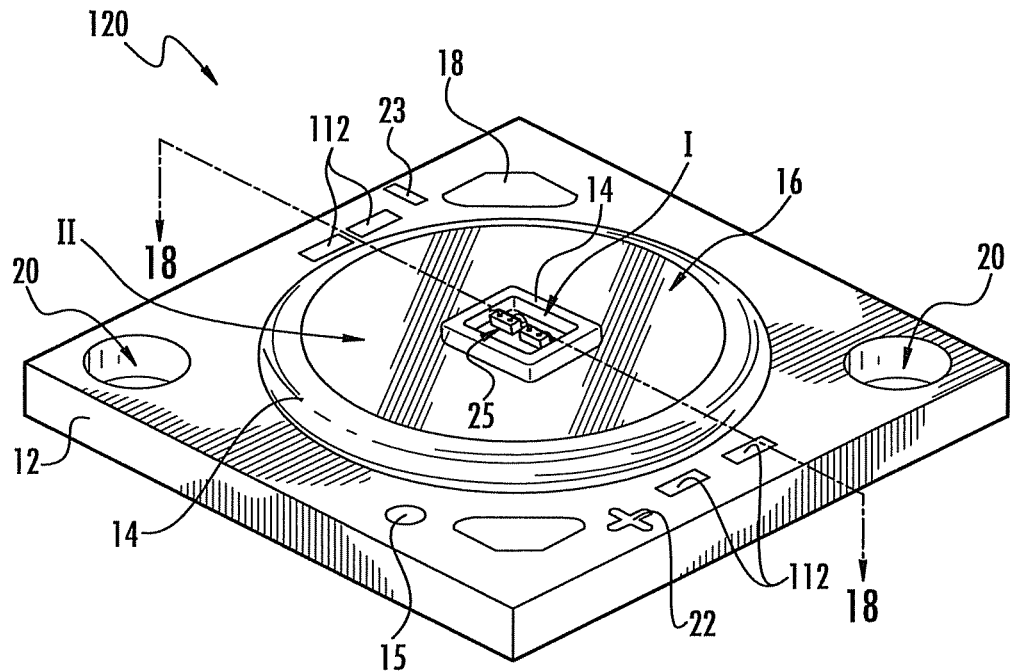
Figure 17B:
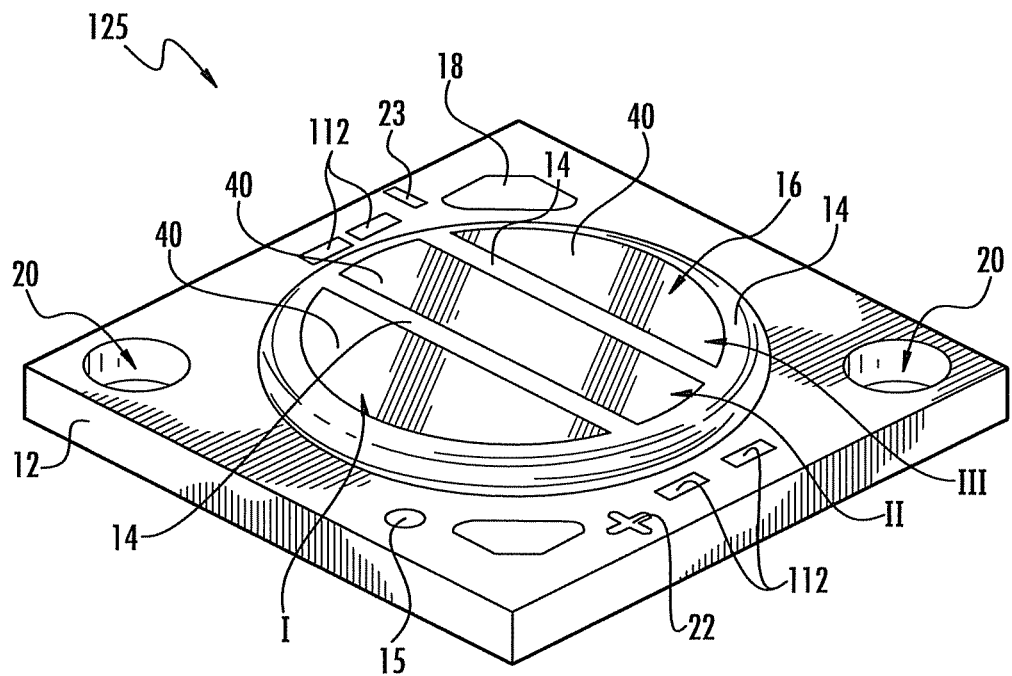

FIGS. 17A and 17B illustrate further embodiments of high voltage LED devices. FIG. 17A illustrates a high voltage device, generally designated 120, which can be similar in form and function to any of the previously described devices, such as device 110 but with two sections. In one aspect, device 120 comprises a submount 12, emission area 16 disposed over the submount, and retention material 14 at least partially disposed about emission area 16. Emission area 16 can comprise one or more LEDs 25 serially connected for providing a high voltage LED device, operable at voltages greater than 40 V as described above. LEDs 25 can be disposed under previously described filling material 40 and electrically connected in one or more patterns thereby forming an array as previously described. Notably, emission area 16 can comprise more than one physically divided sections or areas of LEDs that can optionally be covered by filling material 40. LEDs 25 of each section can, for example, comprise different color points, for example, a first section I can comprise a group of one or more LEDs 25 of a first color point and second section II can comprise a group of one or more LEDs 25 (disposed below filling material 40) of a second color point. LEDs 25 of sections I and II may be electrically connected together in series to produce a high voltage array of LEDs, such that adjacent or neighboring LEDs 25 within the same series or string can comprise different colors. For example, section I can comprise primarily BSY LEDs 25 electrically connected in series with LEDs of section II which can comprise primarily red LEDs 25. For illustration purposes, devices have been shown that have more than one section of LEDs (e.g., device 120) or two or more sections of LEDs (e.g., device 110). However, devices with any number of physically divided or separated sections are contemplated herein. As previously noted, each section may be electrically and/or thermally separated in addition to being physically divided.

FIG. 17B illustrates a high voltage LED device, generally designated 125. Just as shown and described in FIGS. 16 and 17A, device 125 can comprise a submount having at least one light emission area disposed over the submount and a retention material at least partially disposed within the light emission area such that the retention material physically separates a first section of the light emission area from a second section of the light emission area. LED device 125 is similar to previously described devices 110 and 120 disclosed in FIGS. 16 and 17A, however, device 125 comprises one or more physically divided sections which have one or more combinations of differently colored LEDs and/or filling materials adapted to emit light of different colors. For example, first section I can comprise LEDs (disposed under filling 40) of a first color and a first filling material 40 comprising phosphors adapted to emit light of a first color when activated by light emitted from the LEDs. For example, section I can comprise BSY LEDs (e.g., principally blue LEDs and principally yellow phosphor) Second section II can comprise LEDs (disposed under filling 40) of a second color and a second filling material 40 comprising phosphors adapted to emit light from a second color (i.e., different than the first color) when activated by light emitted from the LEDs. Third section III can comprise LEDs (disposed under filling 40) of a third color and a third filling material 40 comprising phosphors adapted to emit light of a third color (i.e., different than the first and second colors) when activated by light emitted from the LEDs. In the alternative, sections I, II, and/or III can comprise LEDs and/or filling materials 40 adapted to emit light of the same color and/or less than three different colors, for example, two colors. That is, sections I and III (or I and II or II and III) could comprise LEDs of a first color and filling material 40 adapted to emit light of a first color and the remaining section could comprise LEDs of a second color and filling material 40 adapted to emit light of a second color when activated by light from the LEDs. In one aspect, sections I, II, and III can comprise LEDs of a same first color and filling material 40 comprising phosphors adapted to emit light of different first, second, and third colors (e.g., each section I, II, and III could comprise principally blue LEDs where section I comprises principally yellow phosphor, section II comprises principally red phosphor, and section III comprises principally green phosphor). In further aspects, sections I, II, and III can comprise LEDs of three different colors and filling material of the same first color (e.g., sections I, II, and III comprise LEDs that are red, blue, and green, respectively, and each section comprises principally yellow phosphor). For illustration purposes three sections are illustrated, however, two and/or more than three different sections are also contemplated herein.

Retention material 14 physically separates sections I, II, and III. Sections I, II, and III can also be electrically and/or thermally separated as well. LEDs (disposed under filling material 40) of sections I, II, and III can comprise combinations of solid state emitters having one or more different colors, for example and not limited to blue, cyan, green, yellow, red, orange, and/or any suitable color and wavelength range. LEDs (disposed under filling material 40) of section I can be serially connected to LEDs of sections II and III. In the alternative, LEDs of section I can comprise one or more strings electrically connected in parallel to one or more strings of sections II and/or III. Any combination of series and parallel arrangements is contemplated.

Filling material 40 can comprise one or more phosphors arranged to absorb at least some of the LED emissions and responsively emit light of a different wavelength. LED emissions can be fully absorbed or only partially absorbed such that emissions from the resulting device include a combination of light from the LEDs and from the one or more phosphors. Phosphors adapted to emit yellow, green, red, and/or red/orange light can be used in devices described herein. The combinations of LEDs and phosphors can be adapted for white light conversion, that is, to produce what is perceived as white light.

Figure 27A:
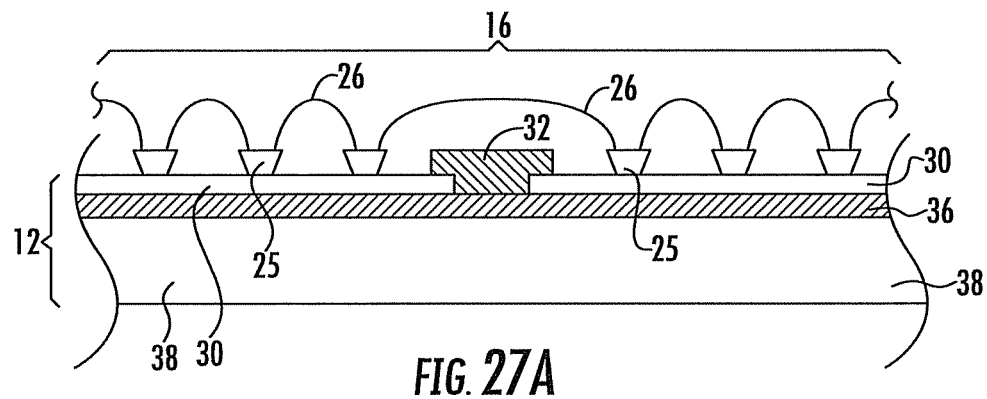
FIG. 27A is a cross-sectional view of a light emission area of a LED device according to the disclosure herein.

FIG. 18 illustrates a cross-sectional view of device 120 along the line 18-18 in FIG. 17A. As FIG. 18 illustrates, LEDs 25 of section I can be electrically connected in series with LEDs 25 of section II. LEDs of section I can comprise a first color point electrically connected in series with LEDs of section II. That is, different colored LEDs 25 can be electrically connected together in series and driven by the same constant current electrical source (not shown). In one aspect, wirebonds 26 electrically connecting LEDs 25 in series can extend through retention material 14 that physically divides each section to electrically connect neighboring LEDs 25 in series. As illustrated, first section I comprises two LEDs 25 that are not disposed under and/or contained within filling material 40. The wirebonds 26 connecting LEDs 25 of section I can be seen extending through a portion of retention material 14 prior to connecting to neighboring LEDs in section II. In one aspect, LEDs 25 of section I can comprise primarily red LEDs 25. In further aspects, LEDs 25 of section H can comprise primarily BSY LEDs 25, or primarily blue LEDs 25 disposed under filling material 40 to excite phosphors disposed in filling material 40 during illumination. As FIG. 18 illustrates, LEDs 25 within sections I and II can be mounted over a single, uniform conductive pad 30. In other aspects, LEDs 25 of the same and/or different sections can be mounted over a conductive pad 30 that has one more electrically separated portions and/or over one or more adjacent conductive pads 30 (FIG. 27A). As differently colored LEDs 25 can be electrically connected in series, the series may require different temperature compensation and/or other compensation to maintain a desired color point. For example, a control circuit (FIG. 24) may be used to adjust current to one or more LEDs 25 via one or more bypass or shunt circuits as described further below.

As FIG. 18 illustrates, submount 12 can comprise a core layer 38, dielectric layer 36, and conductive components as previously described. For illustration purposes, submount 12 can comprise a MCPCB, for example, those available and manufactured by The Bergquist Company of Chanhassan, Minn. Any suitable submount 12 can be used, however. Core layer 38 can comprise a conductive metal layer, for example Cu or Al. Dielectric layer 36 can comprise an electrically insulating but thermally conductive material to assist with heat dissipation through submount 12. Conductive components can comprise at least one conductive pad 30 disposed between conductive traces 33 and 34. Conductive components can comprise a layer of electrically and thermally conductive Cu that can be approximately 0.5 to 6 ounces (oz.) thick (i.e., approximately 17.5 to 210 µm. Any sub-range of thicknesses for Cu components is also contemplated, for example, 17.5 to 35 µm; 35 to 70 µm; 70 to 105 µm; 105 to 140 µm; 140 to 175 µm; and 175-210 µm.

Figure 19:
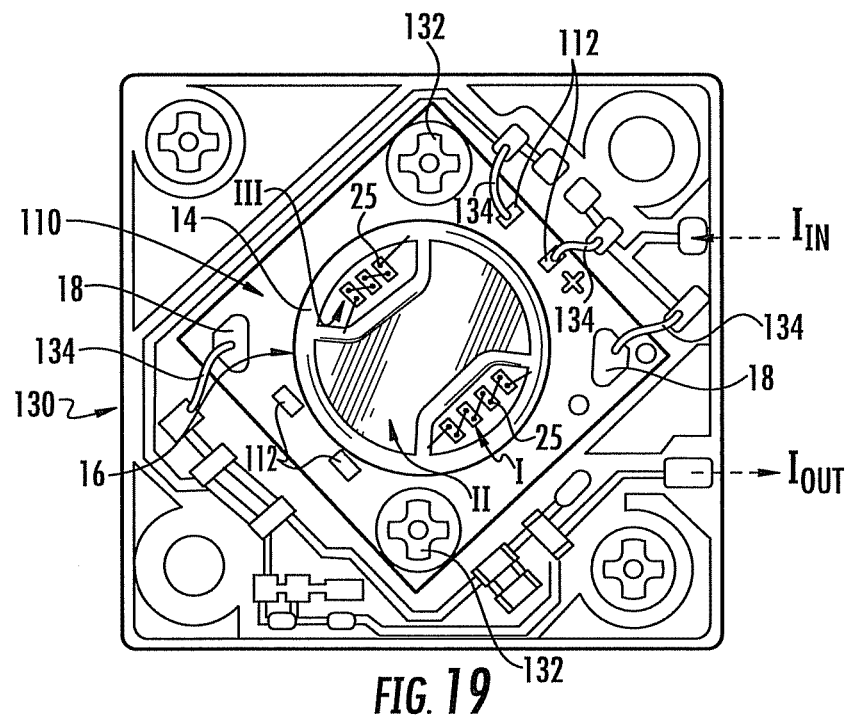
FIG. 19 is a top plan view of an LED device mounted over a driving circuit for driving the LED device according to the disclosure herein.

FIG. 19 illustrates an example of LED device 110 disposed over and mounted to an external driving circuit, generally designated 130. Electrical current $I_{in}$ and $I_{out}$ can flow into and out of driving circuit 130 from an external power source or circuit (not shown) as illustrated by the arrows. LED device 110 can be fixedly mounted to driving circuit via fixation members 132, such as screws, clips, or bolts. Fixation members 132 can fixedly hold LED device 110 to driving circuit 130. LED device 110 can be electrically coupled to driving circuit 130 by electrical wires 134 via soldering, crimping, clamping, or otherwise connecting to attachment surfaces 18 and/or 112. In one aspect, electrical wires 134 can electrically connect with attachment surfaces 18 for supplying electrical current to LEDs 25 disposed in sections I and III (e.g., as described with respect to FIG. 8, see broken lines 52). In one aspect, electrical wires 134 can electrically connect with attachment surfaces 112 for supplying electrical current to LEDs 25 disposed in section II. That is, sections I and III can comprise first and second strings of LEDs 25 configured to receive electrical current via attachment surfaces 18 and section II can comprise a third string configured to receive electrical current via attachment surfaces 112. Attachment surfaces 112 can comprise a pair of surfaces having opposing electrical polarity for electrically communicating electrical signal to traces 33 and 34 as previously described attachment surfaces 18. In another aspect, each section I, II, and III can be electrically connected in series thereby forming a single string of LEDs 25 configured to receive electrical current via attachment surfaces 18 only, via a single constant current power source.

Figure 20:
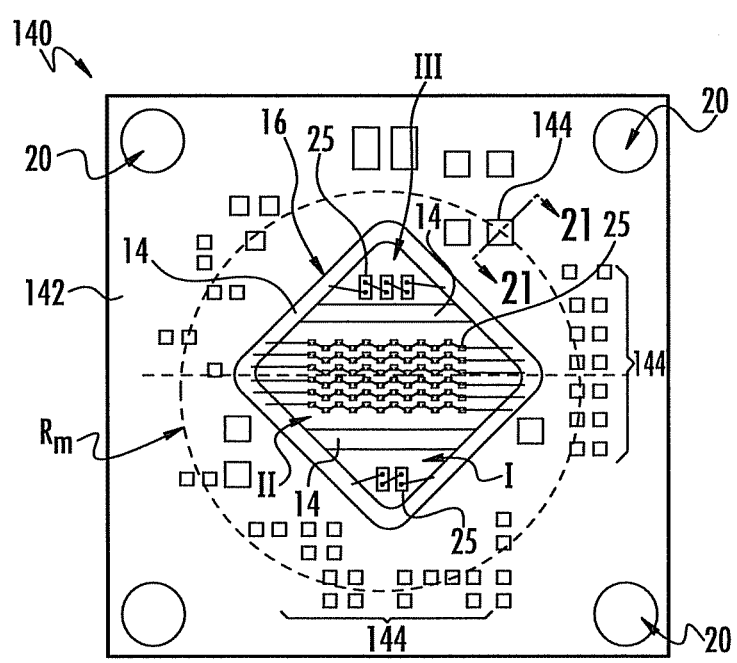
FIG. 20 is a top plan view of an LED device integrated with an LED driver according to the disclosure herein.

FIG. 20 illustrates an embodiment of an LED device, generally designated 140. LED device 140 can comprise an LED device with electrical driver components incorporated onto the same substrate or submount. That is, LED device 140 can be configured to exhibit characteristics of device 110 and driving circuit 130 on a single device or single submount. For example, LED device 140 can comprise a submount 142 over which an emission area 16 and one or more power driving elements 144 can be disposed. Power driving elements 144 can supply electrical current to LEDs 25 disposed in emission area 16 via conductive traces (FIG. 8). Power driving elements 144 can electrically communicate with traces 33 and 34 via electrical traces disposed externally upon submount 142, internally exposed within submount 142 and/or combinations of both. Emission area 16 can comprise one or more sections I, II, and III of LEDs 25 optionally disposed under filling material 40 (not shown, see FIG. 18). Sections I, II, and III can be physically and/or electrically separated and each section can comprise LEDs 25 of substantially the same and/or different color points. Retention material 14 can be disposed about emission area 16 and can physically divide sections I, II, and III. In one aspect, retention material can be dispensed in any dimension larger and/or smaller than the submount 142 mounting area comprised of LEDs 25. For example, the broken line $R_M$ indicates another possible location of retention material 14. One or more openings or holes, generally designated 20 can be disposed in substrate 142 for attaching device 140 with driving elements 144 into a lighting fixture and/or component.

Figure 21:
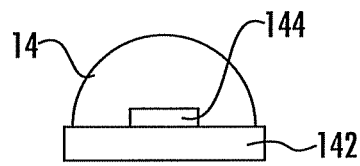
FIG. 21 is a cross-sectional view of retention material covering a driving element of an LED device according to the disclosure herein.

FIG. 21 illustrates retention material 14 dispensed as indicated by the broken line $R_M$ of FIG. 20. As FIG. 21 illustrates, one or more of the power driving elements 144 can be disposed below retention material 14. Power driving elements 144 can comprise a dark color which can block, absorb, and/or interfere with light emitted from device 140. As such, retention material can advantageously be disposed over one or more elements 144 preventing them from blocking and/or interfering with light emission. Power driving elements 144 can comprise any suitable electrical component for use in an electrical circuit, for example, resistors, capacitors, inductors, transistors, diodes, and/or other components or bare-die chips. In one aspect and as further described below, power driving elements 144 can comprise portions of a control circuit (e.g., FIGS. 22-24) disposed on the same submount 142 as emission area 16 for electrically communicating and controlling current supplied to one or more LEDs 25 disposed within emission area 16.

In one aspect, sections I, II, and III can comprise a combination of BSY LEDs 25 and red LEDs 25 serially connected in the same string and/or different strings. Where connected in different strings, principally red and blue LEDs 25 can be electrically connected in parallel. Other colors (e.g., principally green, yellow, amber and/or orange) LEDs 25 can also be electrically connected within the same string as other colors, such as principally red and/or blue LEDs 25. Combinations of differently colored LEDs 25 (e.g., principally red and blue LEDs 25) can be electrically connected in combinations of series and parallel arrangements. That is, principally red emitting LEDs 25 can be intermixed with principally blue emitting LEDs 25 in a single string and/or different strings electrically connected in parallel. In one aspect, principally red LEDs 25 can be disposed around the edges (e.g., the outermost LEDs 25) of one or more sections I, II, and III of device 140 and principally blue LEDs 25 can be disposed in the center of one or more sections I, II, and III of device 140. In one aspect, principally red LEDs 25 can be disposed in sections I and III without filling material 40 (FIG. 18) and principally blue LEDs 25 can be disposed in section II and disposed under filling material 40 (FIG. 18) thereby collectively forming what is known as blue shifted yellow (BSY) LEDs 25.

In further aspects, principally red LEDs 25 can be in the center of one or more sections I, II, and III of device 140 and principally blue LEDs 25 can be disposed about the edges (e.g., outermost LEDs 25) of one or more sections I, II, and III of device 140. In still further aspects, principally red LEDs 25 can be disposed in any of sections I, II, and III below filling material 40 (see FIG. 18) allowing phosphor to diffuse red light thereby increasing color uniformity. In other aspects, principally red LEDs 25 can be disposed in sections which are not covered by filling material 40 (as shown). Sections I, II, and III can comprise a single string of LEDs 25 electrically connected in series (e.g., FIG. 18) where wirebonds 26 can extend from one section to another section through retention material 14 or each section I, II, and III can comprise a single string of LEDs 25 electrically connected in series where each string (e.g., a first string in section I, a second string in section II, and a third string in section III) is electrically connected in parallel. Optionally, each of sections I, II, and/or III can optionally comprise more than one string of LEDs 25 as shown (e.g., section II comprising six strings of LEDs 25).

The devices disclosed in FIGS. 1 through 21 have been described to provide context for further embodiments of the subject matter which are described hereinafter, for example, such lighting devices can incorporate one or more control circuits as further described.

As described earlier, when principally red LEDs are used in combination with high-power principally blue LEDs (e.g., as embodied in BSY components) it can be challenging to maintain aggregated emissions of such combination at a constant color point and/or shift aggregated emissions within a color point regime, for example, under dimming control. Heat emanating from the blue LEDs may increase the temperature of the red LEDs which can cause red LEDs to lose a significant portion (e.g., 40-50%) of their efficacy. Thus, electrical current to the red LEDs may need to be altered as temperature increases. To simplify driver design and improve efficiency, it is useful to implement a single current source for driving series-connected LEDs. A single current source for powering red and blue LEDs together may present a color control problem as every emitter in the string typically receives the same amount of current. If either the current or the temperature of the LEDs changes, the color may change as well. As such, and as described further below, a control circuit can be preferably arranged to control the electrical current and maintain the aggregate output emissions of multiple LEDs at a substantially constant color or color temperature over a range of temperatures or in response to various control inputs. In other aspects, it may be desirable to shift aggregate output emissions of multiple LEDs within a specific color regime, for example, for providing dimming compensation in response to various control inputs. As described below, the various control inputs can comprise at least one of a temperature control input, a current control input, a light control input, or a user adjustment control input.

In one embodiment, such a control circuit may optionally receive input from a sensing element (e.g., configured to sense temperature, current, light, and/or a user adjustment) and make current adjustments within the device via one or more controllable bypass circuits or shunt arrangements. Bypass circuits or shunt arrangements may pull current away from one or more LEDs to reduce light output therefrom and supply the current to one or more second LEDs to thereby increase the amount of current received by the second LED(s). That is, bypass circuits or shunts can reduce current to one or more LEDs of a device while increasing current to one or more other LEDs within the same device. Thus, the control circuitry may provide self-contained, color tuned LED devices.

In some embodiments, the control circuit can be configured to conform the color temperature to the Planckian locus. For example, the control circuit can be configured to conform the color temperature to within at least a seven or ten step MacAdam ellipse of the Planckian locus. In further embodiments, the control circuit can be configured to cause a color temperature produced by the plurality of LEDs to vary in response to the total current over a range from approximately 6500 K to about 1500 K while maintaining a color rendering index (CRI) greater than approximately 80%. In additional embodiments, the control circuit can be configured to can be configured to preferentially decrease a current through at least one principally BSY LED in comparison to a current through at least one principally red LED that is serially connected to the BSY light emitting device. As described further below, the control circuit can be configured to vary a color temperature produced by the string responsive to a variation in a total current passing between first and second terminals.

Figure 22A:
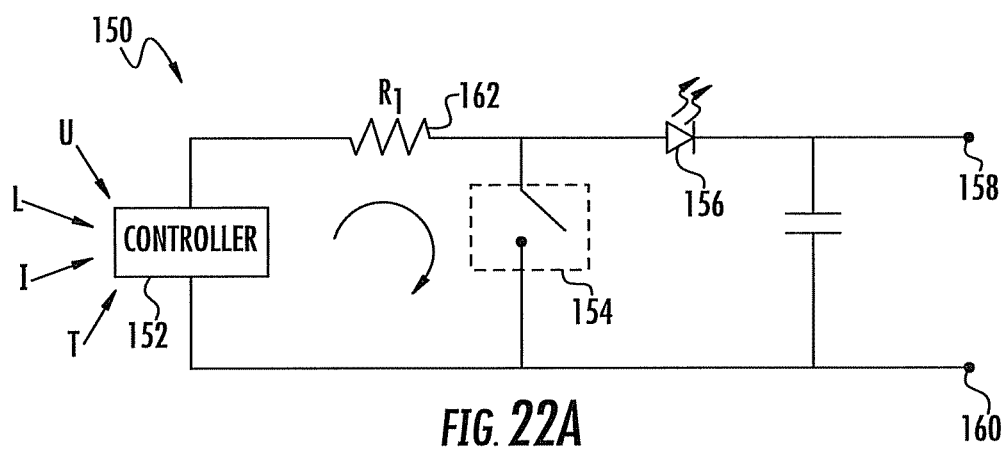
FIG. 22A is a schematic circuit diagram illustrating a control circuit for an LED device according to the disclosure herein.

FIG. 22A is a circuit diagram for one embodiment of a control circuit, generally designated 150. Control circuit 150 can be configured to bypass and/or shift current about one or more LEDs to shift output color or color temperature to provide a so-called dimming compensation utility. Control circuit 150 can also be configured to bypass current about one or more LEDs to maintain aggregate color temperature of the lighting device where temperature increases affect color of one or more other LEDs. Current bypass elements and shunt elements are described, for example, in U.S. Patent Application Publication Nos. 2011/0068702 and/or 2011/0068696, the publications of which are hereby incorporated by reference in their entireties herein. For example, in one aspect a dimming compensation can comprise maintenance of substantially the same (e.g., incandescent-like) color or color temperature whenever control input (e.g., current (I), temperature (T), light (L), and/or a user adjustment control input (U) to the lighting device or LED chips) is below a predetermined non-zero threshold. In other embodiments, dimming compensation can comprise intentionally varying color or color temperature within a shifted regime (e.g., incandescent-like) with respect to variation in control input current so long as such input remains below the predetermined threshold value.

Control circuit 150 can comprise a controller 152 that can control a switch 154 in response to a variety of control inputs (e.g., U, L, I, T). Control input U corresponds to a user adjustment control input that may be provided during a calibration procedure. Control input L corresponds to a light output of LED 156 or some other source. That is, where one or more LEDs increases or decreases in light output or efficiency, current can be bypassed about the one or more LEDs in a string of LEDs. Control inputs I and T correspond to current and temperature, respectively, of the LED 156 and/or a string of LEDs. Control circuit 150 can be used to achieve a desired color point and/or maintain that color point over variations in U, L, I and/or T. In one aspect, controller 152 comprises a pulse width modulation (PWM) controller configured to selectively bypass and/or shift current around LED 156 for providing color control to maintain color point and/or to shift color point within a shifted regime in response to variations in U, L, I, and/or T. Controller 152 can comprise a microprocessor, microcontroller, and/or other processor for receiving signals representative of changes in under input U, light L, current I, and/or temperature T, and responsively generate a PWM signal for driving switch 154. Controller 152 can also comprise a memory element for responsively generating the PWM signal for driving switch 154.

Still referring to FIG. 22A, a constant current can be provided between electrical terminals, for example, first and second terminals 158 and 160. In one aspect, first terminal 158 can comprise a cathode and second terminal 160 can comprise an anode. Each LED 156 can be individually tuned for lumen output by selecting the value of a resistor 162 based upon the characteristics of individual LEDs in the lighting device. For illustration purposes, one LED 156 is shown, however, multiple LEDs serially connected in one or more strings is contemplated herein. Thus, the overall current supplied to LED 156 can be set by resistor 162. Current supplied to LED 156 can be responsively bypassed and/or shifted per controller 152 opening and/or closing switch 154. When closed, current will flow through switch 154 and bypass LED 156 as indicated by the clockwise arrow. That is, when control inputs U, L, I, and/or T vary or fall below a given threshold, controller 152 can bypass current via switch 154 to maintain and/or shift color point within an LED device (e.g., any of previously described devices) as desired. For illustration purposes, bypassing or shunting one LED 156 is disclosed, however, optimized shunting of more than one LED (e.g., quantities of LEDs) is also contemplated for tuning purposes (see FIG. 28).

In further aspects, control circuit 150 can comprise a trimmable resistor network (e.g., resistor 162). After initial testing of LED 156 to determine spectral output of the LED as a function of temperature, resistor 162 can be tuned, preferably by trimming (e.g., laser trimming) to tune the control circuit 150 for desired response characteristics. Such testing and trimming can be repeated (i.e., to verify that the control circuit 150 has been tuned properly) to achieve the desired response. In other aspects, LED characteristics can be adjusted via removal of elements, such as by trace cutting, designing in LED shunts and/or removing shunts later as needed.

Figure 22B:
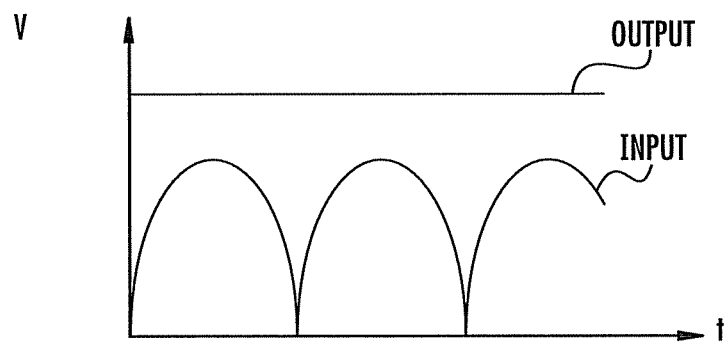
FIG. 22B is a graph of voltage versus time for the control circuit disclosed in FIG. 22A.

FIG. 22B is a graphical illustration of electrical properties of control circuit 150. As input (e.g., U, L, I, and/or T) vary, control circuit 150 can utilize switch 154 to maintain output voltage within a given LED device. For example, switching can boost voltage within device, which can maintain voltage in response to variations in control inputs U, L, I, and/or T.

Figure 23:
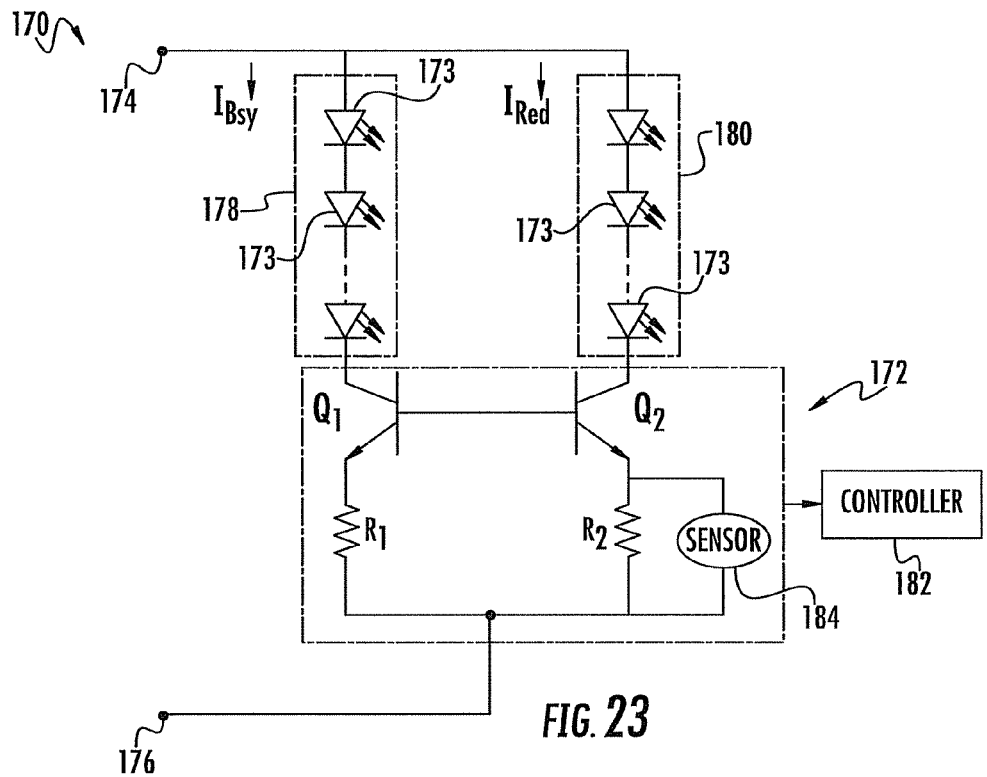
FIGS. 23 to 26D are schematic diagrams illustrating electrical interconnection of LEDs and control circuits in an LED device according to the disclosure herein.

FIG. 23 illustrates an LED device comprising a control circuit, with the device generally designated 170. Control circuit, generally designated 172, can also be configured to bypass and/or shift the output color or color temperature to provide a so-called dimming compensation utility similar to control circuit 150. LED device 170 can comprise one or more strings of serially connected LEDs 173, where each string is electrically connected in parallel between a first terminal 174 and a second terminal 176. In one aspect, first terminal comprises an anode and second terminal comprises a cathode. For illustration purposes two strings are shown, however, one string and/or more than two strings are contemplated herein. For illustration purposes, two serially connected strings of LEDs 173 are shown, however, device 170 could comprise a single string and/or more than two strings for more control of color point. Each serially connected string of LEDs 173 can have two or more LEDs 173 also connected within parallel within the primary string (FIG. 26D). In one aspect, two LEDs 173 can be electrically connected in parallel for each one LED 173 in a series. As illustrated, a first string of LEDs 178 can comprise BSY LEDs 173 and a second string of LEDs 180 can comprise principally red LEDs.

Control circuit 172 can comprise an alternative to a switch controlled circuit. For example and in one aspect, control circuit 172 can comprise a variable resistance bypass circuit electrically connected in series with first and second strings of LEDs 178 and 180, respectively. Control circuit 172 can comprise a first transistor Q1 (e.g., such as a bipolar junction transistor (BJT)) electrically connected in series with a first resistor R1 and controlled by controller 182 to increase and/or decrease resistance in response to receiving dimming control input from a sensor 184. The increase and/or decrease in resistance can increase and/or decrease brightness of respective first LED string 178. Control circuit 172 can also comprise a second transistor Q2 electrically connected in series with a second resistor R2. Second transistor Q2 can also be controlled by controller 182 for bypassing current about second string 180 via a decrease in resistance in response to control input from sensor 184. First and second transistors Q1 and Q2 can be electrically connected in parallel with and therefore electrically communicate with sensor 184 such that sensor 184 can detect changes in temperature, current, light, or other variable inputs.

In one aspect, sensor 184 can comprise a temperature sensing element such as a thermistor, however, any type of sensor can be used for providing control input to controller 178, such that controller can maintain color point control and/or shift color point of device 170 using such input. For example, controller 182 can be configured to control a resistance provided by first transistor Q1 and/or second transistor Q2 in response to input from sensor 184. Current provided to first string 178 is denoted $I_{BSY}$ and current provided to second string 180 is denoted $I_{RED}$. In response to a dimming control input and/or a temperature control input received at sensor 184, controller 182 can increase and/or decrease brightness of first string 178 and/or second string 180 by decreasing the resistance provided by first transistor Q1 and/or second transistor Q2 such that the amount of current $I_{BSY}$ or $I_{RED}$ becomes bypassed or diverted around the first and/or second string 178 and/or 180, respectively.

In further aspects, control circuit 172 can comprise a trimmable resistor network (e.g., first and second resistors R1 and R2). After initial testing of LED strings 178 and 180 to determine spectral output of the LEDs as a function of temperature, resistors R1 and R2 can be tuned, preferably by trimming (e.g., laser trimming) to tune control circuit 172 for desired response characteristics. Such testing and trimming can be repeated (i.e., to verify that control circuit 172 has been tuned properly) to achieve the desired response. In one aspect, first string 178 can comprise BSY LEDs and second string 180 can comprise principally red LEDs and a greater fraction of current can be supplied to the red LEDs as temperature rises to compensate for the loss in efficacy of phosphide-based LEDs at elevated temperatures. Controller 182 can comprise a programmable microcontroller with memory for controlling current ratios in response to temperature changes detected by sensor 184 as part of the control circuit 172.

Figure 24:
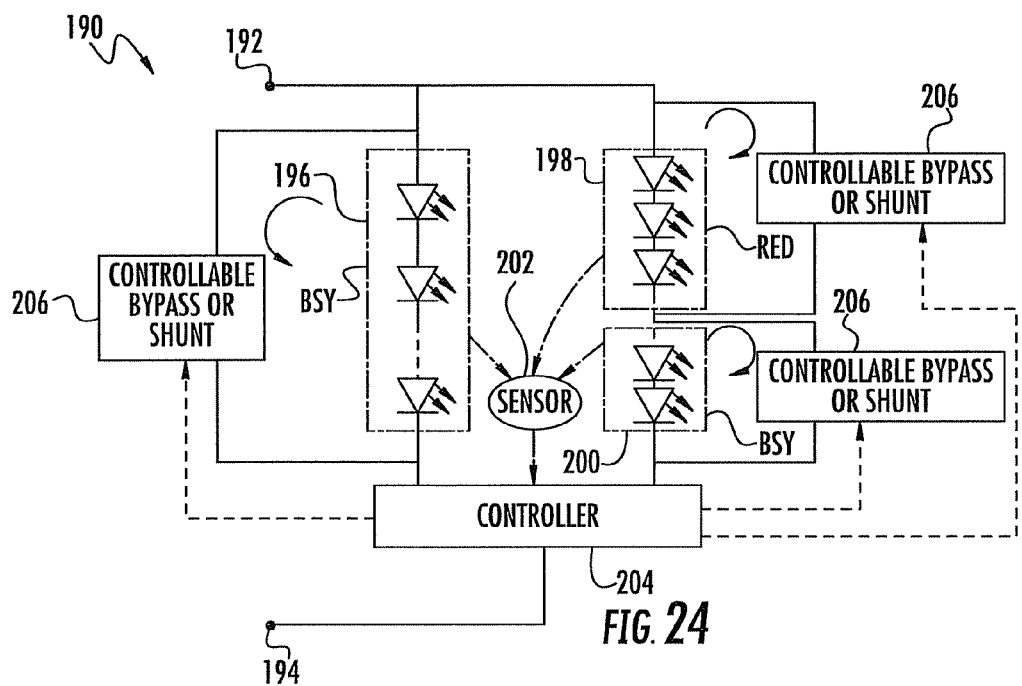

FIG. 24 is a circuit diagram for an LED device incorporated with a control circuit, generally designated 190 for responsively controlling supply of current to one or more sets of LEDs to maintain a substantially constant color point over a desirable range of operating temperatures or other control inputs (e.g., current, light, user input, etc.) sensed by a sensor. In one aspect, device and control circuit 190 can be integrally disposed on a same submount (e.g., FIG. 20) or control portions (e.g., controller, sensor, and controllable bypass or shunts) can be disposed on a separate substrate, for example, as part of a driving circuit (e.g., 130 FIG. 19). Device and control circuit 190 can be operatively arranged to receive current supplied between first and second terminals 192 and 194, respectively. In one aspect first terminal 192 can comprise an anode and second terminal 194 can comprise a cathode, for example, externally accessible attachment surfaces or contacts of LED devices described herein (e.g., previously described surfaces 18 and/or 112). LED device and control circuit 190 can be configured to control current supplied to one or more sets of LEDs, for example, a first set of LEDs 196, a second set of LEDs 198, and a third set of LEDs 200 in response to a control input.

For illustration purposes, three sets of LEDs are illustrated, however one or more sets are also contemplated herein. Each set of LEDs can comprise two or more LEDs electrically connected in series. First set of LEDs 196 can comprise serially connected LEDs of a first color, for example BSY LEDs. Second set of LEDs 198 can comprise serially connected LEDs of a second color (e.g., principally red LEDs) and third set of LEDs 200 can be serially connected to second set 198, and can comprise a different color than second set (e.g., BSY LEDs). That is, second and third sets of LEDs 198 and 200, respectively, can comprise LEDs of different colors that are electrically connected in series. First set of LEDs 196 can be electrically connected in parallel with second and third sets 198 and 200, respectively. Any combinations of series and/or parallel LED arrangements are contemplated herein.

As FIG. 24 illustrates, each set of LEDs can electrically communicate with a sensor 202. In one aspect, sensor 202 can comprise a thermistor configured to detect temperature changes in one or more LEDs and/or strings of LEDs and communicate such information to a controller 204. However, sensor 202 can be configured to detect and communicate any type of control input to controller 204, for example, changes in current, resistance, temperature, user adjustment, or light. Controller 204 can be configured to selectively adjust current to one or more LEDs and/or sets of LEDs via a controllable bypass or shunt circuit 206 for maintaining and/or shifting color point or color regime of the LED device 190. Controllable bypass or shunt circuits 206 can comprise a switched circuit (e.g., FIG. 22A), a variable resistance circuit (e.g., FIG. 23), or any type of circuit for controlling electrical current supplied to LEDs via control elements comprising switches, fuses, transistors, thermistors, tunable resistors and/or variable resistors. Any suitable circuit for bypassing, shunting, and/or diverting current around one or more LEDs is contemplated herein. In one aspect, controllable bypass or shunt 206 can bypass and/or divert about the one or more LEDs in the directions indicated by the clockwise and counterclockwise arrows. Controller 204 can receive output signals from sensor 202 and responsively control supply of current to LEDs via controllable bypass or shunt circuits 206. In one aspect, controllable bypass or shunt circuits 206 can be used to maintain a substantially constant color point over a range of operating temperatures, electrical currents, changes in light, and/or user adjustments as detected by sensor 202.

Figure 25:
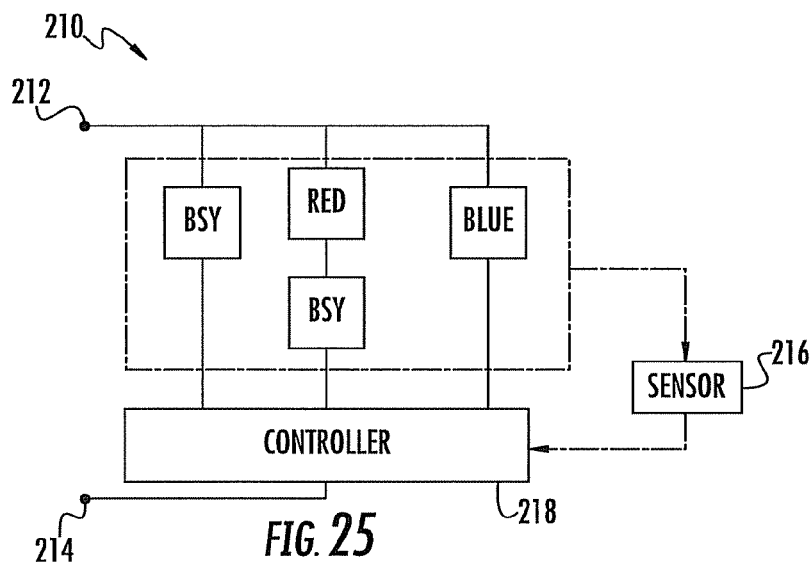

FIG. 25 is a schematic diagram of an LED device with control circuit, generally designated 210. LED device and control circuit 210 can be operatively arranged to receive current supplied between first and second electrical terminals 212 and 214, respectively. First terminal 212 can comprise an anode and second terminal 214 can comprise a cathode. FIG. 25 illustrates multiple strings of LEDs, for example, designated as BSY, RED, and BLUE LEDs electrically connected in series and/or parallel arrangements for providing various color points. FIGS. 26A to 26D illustrate various electrical interconnections for the BSY, RED, and/or BLUE strings of LEDs schematically illustrated in FIG. 25. Each string of LEDs can electrically communicate with a sensor 216 configured to detect one or more control inputs. Sensor 216 can detect changes in temperature, resistance, current, voltage, light, and/or user adjustments. Sensor 216 can be operatively coupled to controller 218 such that sensor 216 can communicate electrical signals to controller 218. Controller 218 can be configured to responsively control supply of current to the BSY, RED, and/or BLUE strings of LEDs via information received from sensor 216. In one aspect, controller 218 can be configured to bypass, divert, or shunt current about one or more strings of LEDs comprised of BSY, RED, or BLUE strings of LEDs.

In one aspect, controller 218 can be configured to vary the intensity of the BSY, RED, and/or BLUE LEDs to vary the relative intensities such that light produced by the lighting device has a CCT that substantially conforms to a Planckian locus of chromaticity. Such behavior can allow the lighting device to approximate, for example, the color temperature characteristics of an incandescent lamp. Controller 218 can be configured to control the BSY, RED, and/or BLUE strings of LEDs to maintain a relatively constant color temperature for a range of dimmer control inputs that correspond to a range of brightness levels, for example, brightness levels between approximately 20% and 100% of a maximum brightness level, and to approximate incandescent lamp behavior for a lower range of brightness levels. For example, in some aspects conformance to the Planckian locus within at least approximately a seven or ten step Macadam ellipse of the Planckian locus may be achieved by bypassing current about BSY, RED, and/or BLUE strings of LEDs to produce a change in color temperature with intensity that approximates incandescent lighting and/or natural light.

Figure 26A:
Figure 26B:
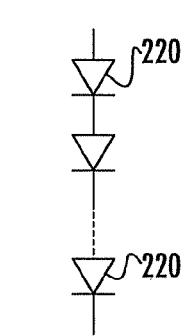
Figure 26C:
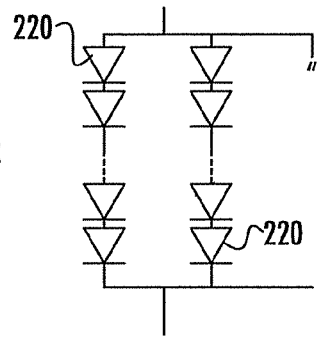
Figure 26D:
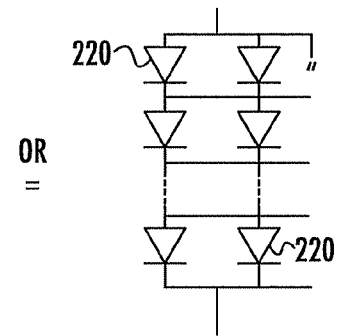

FIGS. 26A to 26D schematically illustrate various arrangements and/or combinations of electrical connectivity for LEDs within the BSY, RED, and BLUE LEDs illustrated in FIG. 25. For example, FIG. 26A illustrates LED strings schematically illustrated in FIG. 25. In one aspect, the BSY, RED, and/or BLUE strings of LEDs of FIG. 26A can comprise a single string of LEDs 220 electrically connected in series such as that illustrated by 26B. In other aspects, the LEDs of FIG. 26A can comprise multiple strings of serially connected LEDs 220 electrically connected in parallel as illustrated by FIG. 26C. In still further aspects, the LEDs of FIG. 26A can comprise a plurality of LEDs 220 electrically connected in a series and parallel array as illustrated by FIG. 26D. LEDs 220 used in devices disclosed herein can comprise any suitable connection of series and/or parallel arrangement. LEDs 220 used in devices disclosed herein can comprise LEDs 220 of the same and/or different colors electrically connected in combinations of series and/or parallel arrangements.

FIG. 27A illustrates a further aspect of LED devices disclosed herein. For example, FIG. 27A illustrates an emission area 16 of an LED device (e.g., any of the previously described devices). Emission area 16 comprises LEDs 25 optionally disposed below a filling material 40 (FIG. 18). For illustration purposes, FIG. 27A illustrates LEDs 25 not covered by filling material 40 (e.g., uncovered LEDs), however, filling material 40 such as an encapsulant comprising phosphor material disposed over the LEDs 25 is contemplated herein. FIG. 27A illustrates LEDs 25 disposed over more than one electrically separated conductive pad 30. That, LEDs 25 can be electrically separated, either individually or in groups as illustrated, via mounting on electrically separated conductive "islands" for limiting the potential difference through the LED substrate. This can increase the voltage potential across each LED thereby increasing the voltage of the respective LED device. In one aspect, submount 12 can comprise previously described core layer 38, dielectric layer 36, and conductive trace or pad layers 30. In one aspect, core layer 38 can comprise Al or Cu and conductive pad 30 can comprise a layer of Cu disposed over intervening dielectric layer 36. Solder mask 32 can be applied in gaps between one or more separated portions of conductive pad 30. In one aspect, conductive pad 30 forms a sidewall for solder mask 32 to flow between such that solder mask 32 directly adheres to dielectric layer 36. At least one LED 25 of one conductive pad 30 can be serially connected to at least one LED 25 of a second conductive pad 30 as illustrated.

Figure 27B:
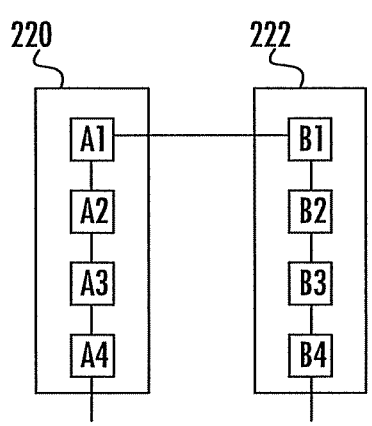
FIG. 27B is a schematic illustration of the electrical interconnection of LEDs in an LED device according to the disclosure herein.

The electrically conductive "islands" or more than one separated conductive pads 30 of FIG. 27A are schematically illustrated in FIG. 27B. FIG. 27B illustrates a first group of LEDs, where each LED is designated A1 to A4, disposed over a first conductive pad 220, and a second group of LEDs, where each LED is designated B1 to B4, disposed over a second conductive pad 222. LEDs of the first group can be electrically connected in series and/or parallel with LEDs of the second group. At least one LED, or a first LED A1 of the first group can be electrically connected to an LED of the second group, for example, a first LED B1 of second group. The voltage of the device incorporating electrically separated conductive pads can float somewhere between the voltage across each respective strings, thereby increasing uniformity within the LED device.

Figure 28:
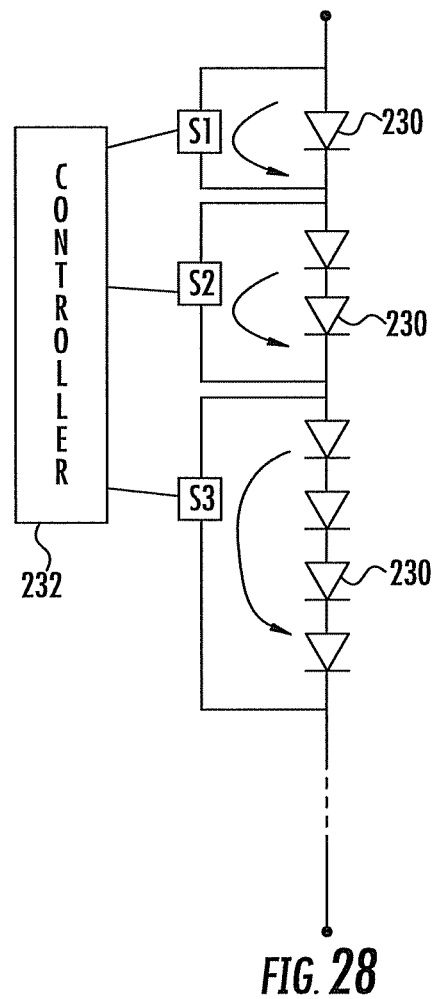
FIG. 28 is a schematic illustration of electrical interconnection of LEDs and a control circuit in an LED device according to the disclosure herein.

FIG. 28 schematically illustrates optimized shunting of one or more LEDs in devices disclosed herein. FIG. 28 illustrates one or more shunts, S1, S2, and S3 arranged in binary fashion such that any number of LED chips or LEDs can be shunted. A shunt can comprise any device for allowing electric current to be diverted or passed around a point (e.g., an LED) in a given circuit. In one aspect, shunts S1, S2, and S3 can be configured to bypass current about LEDs 230. Shunts S1, S2, and S3 can be selectively controlled via controller 232 to pass current about LEDs 230 in the directions indicated by the arrows via a shunt resistor, a switch, a transistor, a fuse, a thermistor, a tunable resistor, a variable resistor, and/or any other device capable of diverting current. In one aspect, a first shunt S1 can electrically shunt a single LED 230 as illustrated. In further embodiments, $2^n$ LEDs 230 can be shunted (e.g., where "n" equals a non-zero whole integer, such that $2^n$=2, 4, 8, 16, etc. LEDs) by second and/or third shunts S2 and S3. This can advantageously improve color tuning and/or color point control properties within the LED device. Shunts S1, S2, and/or S3 can be removed or deactivated as necessary. Controller 232 can adjust color temperature of the light produced by the lighting device by shifting toward the yellow/red portions of the visible spectrum producing a "warmer" light much like the behavior of an incandescent lamp as it is dimmed. In other aspects, controller 232 can maintain a desired color point at a given brightness level responsive to changes in previously described control inputs such as temperature.

Figure 29:
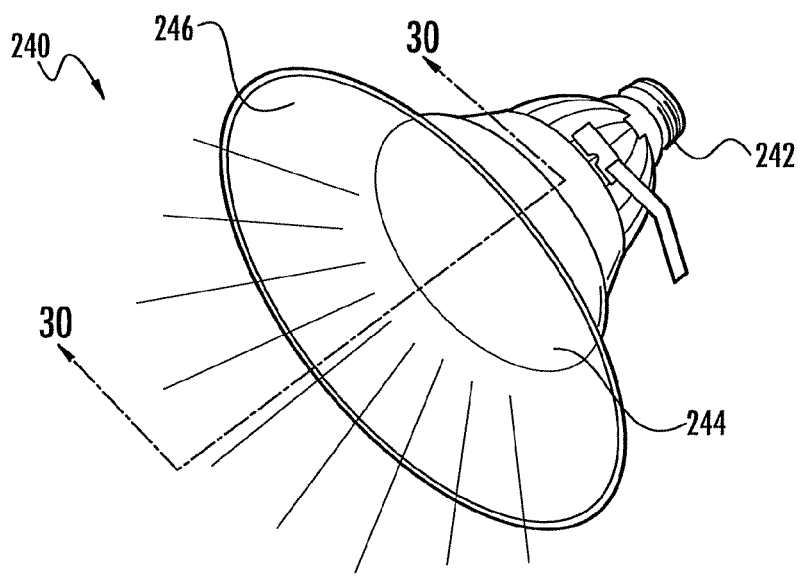
FIGS. 29 and 30 are perspective and cross-sectional views of a lighting fixture or component utilizing LED devices according to the disclosure herein.
Figure 30:
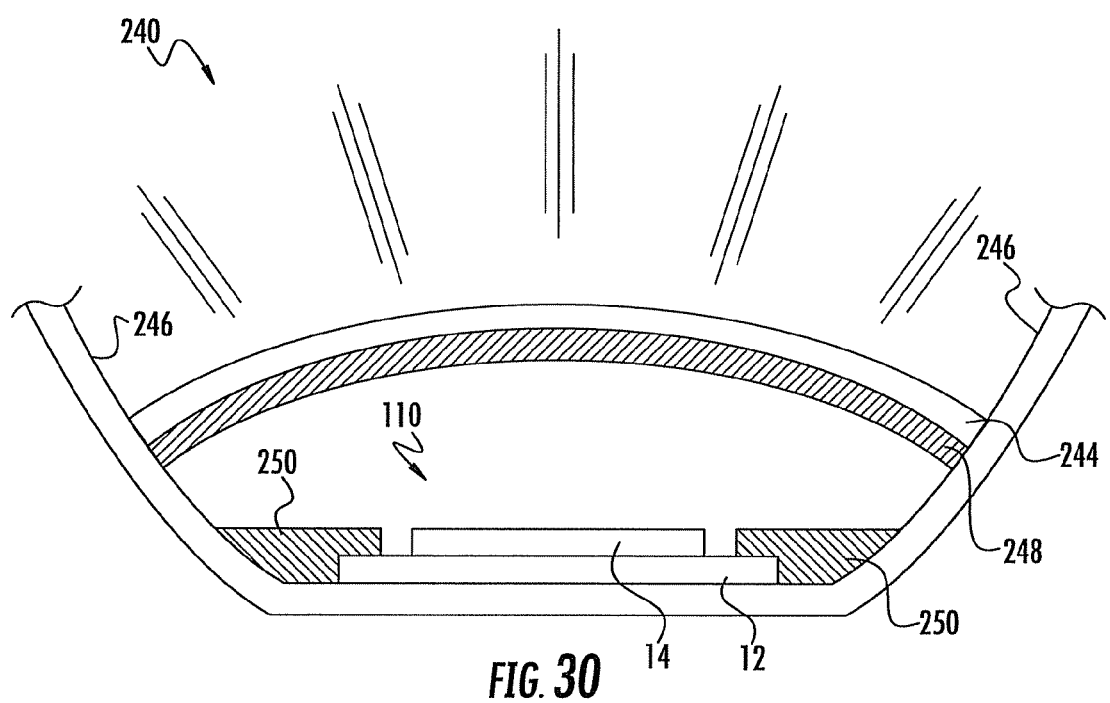

FIGS. 29 and 30 illustrate for example lighting fixtures incorporating the lighting devices and control circuits disclosed herein. FIG. 29 is a perspective view of a first lighting fixture, generally designated 240. FIG. 30 is a cross-sectional view of fixture 240 of FIG. 29 along the line 30-30. Lighting fixture 240 of FIGS. 29 and 30 can comprise a downlight and/or "can" type of lighting fixture for use in general lighting applications. Such lights are commonly used for illuminating an area or volume (e.g., a structure, swimming pool or spa, room warehouse, road, parking lot, stadium, interior home, and/or exterior home lighting) with what is perceived as white light. In one aspect, lighting fixture 240 can comprise a base 242 for attaching to a power source, an optical element or lens 244, and a reflective surface 246.

Referring to FIGS. 29 and 30, lighting fixture 240 can comprise an LED device, for example, any of the lighting devices previously described herein disposed below lens 244. In one aspect, lighting device 110 is shown, which comprises retention material 14 disposed about an emission area 16 (FIG. 16). Retention material 14 can be disposed over a submount 12. Submount 12 can attach within lighting fixture 240 via one or more attachment members (e.g., a screw or clip) disposed in openings or holes 20 (FIG. 16). LED device 110 can electrically communicate with and/or comprise any of the previously described control circuits, such as bypass or shunt circuits for controlling color point of light emitted from fixture 240. Control circuits can be integrally disposed within LED device 110 (e.g., FIGS. 20 to 25) or can comprise a separate substrate attached to LED device 110 (e.g., FIG. 19).

Lens 244 can be formed via molding, cutting, or dispensing, of lens material and/or or any other suitable technique. Lens 244 can be mounted at any distance away from LED device 110. Lens 244 can comprise any suitable shape for affecting light output, for example, hemispheric, ellipsoid bullet, flat, hex-shaped, and/or square. Lens 244 materials can comprise silicones, plastics, epoxies, glasses, and/or combinations thereof. Various lens sizes can be used. In one aspect, a diffuser 248 can be disposed adjacent lens 244 such that diffuser 248 is above and/or below lens 244. Diffuser 248 can be formed integral with lens 244 (e.g., particles disposed within lens 244) and/or as a thin film applied to lens 244. Diffuser 248 can comprise light scattering particles or structures configured to diffuse and/or scatter light. Such particles can comprise materials such as titanium dioxide, alumina, silicon carbide, gallium nitride, glass microsphere, metallic, glass or composite frits, and/or other particles or structures dispersed within lens 244. Alternatively, diffuser 248 can comprise a layer of polymer or composite material having a different index of refraction than lens 244 to promote diffusion of light. Scattering particles or structures can be dispersed homogeneously throughout lens 244 or provided in variable concentrations or amounts in different areas within or upon one or more surfaces of lens 244. In one embodiment, scattering particles can be provided in layers within lens 244 or different concentrations in relation to the location of LED device 110. Reflective surface 246 can be configured to reflect light and/or position light in a desired area or produce light having a desired shape.

Lighting fixture can further comprise an optics cover 250 for covering portions of lighting device 110 which may block or affect light. For example, optics cover 250 can be disposed over wires coupled to attachment surfaces 18 or 112 (FIG. 16) such that such surfaces will not block, absorb, and/or affect light output. Optics cover 250 can comprise a reflective surface that is preferably white for reflecting light.

Embodiments according to the present subject matter may provide one or more of various technical effects, including but not limited to, reduced variation in color or color temperature of a LED lighting device and/or fixture with respect to variation in operating temperature, current, light, or a user adjustment. The present subject matter may also provide for high voltage devices operable for example at voltages of greater than approximately 40 volts (V). Advantages associated with high voltage devices include more efficient devices, less costly devices, increased operability for a greater number of general lighting applications, as well as operability at lower forward currents which can contribute to improvements in current spreading. High voltage devices can reduce the cost of LED lighting fixtures by simplifying (e.g., reducing) driver components, increasing LED efficiency, and increasing uniformity within the device. Embodiments of the present disclosure shown in the drawings and described above are exemplary of numerous embodiments that can be made within the scope of the appended claims. It is contemplated that the configurations of LED devices and methods of making the same can comprise numerous configurations other than those specifically disclosed.

What is claimed is:

1. A light emitting device, comprising:
   a submount;
   a light emission area disposed over the submount;
   a retention material at least partially disposed within the light emission area such that the retention material physically separates a first section of the light emission area from a second section of the light emission area; and
   a driving circuit integrated with the submount, wherein the retention material is disposed over one or more driving elements of the driving circuit.

2. The device of claim 1, wherein the first section comprises one or more light emitting diodes (LEDs) of a first color and the second section comprises one or more LEDs of a second color.

3. The device of claim 2, wherein the first color is principally blue and the second color is principally red.

4. The device of claim 2, wherein the first section comprises a first filling material adapted to emit yellow light when activated by the principally blue LEDs, such that the first section comprises blue shifted yellow (BSY) LEDs.

5. The device of claim 2, wherein the one or more LEDs of the first section are covered by a first filling material and the one or more LEDs of the second section are uncovered.

6. The device of claim 1, wherein the first section and the second section each comprise one or more LEDs of the same color.

7. The device of claim 6, wherein the first section comprises a first filling material adapted to emit light of a first color and the second section comprises a second filling material adapted to emit light of a second color.

8. The device of claim 1, wherein the first section comprises a first string of light emitting diodes (LEDs) that the second section comprises a second string of LEDs.

9. The device of claim 8, wherein the first string is electrically connected in series with the second string.

10. The device of claim 8, wherein the first string is electrically connected in parallel with the second string.

11. The device of claim 1, wherein one of the first and second sections comprises different colored LEDs electrically connected in series.

12. The device of claim 11, further comprising a control circuit operable to maintain aggregate output emissions of the different colored LEDs at a substantially constant color or color temperature in response to various control inputs.

13. The device of claim 12, wherein the control inputs comprise a temperature control input, a current control input, a light control input, and/or a user control input.

14. The device of claim 13, wherein the control inputs are provided via a sensor.

15. The device of claim 12, where the control circuit comprises at least one control element comprising a switch, a transistor, a tunable resistor, a variable resistor, and/or a fuse for controlling aggregate output emissions.

16. The device of claim 11, further comprising a control circuit operable to shift the aggregate output emissions of the different colored LEDs within a color or color temperature regime in response to various control inputs.

17. The device of claim 16, wherein the control inputs comprise a temperature control input, a current control input, a light control input, and/or a user control input.

18. The device of claim 17, wherein the control inputs are provided via a sensor.

19. The device of claims 16, where the control circuit comprises at least one control element comprising a switch, a transistor, a tunable resistor, a variable resistor, and/or a fuse for controlling aggregate output emissions.

20. The device of claim 11, wherein each of the first and second sections comprise different colored LEDs electrically connected in series, and wherein LEDs of the first section are electrically connected in series with LEDs of the second section via electrical connectors that at least partially extend through the retention material.

21. The device of claim 1, wherein the light emitting device is operable between approximately 40 and 300 V.

22. The device of claim 21, wherein the light emitting device is operable at approximately 40 to 50 V, approximately 50 to 100 V, approximately 100 to 200 V, and/or approximately 200 to 300 V.

23. A lighting fixture incorporating the device of claim 1.

24. The device of claim 1, wherein the retention material is at least partially disposed within the light emission area such that the retention material physically separates more than two sections of the light emission area.

* * * * *